United States Patent
Tsubata

(10) Patent No.: US 8,421,942 B2
(45) Date of Patent: Apr. 16, 2013

(54) ACTIVE MATRIX SUBSTRATE, LIQUID CRYSTAL PANEL, LIQUID CRYSTAL DISPLAY DEVICE, LIQUID CRYSTAL DISPLAY UNIT, AND TELEVISION RECEIVER

(75) Inventor: Toshihide Tsubata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 379 days.

(21) Appl. No.: 12/933,775

(22) PCT Filed: Jan. 21, 2009

(86) PCT No.: PCT/JP2009/050881
§ 371 (c)(1),
(2), (4) Date: Sep. 21, 2010

(87) PCT Pub. No.: WO2009/130922
PCT Pub. Date: Oct. 29, 2009

(65) Prior Publication Data
US 2011/0019114 A1   Jan. 27, 2011

(30) Foreign Application Priority Data
Apr. 23, 2008  (JP) ................. 2008-113105

(51) Int. Cl.
*G02F 1/136* (2006.01)
(52) U.S. Cl.
USPC .............................. 349/43; 349/54
(58) Field of Classification Search ............ 349/43, 349/48
See application file for complete search history.

(56) References Cited

U.S. PATENT DOCUMENTS
2006/0023137 A1  2/2006 Kamada et al.
2006/0145981 A1  7/2006 Lee et al.
2006/0208984 A1  9/2006 Kim et al.

FOREIGN PATENT DOCUMENTS
| JP | 7-092489 | 4/1995 |
| JP | 2006-039290 | 2/2006 |
| JP | 2006-506683 | 2/2006 |
| JP | 2006-139288 | 6/2006 |

OTHER PUBLICATIONS

International Search Report for PCT/JP2009/050881, mailed Apr. 7, 2009.
Huang, Yi-Pai et al., "18.3: Additional Refresh Technology (ART) of Advanced-MVA(AMVA) Mode for High Quality LCDs", SID 07 Digest, (2007), pp. 1010-1013.

*Primary Examiner* — Phu Vu
(74) *Attorney, Agent, or Firm* — Nixon & Vanderhye, P.C.

(57) ABSTRACT

Provided are an active matrix substrate including plural pixel electrodes in a pixel region and a liquid crystal display device (pixel division mode) using the same. Proposed is a configuration of the liquid crystal display device of the capacitor-coupled pixel division mode which hardly causes reduction in display quality due to image-sticking of sub-pixels. The active matrix substrate includes: a data signal line (15x); scanning signal lines (16a and 16b); a transistor (12a) connected to the data signal line (15x) and scanning signal line (16a); a transistor (12b) connected to the data signal line (15x) and scanning signal line (16b); and pixel electrodes (17a and 17b) provided in a pixel region (101), the pixel electrode (17a) being connected to the data signal line (15x) via the transistor (12a), the pixel electrode (17b) being connected to the pixel electrode (17a) via a capacitor and the data signal line (15x) via the transistor (12b), and the transistors (12a and 12b) have identical W/L ratios of channels (each ratio of width W to length L of channel). The present invention can be configured with identical channel sizes without adjusting W/L ratios of channels of the transistors unlike a conventional configuration. Accordingly, deterioration of display quality due to variation in characteristics of transistors can be suppressed.

38 Claims, 47 Drawing Sheets

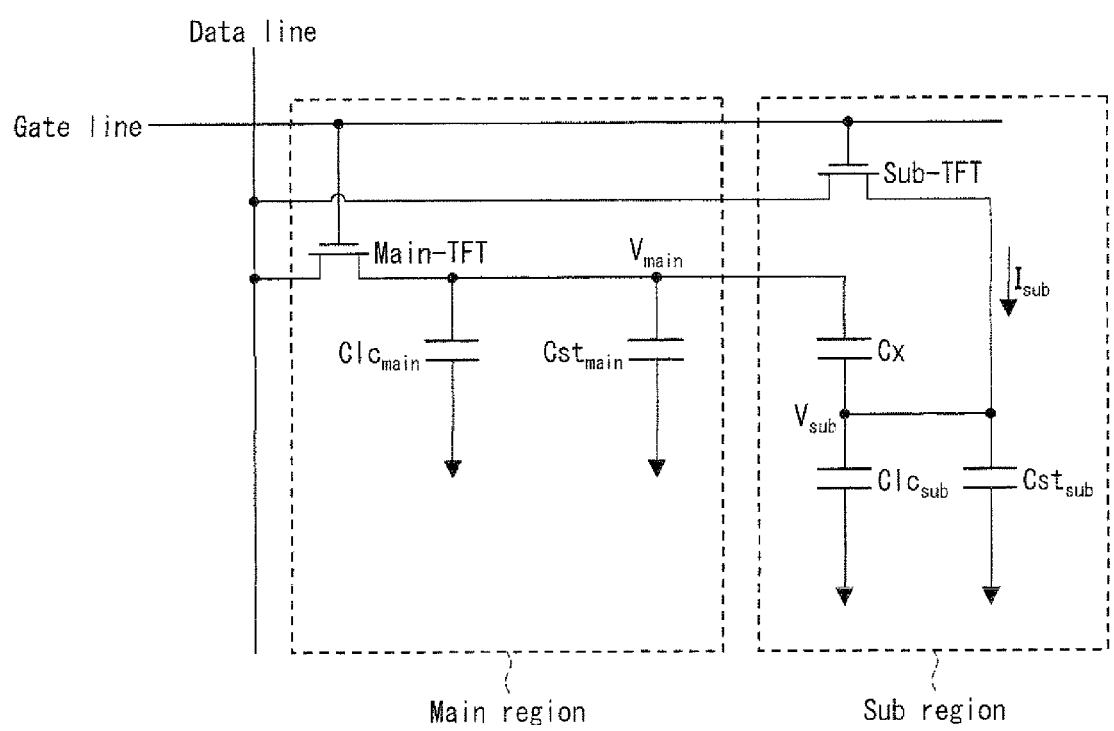
F I G. 4 6

ADMIN MATRIX SUBSTRATE, LIQUID
CRYSTAL PANEL, LIQUID CRYSTAL
DISPLAY DEVICE, LIQUID CRYSTAL
DISPLAY UNIT, AND TELEVISION
RECEIVER

This application is the U.S. national phase of International Application No. PCT/JP2009/050881 filed 21 Jan. 2009, which designated the U.S. and claims priority to JP Application No. 2008-113105 filed 23 Apr. 2008, the entire contents of each of which are hereby incorporated by reference.

TECHNICAL FIELD

The present invention relates to an active matrix substrate including a plurality of pixel electrodes in a pixel region, and a liquid crystal display device (pixel division mode) including the same.

BACKGROUND ART

As a measure for improving viewing angle dependence of gamma characteristics in liquid crystal display devices (for example, holding down excess brightness and the like in a screen), a liquid crystal display device has been proposed which controls a plurality of sub-pixels in one pixel to have different brightness, so as to display a halftone by area coverage modulation of these sub-pixels (pixel division mode; for example, see Patent Literature 1).

As shown in FIG. 44, an active matrix substrate disclosed in Patent Literature 1 has a pixel region provided between two adjacent gate bus lines 112; a pixel electrode 121a disposed in an upper end part (part adjacent to one of the two gate bus lines) of the pixel region; a pixel electrode 121b disposed midway of the pixel region; and a pixel electrode 121c disposed in a lower end part (part adjacent to the gate bus line adjacent to the one of the two adjacent gate bus lines) of the pixel region. The pixel electrode 121a and the pixel electrode 121c are connected to a wire 119 for drawing out a source, which wire 119 is drawn out from a source electrode 116s of a transistor 116. The wire 119 is connected to a control electrode 118, which overlaps the pixel electrode 112b via an insulating layer. The middle pixel electrode 121b is coupled, via capacitor, with the pixel electrodes 121a and 121c (capacitor-coupled type pixel division mode). In a liquid crystal display device including this active matrix substrate, sub-pixels corresponding to the pixel electrodes 121a and 121c serve as bright sub-pixels, and a sub-pixel corresponding to the pixel electrode 121b serves as a dark sub-pixel. Hence, a halftone is displayed by area coverage modulation of the bright sub-pixels (2 sub-pixels) and the dark sub-pixel (1 sub-pixel).

It is known that, in such a liquid crystal display device employing a capacitor-coupled type pixel division mode, image-sticking is caused to the sub-pixel including the pixel electrode 121b, due to effects of electric charge stored in the pixel electrode 121b which is coupled, via capacitor, with the pixel electrodes 121a and 121c.

Specifically, for a pixel electrode 61b, which is directly connected to a source line 55 via a transistor 56 as shown in FIG. 45, the following operation is carried out: In each frame, the transistor 56 is turned on, so that the pixel electrode 61b and the source line 55 are electrically connected to each other. Consequently, electric charge stored in the pixel electrode 61b while the transistor 56 is turning off is flown into the source line 55 while the transistor 56 is turning on. As a result, a direct-current voltage component hardly remains in the pixel electrode 61b, whereby image-sticking is rarely caused to the pixel electrode 61b. On the other hand, a pixel electrode 61a, which is coupled, via capacitor, with the pixel electrode 61b, keeps holding electric charge stored in the pixel electrode 61a even when the transistor 56 is turned on. Consequently, a direct-current voltage component remains in the pixel electrode 61a, whereby image-sticking is caused to the sub-pixel including the pixel electrode 61a.

As an example of a method for solving the problem of image-sticking, Patent Literature 1 discloses the active matrix substrate in which the pixel electrode 121b, which is coupled, via capacitor, with the pixel electrode 121a, is provided away from the gate bus line 112 (see FIG. 44). That is, the pixel electrode 121b is provided between the pixel electrode 121a and the pixel electrode 121c so that electric charge would not flow into the pixel electrode 121b due to a direct-current voltage component of a signal passing in the gate bus line 112. This makes it possible to prevent image-sticking.

However, according to the configuration, the pixel electrode 121b remains in a floating state, and accordingly it is not possible to completely prevent electrical charge from flowing into the pixel electrode 121b. Therefore, it is difficult to achieve a display with high quality.

Moreover, Non-patent Literature 1 discloses a configuration in which a pixel electrode in a floating state as above is directly connected to a source line via a transistor. FIG. 46 is an equivalent circuit diagram illustrating a part of a liquid crystal panel described in Non-patent Literature 1. According to the liquid crystal panel shown in FIG. 46, pixel regions (main region and sub region) are provided between two adjacent gate bus lines; a main pixel electrode corresponding to the main region is connected to a source line (data line) via a first transistor (main-TFT); and a sub-pixel electrode corresponding to the sub region is connected to the source line via a second transistor (sub-TFT). Further, the first and second transistors are connected to an identical gate bus line (gate line).

According to the configuration, when the first and second transistors are turned on, the source line and the sub-pixel electrode are electrically connected to each other, and accordingly electric charge stored in the sub-pixel electrode is discharged (refreshed). This makes it possible to prevent image-sticking of the sub-pixel including the pixel electrode in a floating state.

Patent Literature 1
Japanese Patent Application Publication, Tokukai, No. 2006-39290 (Publication Date: Feb. 9, 2006)
Non-Patent Literature 1
SID 07 DIGEST on page 1010 through 1013

SUMMARY OF INVENTION

However, according to the configuration of Non-patent Literature 1, the main pixel electrode and the sub-pixel electrode are connected to the identical gate bus line and the identical source line via the respective first and second transistors. Accordingly, the first and second transistors are being turned on during an identical period (gate-on period).

In the pixel division mode, in a case where the gate-on periods are equal to each other, an electric potential supplied to each of pixel electrodes is determined based on a ratio of transistor characteristics, that is, a W/L ratio of a channel of a transistor (a ratio of a channel width W to a channel length L). That is, according to the configuration, it is necessary to differentiate a W/L ratio of the first transistor connected to the main pixel electrode from that of the second transistor.

Therefore, in a case where such a liquid crystal panel is to be manufactured, it is necessary to design transistors having different channel sizes in advance. This may cause the design to be complicated. Moreover, after the liquid crystal panel is made, it is difficult to adjust, for example, time for writing into each pixel electrode, and whereby flexibility of usage of the product is deteriorated. Moreover, the W/L ratio of the channel of the transistor would be changed in accordance with shifts of line widths of the source line and the gate bus line. This may cause deterioration of display quality because the characteristics of the first and second transistors are different from each other in a display screen.

The present invention provides a liquid crystal display device of a capacitor-coupled pixel division mode, with which device deterioration of display quality would hardly occur due to image-sticking in a sub-pixel.

An active matrix substrate of the present invention includes: a data signal line; first and second scanning signal lines; a first transistor connected to the data signal line and the first scanning signal line; a second transistor connected to the data signal line and the second scanning signal line; and first and second pixel electrodes provided in a single pixel region, the first pixel electrode being connected to the data signal line via the first transistor, the second pixel electrode being connected to the first pixel electrode via a capacitor, and being connected to the data signal line via the second transistor, and the first transistor having a W/L ratio of a channel (a ratio of a channel width W to a channel length L) which W/L ratio is identical to that of the second transistor.

According to a liquid crystal display device including the present active matrix substrate, the pixel electrodes in a single pixel region are connected to a data signal line via respective transistors which are connected to respective different scanning signal lines. This makes it possible to supply signal electric potentials to respective pixel electrodes at different timings. Accordingly, for example, before a signal electric potential for regular writing is supplied to one of the pixel electrodes, a signal electric potential (e.g., Vcom) can be supplied to the other of the pixel electrodes which (i) is capacitor-connected to the one of the pixel electrodes and (ii) is electrically connected to the data signal line via a transistor.

With the configuration, before regular writing is carried out, a signal electric potential can be supplied via the data signal line, not via a capacitor, to a pixel electrode (capacitor-coupled electrode) which is coupled, via capacitor, with a pixel electrode connected to the signal line via a transistor. This makes it possible to discharge (refresh) electric charge stored in the capacitor-coupled electrode. Accordingly, image-sticking in a sub-pixel including the pixel electrode can be prevented. Moreover, according to the configuration, it is not necessary to adjust W/L ratios of respective channels of the transistors unlike a conventional configuration, and the active matrix substrate can be configured with channel sizes identical to each other. This makes it possible to suppress deterioration of display quality due to variation in characteristics of transistors.

The present active matrix substrate can further include a third pixel electrode provided in the pixel region, the third pixel electrode being electrically connected to the first pixel electrode.

The present active matrix substrate can further include a third pixel electrode provided in the pixel region, the third pixel electrode being connected to the first pixel electrode via a capacitor, and being electrically connected to the second pixel electrode.

The present active matrix substrate can include: a data signal line; first and second scanning signal lines; a first transistor connected to the data signal line and the first scanning signal line; a second transistor connected to the data signal line and the second scanning signal line; and first and second pixel electrodes provided in a single pixel region, the first pixel electrode being connected to the data signal line via the first transistor, the second pixel electrode being connected to the first pixel electrode via a capacitor, and being connected to the data signal line via the second transistor, and a storage capacitor being formed between the first pixel electrode and the second scanning signal line.

The present active matrix substrate can further include a third pixel electrode provided in the pixel region, the third pixel electrode being electrically connected to the first pixel electrode.

The present active matrix substrate can further include a third pixel electrode provided in the pixel region, and the third pixel electrode being connected to the first pixel electrode via a capacitor, and being electrically connected to the second pixel electrode.

According to the present active matrix substrate, it is possible that: the first scanning signal line traverses the pixel region so as to divide the pixel region into two areas; the first pixel electrode is provided in one of the two areas; and the second pixel electrode is provided in the other of the two areas.

According to the present active matrix substrate, it is possible that a storage capacitor is further formed between the second pixel electrode and the second scanning signal line.

The present active matrix substrate can further include a storage capacitor wire, a storage capacitor being formed by the storage capacitor wire and the first pixel electrode.

According to the present active matrix substrate, it is possible that a storage capacitor is further formed by the storage capacitor wire and the second pixel electrode.

The present active matrix substrate can further include a storage capacitor electrode provided in a single layer in which conductive electrodes of the respective first and second transistors are provided, the storage capacitor electrode being electrically connected to one of the first and second pixel electrodes, and the storage capacitor electrode and the storage capacitor wire overlapping each other via a gate insulating film.

The present active matrix substrate can further include a capacitor-coupling electrode provided in a single layer in which conductive electrodes of the respective first and second transistors are provided, the capacitor-coupling electrode (i) being electrically connected to one of the first and second pixel electrodes, (ii) the capacitor-coupling electrode and the other of the first and second pixel electrodes overlapping each other via an interlayer insulating film, and (iii) the capacitor-coupling electrode and the storage capacitor wire overlapping each other via a gate insulating film.

The present active matrix substrate can further include a storage capacitor wire, wherein: the storage capacitor wire traverses the pixel region so as to divide the pixel region into two areas; the first pixel electrode is provided in one of the two areas; the third pixel electrode is provided in the other of the two areas; and the second pixel electrode is provided between the first and the third pixel electrodes.

The present active matrix substrate can further include a storage capacitor wire, wherein: the storage capacitor wire traverses the pixel region so as to divide the pixel region into two areas; the second pixel electrode is provided in one of the two areas; the third pixel electrode is provided in the other of the two areas; and the first pixel electrode is provided between the second and the third pixel electrodes.

The present active matrix substrate can further include a capacitor-coupling electrode provided in a single layer in which conductive electrodes of the respective first and second transistors are provided, the capacitor-coupling electrode being electrically connected to one of the first and second pixel electrodes, and the capacitor-coupling electrode and the other of the first and second pixel electrodes overlapping each other via an interlayer insulating film.

The present active matrix substrate can further include a storage capacitor electrode provided in a single layer in which conductive electrodes of the respective first and second transistors are provided, the storage capacitor electrode being electrically connected to one of the first and second pixel electrodes, and the storage capacitor electrode and the second scanning signal line overlapping each other via a gate insulating film.

The present active matrix substrate can further include a capacitor-coupling electrode and a storage capacitor electrode provided in a single layer in which conductive electrodes of the respective first and second transistors are provided, the capacitor-coupling electrode being electrically connected to the first pixel electrode, and the capacitor-coupling electrode and the second pixel electrode overlapping each other via an interlayer insulating film, and the storage capacitor electrode being electrically connected to the first pixel electrode, and the storage capacitor electrode and the second scanning signal line overlapping each other via a gate insulating film.

The present active matrix substrate can further include a capacitor-coupling electrode and a storage capacitor electrode provided in a single layer in which conductive electrodes of the respective first and second transistors are provided, the capacitor-coupling electrode being electrically connected to the first pixel electrode, and the capacitor-coupling electrode and the second pixel electrode overlapping each other via an interlayer insulating film, and the storage capacitor electrode being electrically connected to the first pixel electrode, and the storage capacitor electrode and the second scanning signal line overlapping each other via a gate insulating film.

The present active matrix substrate can further include a capacitor-coupling electrode which is provided so that the capacitor-coupling electrode and the second pixel electrode overlap each other via an interlayer insulating film, the capacitor-coupling electrode and a first wire which is drawn out from one of conductive electrodes of the first transistor being connected to each other in a single layer, the first wire and the first pixel electrode being connected to each other via a contact hole, and the second pixel electrode and a second wire which is drawn out from one of conductive electrodes of the second transistor being connected to each other via a contact hole.

The present active matrix substrate can further include a capacitor-coupling electrode which is provided so that the capacitor-coupling electrode and the second pixel electrode overlap each other via an interlayer insulating film, the capacitor-coupling electrode and a first wire which is drawn out from one of conductive electrodes of the first transistor being connected to each other in a single layer, the first wire and the first pixel electrode being connected to each other via a contact hole, the second pixel electrode and a second wire which is drawn out from one of conductive electrodes of the second transistor being connected to each other via a contact hole, and the third pixel electrode and a capacitor-coupling electrode extension section connected with the capacitor-coupling electrode being connected to each other via a contact hole.

The present active matrix substrate can further include a capacitor-coupling electrode which is provided so that the capacitor-coupling electrode and the second pixel electrode overlap each other via an interlayer insulating film, the capacitor-coupling electrode and a first wire which is drawn out from one of conductive electrodes of the first transistor being connected to each other in a single layer, the first wire and the first pixel electrode being connected to each other via a contact hole, the second pixel electrode and a second wire which is drawn out from one of conductive electrodes of the second transistor being connected to each other via a contact hole, and the second wire and the third pixel electrode being connected to each other via a contact hole.

The present active matrix substrate can further include a capacitor-coupling electrode provided so that the capacitor-coupling electrode and the second pixel electrode overlap each other via an interlayer insulating film; and a storage capacitor electrode provided so that the storage capacitor electrode and the second scanning signal line overlap each other via a gate insulating film, the capacitor-coupling electrode and a first wire which is drawn out from one of conductive electrodes of the first transistor being connected to each other in a single layer, the first wire and the first pixel electrode being connected to each other via a contact hole, the second pixel electrode and a second wire which is drawn out from one of conductive electrodes of the second transistor being connected to each other via a contact hole, the third pixel electrode and a capacitor-coupling electrode extension section connected to the capacitor-coupling electrode being connected to each other via a contact hole, and the third pixel electrode and the storage capacitor electrode being connected to each other via a contact hole.

The present active matrix substrate can further include a capacitor-coupling electrode which is provided so that the capacitor-coupling electrode and the second pixel electrode overlap each other via an interlayer insulating film; and a storage capacitor electrode which is provided so that the storage capacitor electrode and the second scanning signal line overlap each other via a gate insulating film, the capacitor-coupling electrode and a first wire which is drawn out from one of conductive electrodes of the first transistor being connected to each other in a single layer, the first wire and the first pixel electrode being connected to each other via a contact hole, the second pixel electrode and a second wire which is drawn out from one of conductive electrodes of the second transistor being connected to each other via a contact hole, the second wire and the third pixel electrode being connected to each other via a contact hole, and the third pixel electrode and the storage capacitor electrode being connected to each other via a contact hole.

The present active matrix substrate can further include a capacitor-coupling electrode which is provided so that the capacitor-coupling electrode and the second pixel electrode overlap each other via an interlayer insulating film; and a storage capacitor electrode provided so that the storage capacitor electrode and the second scanning signal line overlap each other via a gate insulating film, the capacitor-coupling electrode and a first wire which is drawn out from one of conductive electrodes of the first transistor being connected to each other in a single layer, the first wire and the first pixel electrode being connected to each other via a contact hole, the second pixel electrode and a second wire which is drawn out from one of conductive electrodes of the second transistor being connected to each other via a contact hole, and the first pixel electrode and the storage capacitor electrode being connected to each other via a contact hole.

According to the present active matrix substrate, it is possible that the interlayer insulating film is made thin in at least part of a region of the interlayer insulating film in which region the interlayer insulating film and the capacitor-coupling electrode overlap each other.

According to the present active matrix substrate, it is possible that the gate insulating film is made thin in at least part of a region of the gate insulating film in which region the gate insulating film and the storage capacitor electrode overlap each other.

According to the present active matrix substrate, it is possible that the interlayer insulating film includes an inorganic insulating film and an organic insulating film; and the organic insulating film is removed in at least part of the region of the interlayer insulating film in which region the interlayer insulating film and the capacitor-coupling electrode overlap each other.

According to the present active matrix substrate, it is possible that the gate insulating film includes an inorganic insulating film and an organic insulating film; and the organic insulating film is removed in at least part of the region of the gate insulating film in which region the gate insulating film and the storage capacitor electrode overlap each other.

According to the present active matrix substrate, it is possible that the organic insulating film includes at least one of acrylic resin, epoxy resin, polyimide resin, polyurethane resin, novolac resin, and siloxane resin.

According to the present active matrix substrate, it is possible that the first through third pixel electrodes are provided so that: at least part of the first pixel electrode is close to the first scanning signal line, at least part of the third pixel electrode is close to the second scanning signal line, and one end of the second pixel electrode is close to the first scanning signal line, and the other end of the second pixel electrode is close to the second scanning signal line.

According to the present active matrix substrate, it is possible that the first through third pixel electrodes are provided so that: at least part of the second pixel electrode is close to the first scanning signal line, at least part of the third pixel electrode is close to the second scanning signal line, and one end of the first pixel electrode is close to the first scanning signal line, and the other end of the first pixel electrode is close to the second scanning signal line.

According to the present active matrix substrate, it is possible that, in a case where the active matrix substrate is used in a liquid crystal display device, a sub-pixel including the first pixel electrode serves as a bright sub-pixel, and a sub-pixel including the second pixel electrode serves as a dark sub-pixel.

According to the present active matrix substrate, it is possible that, in a case where the active matrix substrate is used in a liquid crystal display device, sub-pixels including the respective first and third pixel electrodes serve as respective bright sub-pixels, and a sub-pixel including the second pixel electrode serves as a dark sub-pixel.

According to the present active matrix substrate, it is possible that, in a case where the active matrix substrate is used in a liquid crystal display device, a sub-pixel including the first pixel electrode serves as a bright sub-pixel, and sub-pixels including the respective second and third pixel electrodes serve as respective dark sub-pixels.

The present active matrix substrate can include: a first data signal line; first through fourth scanning signal lines; a first transistor connected to the first data signal line and the first scanning signal line; a second transistor connected to the first data signal line and the second scanning signal line; a third transistor connected to the first data signal line and the third scanning signal line; a fourth transistor connected to the first data signal line and the fourth scanning signal line; first and second pixel electrodes being provided in a first pixel region; and third and fourth pixel electrodes being provided in a second pixel region which is adjacent to the first pixel region in a column direction in which the first data signal line extends, the first and second pixel electrodes being connected to each other via a capacitor, the third and fourth pixel electrodes being connected to each other via a capacitor, the first transistor being connected to the first pixel electrode, the second transistor being connected to the second pixel electrode, the third transistor being connected to the third pixel electrode, and the fourth transistor being connected to the fourth pixel electrode.

An active matrix substrate of the present invention is an active matrix substrate in which each pixel includes a first sub-pixel and a second sub-pixel, the second sub-pixel being controlled to have brightness of not more than that of the first sub-pixel, said liquid crystal display device, including: data signal lines; first and second scanning signal lines; a first transistor connected to a corresponding one of the data signal lines and the first scanning signal line; a second transistor connected to the corresponding one of the data signal lines and the second scanning signal line; a first pixel electrode provided in the first sub-pixel; and a second pixel electrode provided in the second sub-pixel, the first pixel electrode being connected to the corresponding one of the data signal lines via the first transistor, the second pixel electrode being connected to the first pixel electrode via a capacitor, and being connected to the corresponding one of the data signal lines via the second transistor, and the second scanning signal line being selected at least once during a display.

The present active matrix substrate can further include the active matrix substrate described above, the second scanning signal line being selected at least once during a display.

According to the configuration, the second pixel electrode which is coupled, via capacitor, with the first pixel electrode connected to the data signal line via the first transistor can be electrically connected to the data signal line via the second transistor at least once during a display. This makes it possible to discharge (refresh) electrical charge stored in the second pixel electrode. Accordingly, it is possible to prevent image-sticking in the sub-pixel including the second pixel electrode and to prevent deterioration in display quality.

According to the present active matrix substrate, it is possible that a common electrode electric potential is applied to the corresponding one of the data signal lines when the second transistor is turning off.

According to the present active matrix substrate, it is possible that the first transistor turns on when the second transistor is turning off, or the first transistor and the second transistor concurrently turn off.

According to the present active matrix substrate, it is possible that, when the second transistor is turned off, an electric potential of the first pixel electrode and the second pixel electrode is substantially serving as a common electrode electric potential.

According to the present active matrix substrate, it is possible that a first gate on-pulse signal to be supplied to the first scanning signal line and a second gate on-pulse signal to be supplied to the second scanning signal line become active in a single horizontal scanning period; and the second gate on-pulse signal has a pulse width narrower than that of the first gate on-pulse signal, and becomes non-active before the first gate on-pulse signal becomes non-active.

According to the present active matrix substrate, it is possible that (i) a first gate on-pulse signal to be supplied to the first scanning signal line and (ii) a second gate on-pulse signal to be supplied to the second scanning signal line become active in a horizontal scanning period that is one horizontal scanning period before a horizontal scanning period in which a signal electric potential of a data signal to be displayed is applied to the first pixel electrode; and the second gate on-pulse signal becomes non-active while the first gate on-pulse signal is being active.

According to the present active matrix substrate, it is possible that, in each frame, a common electrode electric potential is applied, at least twice, to all the pixel electrodes in each pixel region.

According to the present active matrix substrate, it is possible that, in each frame, a common electrode electric potential is applied, at least twice, to all the pixel electrodes in each pixel region, after two-thirds of a frame period has elapsed since a signal electric potential of a data signal to be displayed was applied to the first pixel electrode.

According to the present active matrix substrate, it is possible that polarities of signal electric potentials of respective data signals to be supplied to the respective data signal lines are reversed per horizontal scanning period; when the polarities of the signal electric potentials of the respective data signals are reversed, the data signals are not supplied to the respective data signal lines for a predetermined time period, and the data signal lines are short-circuited each other; and the first and second transistors are turning on during the predetermined time period.

The present active matrix substrate can further include a scanning signal line driving circuit for driving the scanning signal lines, a first gate on-pulse signal to be supplied to the first scanning signal line and a second gate on-pulse signal to be supplied to the second scanning signal line being generated in accordance with an output signal of a corresponding identical one of serially connected circuits constituting a shift register in the scanning signal line driving circuit.

According to the present active matrix substrate, it is possible that the scanning signal line driving circuit includes the shift register, a plurality of logical circuits arranged in a column direction, and an output circuit; and pulse widths of the respective first and second gate on-pulse signals, which are outputted from the output circuit, are determined in response to the output signal of the shift register and an output control signal for controlling an output of the scanning signal line driving circuit, the output signal of the shift register and the output control signal being supplied to a corresponding one of the plurality of logical circuits.

According to the present active matrix substrate, it is possible that polarities of signal electric potentials applied to the first pixel electrode are reversed per frame.

According to the present active matrix substrate, it is possible that polarities of signal electric potentials applied to the first data signal line are reversed per horizontal scanning period.

According to the present active matrix substrate, it is possible that, during an identical horizontal scanning period, signal electric potentials having respective reverse polarities are applied to the first data signal line and a data signal line adjacent to the first data signal line.

The present liquid crystal panel includes the above-described active matrix substrate. The present liquid crystal display unit includes the above-described liquid crystal panel and a driver. The present liquid crystal display device includes the above-described liquid crystal display unit and an illuminating source device. The present television receiver includes the above-described liquid crystal display device and a tuner section for receiving television broadcasting.

For a fuller understanding of the nature and advantages of the invention, reference should be made to the ensuing detailed description taken in conjunction with the accompanying drawings.

BRIEF DESCRIPTION OF DRAWINGS

FIG. 1 is a circuit diagram illustrating a configuration of a liquid crystal panel 5a.

FIG. 2 is a plan view illustrating a configuration (in a concrete example 1-1) of a liquid crystal panel 5a.

FIG. 3 is a plan view illustrating another configuration of a liquid crystal panel 5a.

FIG. 6 is a plan view illustrating another configuration (in a concrete example 1-2) of a liquid crystal panel 5a.

FIG. 10 is a plan view illustrating another configuration of a liquid crystal panel 5a.

FIG. 11 is a plan view illustrating another configuration (in a concrete example 1-3) of a liquid crystal panel 5a.

FIG. 46 is a circuit diagram illustrating a configuration of a conventional liquid crystal panel.

FIG. 47 is a plan view illustrating another configuration of the present liquid crystal panel 5a.

FIG. 48 is a plan view illustrating another configuration of the present liquid crystal panel 5a.

Figure 1:
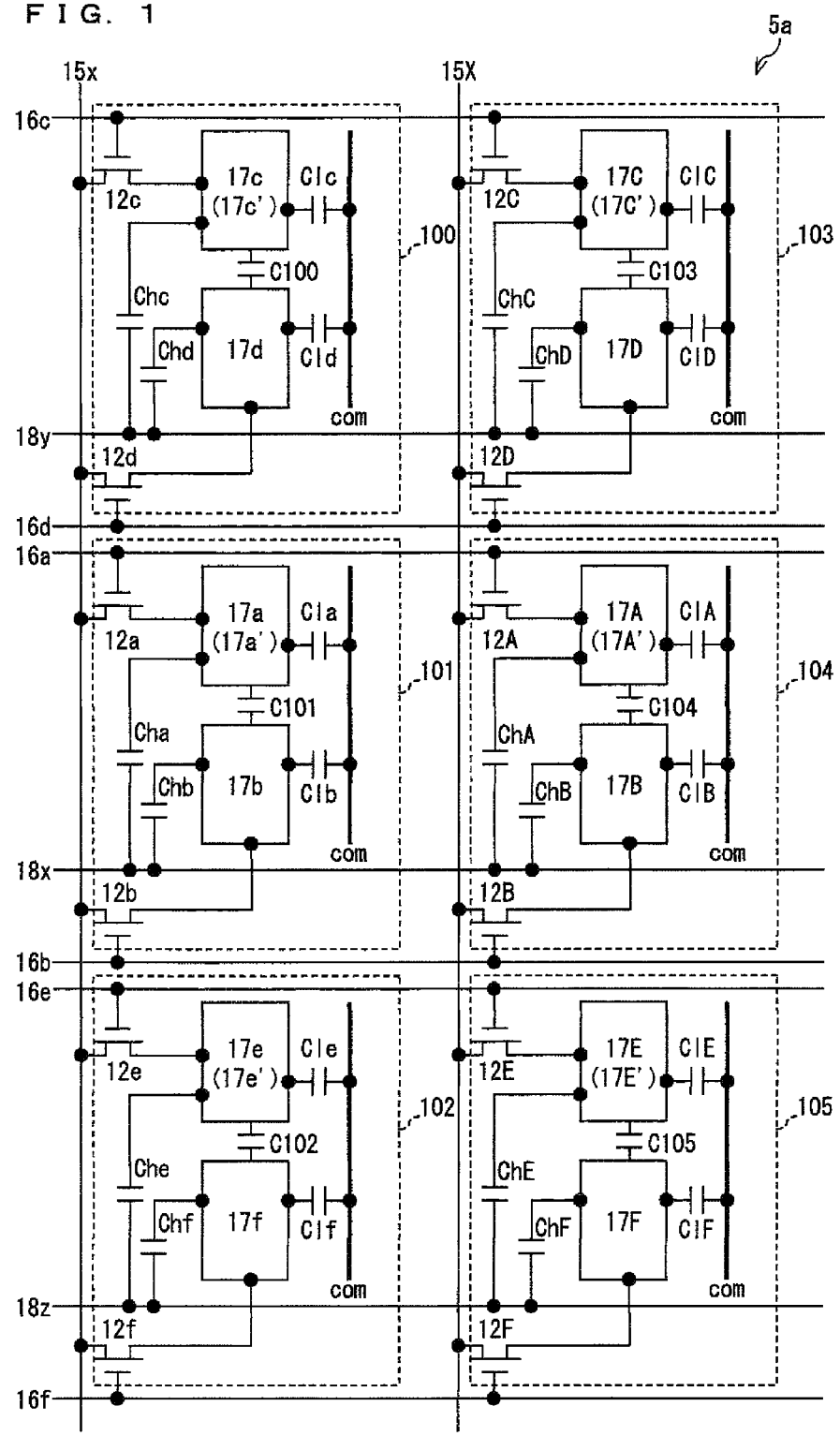

REFERENCE SIGNS LIST 5a, 5b: liquid crystal panel
11a, 11a', 11a", 11b, 11b': contact hole
12a through 12f, 12A through 12F: transistor
15x, 15X: data signal line
16a through 16f: scanning signal line
17a through 17f: pixel electrode
17A through 17F: pixel electrode
17a' through 17f': pixel electrode
17A' through 17F': pixel electrode
18x through 18z: storage capacitor wire
21: organic gate insulating film
22: inorganic gate insulating film
24: semiconductor layer
25: inorganic interlayer insulating film
26: organic interlayer insulating film
37a: capacitor-coupling electrode
67a, 67b: storage capacitor electrode
77a, 77a', 77b, 77b': contact electrode
84: liquid crystal display unit
100 through 105: pixel
601: television receiver
800: liquid crystal display device
C100 through C105: coupling capacitor

DESCRIPTION OF EMBODIMENTS

The following describes an example of an embodiment of the present invention, with reference to FIGS. 1 through 43. For convenience of explanation, a direction in which scanning signal lines extend is denoted as a row direction. Note, however, that the scanning signal lines can extend in a transverse direction or a longitudinal direction depending on how the present liquid crystal display device (or a liquid crystal panel or an active matrix substrate used therein) is used. Moreover, a channel type (n-type or p-type) of each transistor in the present embodiment is not limited to a particular one.

Configuration examples of a liquid crystal panel of the present invention can be roughly sorted into (1) a configuration where the liquid crystal panel includes storage capacitor wires and (2) a configuration where the liquid crystal panel includes no storage capacitor wire (i.e., Cs on-gate configuration). An example of the configuration (1) where the liquid crystal panel includes storage capacitor wires is described in an embodiment 1, and an example of the configuration (2) where the liquid crystal panel includes no storage capacitor wire (i.e., Cs on-gate configuration) is described in an embodiment 2. An embodiment 3 describes an example of a configuration in which a liquid crystal panel has both of the configurations (1) and (2), that is, the liquid crystal panel has a Cs on-gate configuration and storage capacitor wires. Note that, for convenience of explanation, members having the same functions in the embodiments are given the same reference numerals, and terms defined in Embodiment 1 are used in Embodiments 2 and 3 in accordance with their respective definitions, unless otherwise noted.

Embodiment 1

FIG. 1 is an equivalent circuit diagram illustrating part of a liquid crystal panel of the present embodiment 1. As shown in FIG. 1, a liquid crystal panel 5a includes: data signal lines (15x and 15X) that extend in a column direction (vertical direction in FIG. 1); scanning signal lines (16a through 16f) that extend in a row direction (horizontal direction in FIG. 1); pixels (100 through 105) that are provided in the row and column directions; storage capacitor wires (18x through 18z); and a common electrode (counter electrode) com. The pixels are configured in an identical manner. Note that a pixel array including the pixels 100 through 102 is adjacent to a pixel array including the pixels 103 through 105.

According to the liquid crystal panel 5a, one (1) data signal line and two scanning signal lines are provided for each of the pixels. Two pixel electrodes 17c and 17d are provided in the pixel 100, two pixel electrodes 17a and 17b are provided in the pixel 101, and two pixel electrodes 17e and 17f are provided in the pixel 102. The pixel electrodes 17c, 17d, 17a, 17b, 17e, and 17f are provided in the column direction. Two pixel electrodes 17C and 17D are provided in the pixel 103, two pixel electrodes 17A and 17B are provided in the pixel 104, and two pixel electrodes 17E and 17F are provided in the pixel 105. The pixel electrodes 17C, 17D, 17A, 17B, 17E, and 17F are provided in the column direction. In the row direction, the pixel electrodes 17c, 17d, 17a, 17b, 17e, and 17f are provided adjacent to the pixel electrodes 17C, 17D, 17A, 17B, 17E, and 17F, respectively.

The pixels are configured in the identical manner. Therefore, the following description mainly exemplifies and discusses the pixel 101.

According to the pixel 101, the pixel electrodes 17a and 17b (first and second pixel electrodes) are coupled with each other via a coupling capacitor C101. The pixel electrode 17a is connected to the data signal line 15x via a transistor 12a (a first transistor) that is connected to the scanning signal line 16a (a first scanning signal line). The pixel electrode 17b is connected to the data signal line 15x via a transistor 12b (a second transistor) that is connected to the scanning signal line 16b (a second scanning signal line). Storage capacitor Cha is formed between the pixel electrode 17a and the storage capacitor wire 18x, and storage capacitor Chb is formed between the pixel electrode 17b and the storage capacitor wire 18x. Liquid crystal capacitor Cla is formed between the pixel electrode 17a and the common electrode com, and liquid crystal capacitor Clb is formed between the pixel electrode 17b and the common electrode com. The transistors 12a and 12b are formed so that W/L ratios of their respective channels (each ratio of a channel width W to a channel length L; hereinafter, referred to as "W/L ratio") are almost identical to each other. That is, the transistors provided in the liquid crystal panel 5a have their sizes which are almost equal to each other, and therefore the transistors have their characteristics which are substantially identical to each other.

With the circuit configuration, the pixel electrode 17b is coupled, via capacitor, with the pixel electrode 17a into which a regular signal electric potential is to be written. This causes the pixel electrode 17b to have an electric potential of $Va \times (C\alpha/(C\alpha+Co))$ after the transistor 12a is turned off, in a case where it is assumed that Cla=Clb=Cl, Cha=Chb=Ch, Co=Cl+Ch, $C\alpha$ indicates a capacitance of C101, and Va is an electric potential which the pixel electrode 17a reaches after the transistor 12a is turned off. Accordingly, a sub-pixel including the pixel electrode 17a becomes a bright sub-pixel (hereinafter, referred to as "bright"), and a sub-pixel including the pixel electrode 17b becomes a dark sub-pixel (hereinafter, referred to as "dark"). This makes it possible to provide a pixel-division liquid crystal display device.

Moreover, according to the pixel-division liquid crystal display device including the liquid crystal panel 5a, the pixel electrodes 17a and 17b provided in a region of one (1) pixel 101 are connected to the data signal line 15x via the respective transistors 12a and 12b that are connected to respective different scanning signal lines 16a and 16b. This allows the pixel electrodes 17a and 17b to be directly applied with an identical signal electric potential or respective different signal electric potentials via the respective transistors 12a and 12b. Namely, it is possible to supply the signal electric potential from the data signal line 15x, not via a capacitor, to the pixel electrode 17b (hereinafter, also referred to as "capacitor-coupled electrode"), which is coupled, via capacitor, with the pixel electrode 17a that is connected to the data signal line 15x via the transistor 12a. Moreover, the transistors 12a and 12b that are connected to the pixel electrodes 17a and 17b are connected to the different scanning signal lines 16a and 16b, respectively. This makes it possible to arbitrarily determine a timing of supplying a signal electric potential to each of the pixel electrodes 17a and 17b.

With the circuit configuration of the present invention, the capacitor-coupled electrode (pixel electrode 17b) can be electrically connected to the data signal line (15x) by causing the transistor 12b to turn on. This makes it possible to supply a signal electric potential to the pixel electrode 17b from the data signal line 15x via the transistor 12b.

For example, in a case where a regular signal electric potential is written into the pixel electrode 17a, a signal electric potential (e.g., a Vcom signal) is applied to the pixel electrode 17b from the data signal line 15x via the transistor 12b before the writing of the regular signal electric potential into the pixel electrode 17a. The signal electric potential(s) (Vcom) can be applied by charge sharing method or can be applied to all the data signal lines by causing all the transistors to turn on. This causes the signal electric potential (Vcom) to be written into the capacitor-coupled pixel electrode 17b. As such, it is possible to cause electrical charge stored in the pixel electrode to be discharged (refreshed). This makes it possible to ultimately suppress occurrence of image-sticking of a sub-pixel including the pixel electrode.

According to the configuration, it is not necessary to adjust the W/L ratios of channels of the transistors unlike a conventional configuration but the active matrix substrate can be configured to have channels whose sizes are identical to each other. This makes it possible to suppress deterioration of display quality due to variation in characteristics of transistors.

The liquid crystal display device of the present invention mainly has the above configuration, and has inherent effects brought about by the configurations. The following describes (i) a concrete example of the liquid crystal panel 5a included in the liquid crystal display device of the present embodiment and (ii) a method for driving the liquid crystal panel 5a.

Concrete Example 1-1 of Liquid Crystal Panel

Figure 2:
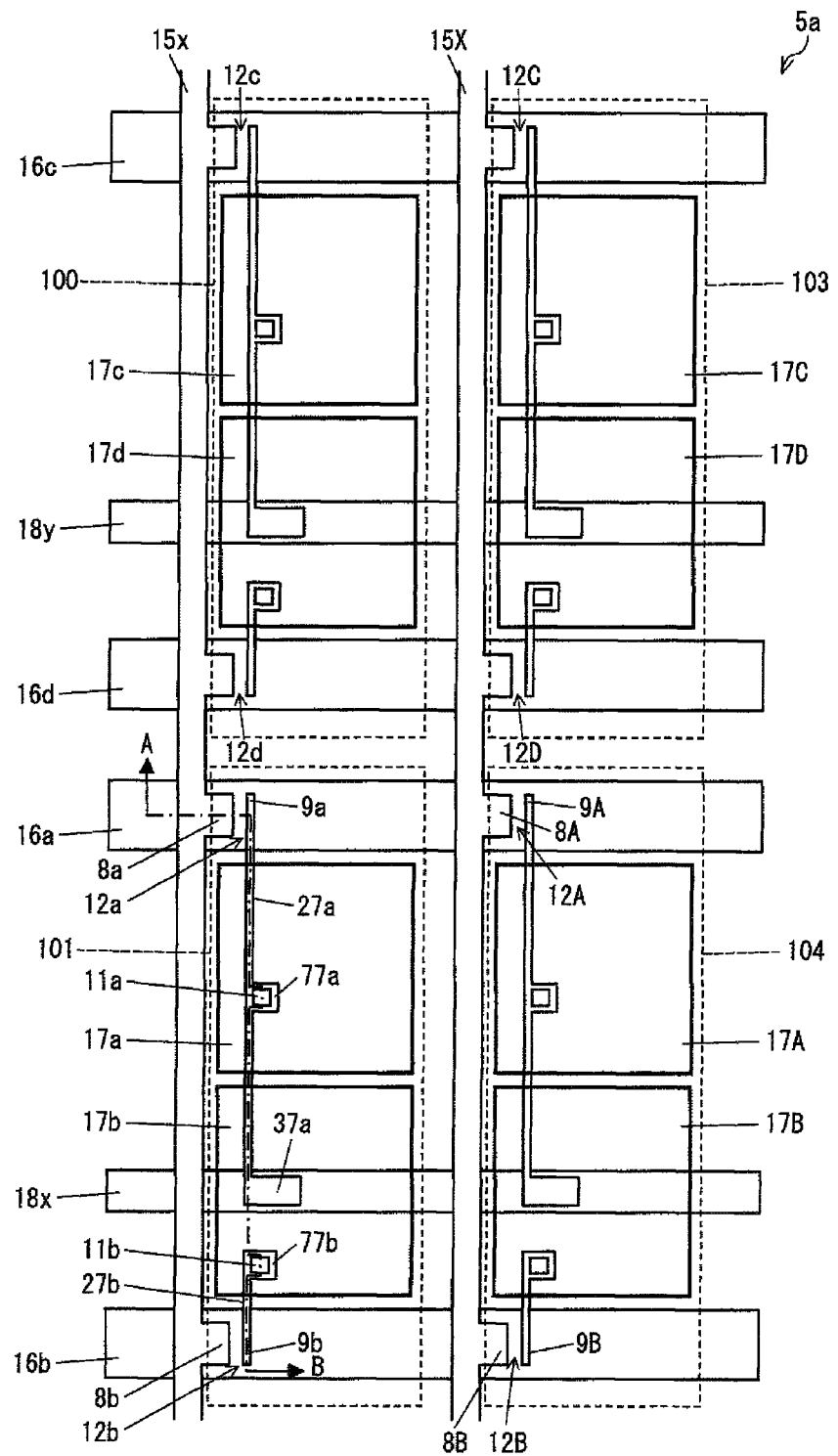

FIG. 2 illustrates a concrete example 1-1 of the liquid crystal panel 5a. According to the liquid crystal panel 5a shown in FIG. 2, a data signal line 15x is provided along a pixel 100 and a pixel 101; a data signal line 15X is provided along a pixel 103 and a pixel 104; a storage capacitor wire 18y is provided so as to traverse the pixels 100 and 103; and a storage capacitor wire 18x is provided so as to traverse the pixels 101 and 104.

In the liquid crystal panel 5a, a scanning signal line 16c is provided so that the scanning signal line 16c and one of two edge parts of the pixel 100 overlap each other, which two edge parts extend in the row direction; a scanning signal line 16d is provided so that the scanning signal line 16d and the other of the two edge parts overlap each other; and pixel electrodes 17c and 17d are juxtaposed in the column direction between the scanning signal lines 16c and 16d when they are viewed from above. The scanning signal line 16c is provided so that the scanning signal line 16c and one of two edge parts of the pixel 103 overlap each other, which signal line 16d is provided so that the scanning signal line 16d and the other of the two edge parts overlap each other; and pixel electrodes 17C and 17D are juxtaposed in the column direction between the scanning signal lines 16c and 16d when they are viewed from above.

Moreover, a scanning signal line 16a is provided so that the scanning signal line 16a and one of two edge parts of the pixel 101 overlap each other, which two edge parts extend in the row direction; a scanning signal line 16b is provided so that the scanning signal line 16b and the other of the two edge parts overlap each other; and pixel electrodes 17a and 17b are juxtaposed in the column direction between the scanning signal lines 16a and 16b when they are viewed from above. The scanning signal line 16a is provided so that the scanning signal line 16a and one of two edge parts of the pixel 104 overlap each other, which two edge parts extend in the row direction; the scanning signal line 16b is provided so that the scanning signal line 16b and the other of the two edge parts overlap each other; and pixel electrodes 17A and 178 are juxtaposed in the column direction between the scanning signal lines 16a and 16b when they are viewed from above.

In the pixel 101, the transistor 12a has a source electrode 8a and a drain electrode 9a which are provided above the scanning signal line 16a, and the transistor 12b has a source electrode 8b and a drain electrode 9b which are provided above the scanning signal line 16b. The source electrode 8a is connected to the data signal line 15x. The drain electrode 9a is connected to a wire 27a for drawing out a drain. The wire 27a is connected to a contact electrode 77a and a capacitor-coupling electrode 37a. The contact electrode 77a is connected to the pixel electrode 17a via a contact hole 11a. The capacitor-coupling electrode 37a and the pixel electrode 17b overlap each other via an interlayer insulating film. This causes the coupling capacitor C101 (see FIG. 1) to be formed between the pixel electrodes 17a and 17b.

Moreover, the source electrode 8b of the transistor 12b is connected to the data signal line 15x. The drain electrode 9b is connected to a wire 27b for drawing out a drain. The wire 27b is connected to a contact electrode 77b. The contact electrode 77b is connected to the pixel electrode 17b via a contact hole 11b. Further, the capacitor-coupling electrode 37a and the storage capacitor wire 18x overlap each other via a gate insulating film. This causes a storage capacitor Cha (see FIG. 1) to be formed, and a storage capacitor Chb (see FIG. 1) is formed between the pixel electrode 17b and the storage capacitor wire 18x. Note that a configuration (shapes and arrangements of respective members and their connecting relations) of each of the other pixels is identical to that of the pixel 101.

Figure 3:
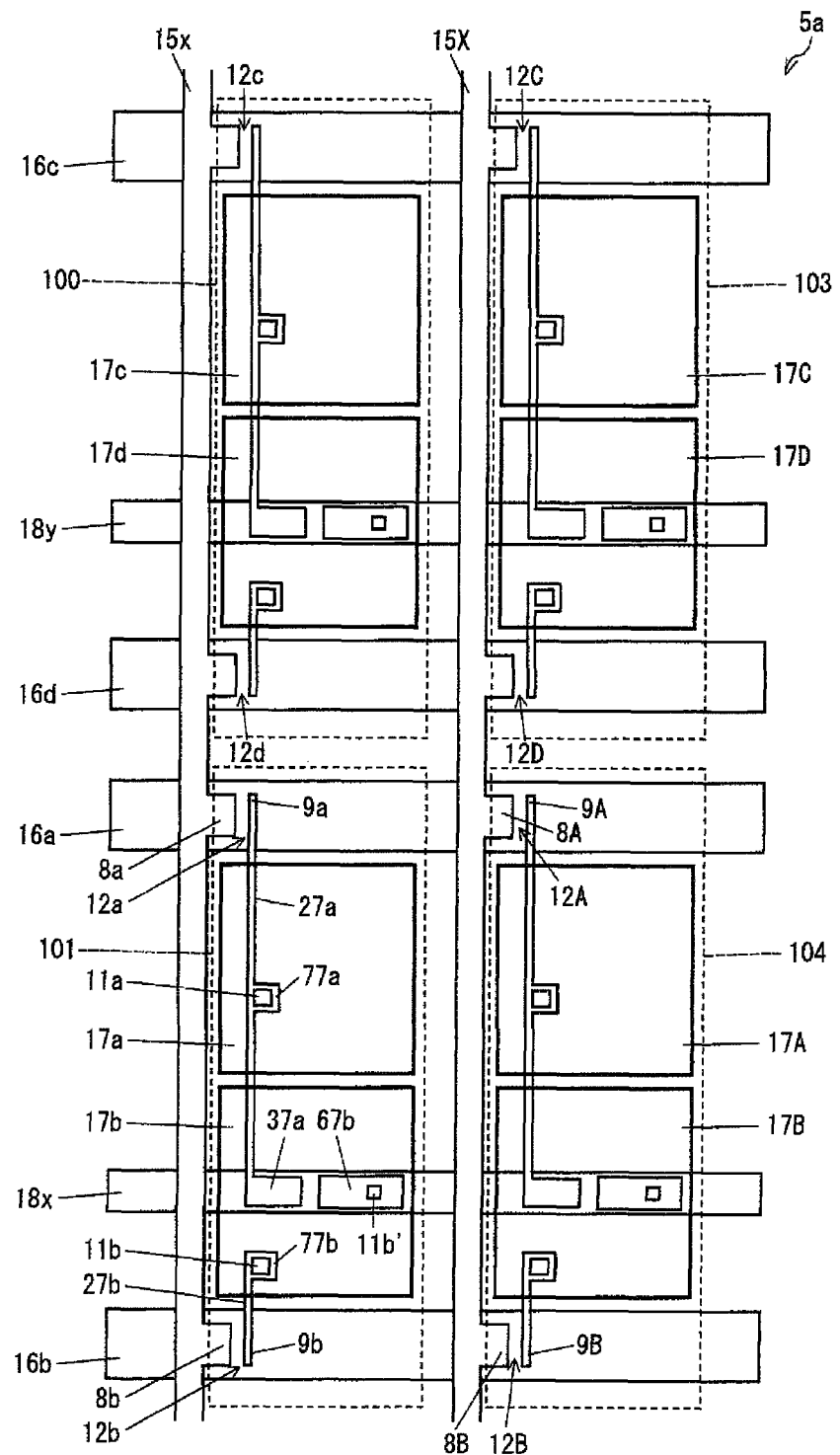

Note that the storage capacitor Chb can be configured as illustrated in FIG. 3. As is clear from FIG. 3, the storage capacitor Chb is formed so that (i) a storage capacitor electrode 67b which is provided in the same layer as the capacitor-coupling electrode 37a and the storage capacitor wire 18x overlap each other via the gate insulating film and (ii) the storage capacitor electrode 67b is connected to the pixel electrode 17b via a contact hole 11b'.

Figure 4:
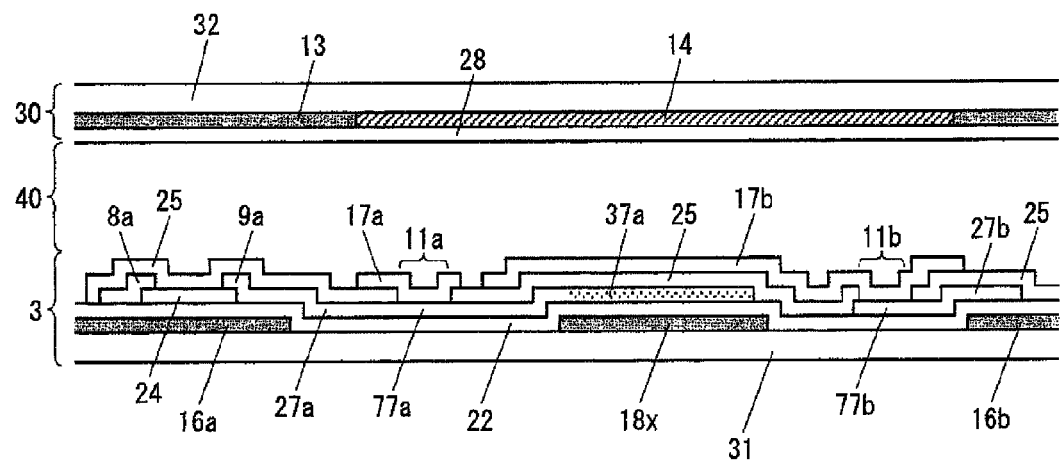
FIG. 4 is a cross-sectional view illustrating a concrete example of a cross-section taken on line A-B illustrated in FIG. 2.

FIG. 4 is a cross-sectional view taken on line A-B in FIG. 2. As shown in FIG. 4, the liquid crystal panel 5a includes an active matrix substrate 3, a color filter substrate 30 which faces the active matrix substrate 3, and a liquid crystal layer 40 sandwiched between the two substrates (3 and 30).

According to the active matrix substrate 3, the scanning signal lines 16a and 16b and the storage capacitor wire 18x are provided on a glass substrate 31. Further, an inorganic gate insulating film 22 is provided so as to cover these members. There are provided, on the inorganic gate insulating film 22, a semiconductor layer 24 (i-layer and n+ layer), the source electrode 8a that is in contact with the n+ layer, the drain electrode 9a, the wires 27a and 27b each for drawing out a drain, the contact electrodes 77a and 77b, and the capacitor-coupling electrode 37a. An inorganic interlayer insulating film 25 is further provided so as to cover these members. Note that, a part of the semiconductor layer 24 (typically, a channel section of a transistor) does not overlap the source electrode 8a and the drain electrode 9a, and the semiconductor layer 24 in the part has only the i-layer because the n+ layer in the part is eliminated by etching, etc. The pixel electrodes 17a and 17b are provided on the inorganic interlayer insulating film 25. An alignment film (not illustrated) is further provided so as to cover these members (pixel electrodes 17a and 17b). Note that the inorganic interlayer insulating film 25 is hollowed out in a region where the contact holes 11a and 11b are provided. This causes (i) the pixel electrode 17a and the contact electrode 77a to be connected to each other via the contact hole 11a and (ii) the pixel electrode 17b and the contact electrode 77b to be connected to each other via the contact hole 11b. Moreover, (i) the pixel electrode 17b and (ii) the capacitor-coupling electrode 37a that is connected to the wire 27a for drawing out a drain overlap each other, via the inorganic interlayer insulating film 25. This causes the coupling capacitor C101 (see FIG. 1) to be formed. Moreover, the capacitor-coupling electrode 37a and the storage capacitor wire 18x overlap each other via the inorganic gate insulating film 22. This causes the storage capacitor Cha (see FIG. 1) to be formed, and the storage capacitor Chb (see FIG. 1) is formed between the pixel electrode 17b and the storage capacitor wire 18x.

The color filter substrate 30 includes a black matrix 13 and a colored layer 14 provided on a glass substrate 32. A common electrode (com) 28 is provided on the black matrix 13 and colored layer 14. Further, an alignment film (not illustrated) is provided so as to cover the common electrode (com) 28.

The following describes one example of a method for producing the active matrix substrate 3 of the present invention.

First, a film having a thickness of 1000 Å to 3000 Å is formed, with the use of a method such as spattering, on a transparent insulating substrate (corresponding to the glass substrate 31 shown in FIG. 4) made of a material such as glass or plastic. The film is (i) a metal film made of a material such as titanium, chromium, aluminum, molybdenum, tantalum, tungsten, or copper, (ii) an alloy film of two or more of the materials in (i), or (iii) a stacked film of two or more of the films in (i) and (ii). Then, the film thus formed is patterned by photo-etching so as to have a required shape. This causes scanning signal lines (which serves as a gate electrode of a transistor), storage capacitor lines, and the like to be formed.

Then, (i) a silicon nitride film (SiNx) which serves as a gate insulating film, (ii) a high-resistance semiconductor layer made of a material such as amorphous silicon or polysilicon, and (iii) a low-resistance semiconductor layer made of a material such as n+ amorphous silicon are sequentially deposited with the use of a method such as a plasma CVD (chemical vapor deposition), and are then patterned by photo-etching. Note that the silicon nitride film which serves as a gate insulating film has a thickness of approximately 3000 Å to 5000 Å for example, the amorphous silicon film which serves as the high-resistance semiconductor layer has a thickness of approximately 1000 Å to 3000 Å for example, and the n+ amorphous silicon film which serves as the low-resistance semiconductor layer has a thickness of 400 Å to 700 Å for example.

Then, a film having a thickness of 1000 Å to 3000 Å is formed with the use of a method such as spattering. The film is (i) a metal film made of a material such as titanium, chromium, aluminum, molybdenum, tantalum, tungsten, or copper, (ii) an alloy film of two or more of the materials in (i), or (iii) a stacked film of two or more of the films in (i) and (ii). Then, the film thus formed is patterned by photo-etching, etc. so as to have a required shape. This causes data signal lines, source electrodes, drain electrodes, and the like to be formed.

Subsequently, while patterns of data signal lines, source electrodes, drain electrodes, and the like are being used as masks, a channel etching process is carried out, by use of dry etching, with respect to the high-resistance semiconductor layer (i-layer) such as an amorphous silicon film and the low-resistance semiconductor layer (n+ layer) such as an n+ amorphous silicon film. Through the processes, a thickness of the i-layer is optimized and transistors (channel regions) are formed. Note that the semiconductor layer which is not covered with the mask is eliminated by etching, and the i-layer which has a thickness sufficient to achieve performances of the transistors remains.

Then, an inorganic insulating film, which is made of a material such as silicon nitride or silicon oxide and which serves as an interlayer insulating film, is provided so as to cover the data signal lines, the source electrodes, the drain electrodes, and the like. According to the present embodiment, a silicon nitride film (passivation film) having a thickness of approximately 2000 Å to 5000 Å is formed with the use of a method such as plasma CVD.

Then, the interlayer insulating film is etched so that each hole is formed at a corresponding contact hole. According to the present embodiment, for example, a photosensitive resist is patterned with the use of a photolithographic method (exposure and development), and then the photosensitive resist thus patterned is etched.

Then, a transparent conducting layer, made of a material such as ITO (indium tin oxide), IZO, zinc oxide, or tin oxide, is deposited on the interlayer insulating film by a method such as spattering so that the transparent conducting layer has a thickness of approximately 1000 Å to 2000 Å. The conducting layer thus formed is patterned by a method such as the photo-etching so as to have a required shape. This causes first and second pixel electrodes to be formed in each pixel region.

Then, an alignment film is applied by a method such as an ink-jet method so as to cover each of the pixel electrodes.

The above-described method for producing the active matrix substrate can be applied to liquid crystal panels described below. For convenience of explanation, the method for producing the liquid crystal panels is not described below.

Figure 5:
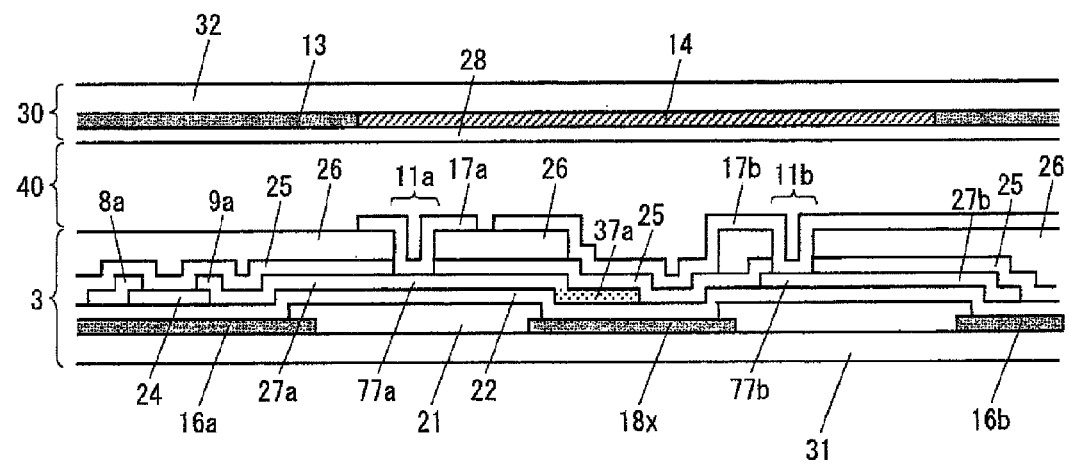
FIG. 5 is a cross-sectional view illustrating another concrete example of a cross-section taken on line A-B illustrated in FIG. 2.

The configuration of the A-B cross section shown in FIG. 4 can be configured as shown in FIG. 5. Specifically, a thick organic gate insulating film 21 and a thin inorganic gate insulating film 22 are provided on a glass substrate 31, and a thin inorganic interlayer insulating film 25 and a thick organic interlayer insulating film 26 are formed under the pixel electrode. This brings about effects of (i) reducing various parasitic capacitances and (ii) preventing short-circuiting of wires. In this case, as shown in FIG. 5, it is preferable that (i) a part of the organic gate insulating film 37a is hollowed out and (ii) a part of the organic interlayer insulating film 26 which part is above the capacitor-coupling electrode 37a is hollowed out. This allows an increase in capacitance of the coupling capacitor C101 and capacitances of the respective storage capacitors Cha and Chb.

The inorganic interlayer insulating film 25, the organic interlayer insulating film 26, and the contact holes 11a and 11b illustrated in FIG. 5 can be formed by a method described below. Specifically, after the transistors (TFTs) are formed, an inorganic interlayer insulating film 25 (passivation film) made of SiNx having a thickness of approximately 3000 Å is deposited by CVD with use of mixed gas of $SiH_4$ gas, $NH_3$ gas, and $N_2$ gas so that the inorganic interlayer insulating film 25 covers an entire substrate surface. Then, an organic interlayer insulating film 26, which is made of positive-type photosensitive acrylic resin and has a thickness of approximately 3 μm, is deposited by a method such as spin coating or die coating. Subsequently, a hollowed part in the organic interlayer insulating film 26 and various contact patterns are formed by use of photolithography. Furthermore, while the organic interlayer insulating film 26 that is patterned is being used as a mask, dry etching is carried out with respect to the inorganic interlayer insulating film 25 with the use of mixed gas of $CF_4$ gas and $O_2$ gas. Specifically, for example, the hollowed part in the organic interlayer insulating film is subjected to half exposure in the photolithography process so that the organic interlayer insulating film thinly remains when the development is finished. In contrast, sections where the contact holes are formed are subjected to full exposure in the photolithography process so that no organic interlayer insulating film remains when the development is finished. In a case where the dry etching is carried out with the use of the mixed gas of $CF_4$ gas and $O_2$ gas, (i) the remained film (organic interlayer insulating film) in the hollowed part of the organic interlayer insulating film is eliminated, and (ii) the inorganic interlayer insulating film disposed under the organic interlayer insulating film is eliminated in the contact holes. Note that an insulating film made of, for example, SOG (spin-on glass) can be used as the organic gate insulating film 21 and the organic interlayer insulating film 26. Moreover, the organic gate insulating film 21 and the organic interlayer insulating film 26 can contain at least one of acrylic resin, epoxy resin, polyimide resin, polyurethane resin, novolac resin, and siloxane resin.

Concrete Example 1-2 of Liquid Crystal Panel

Figure 6:
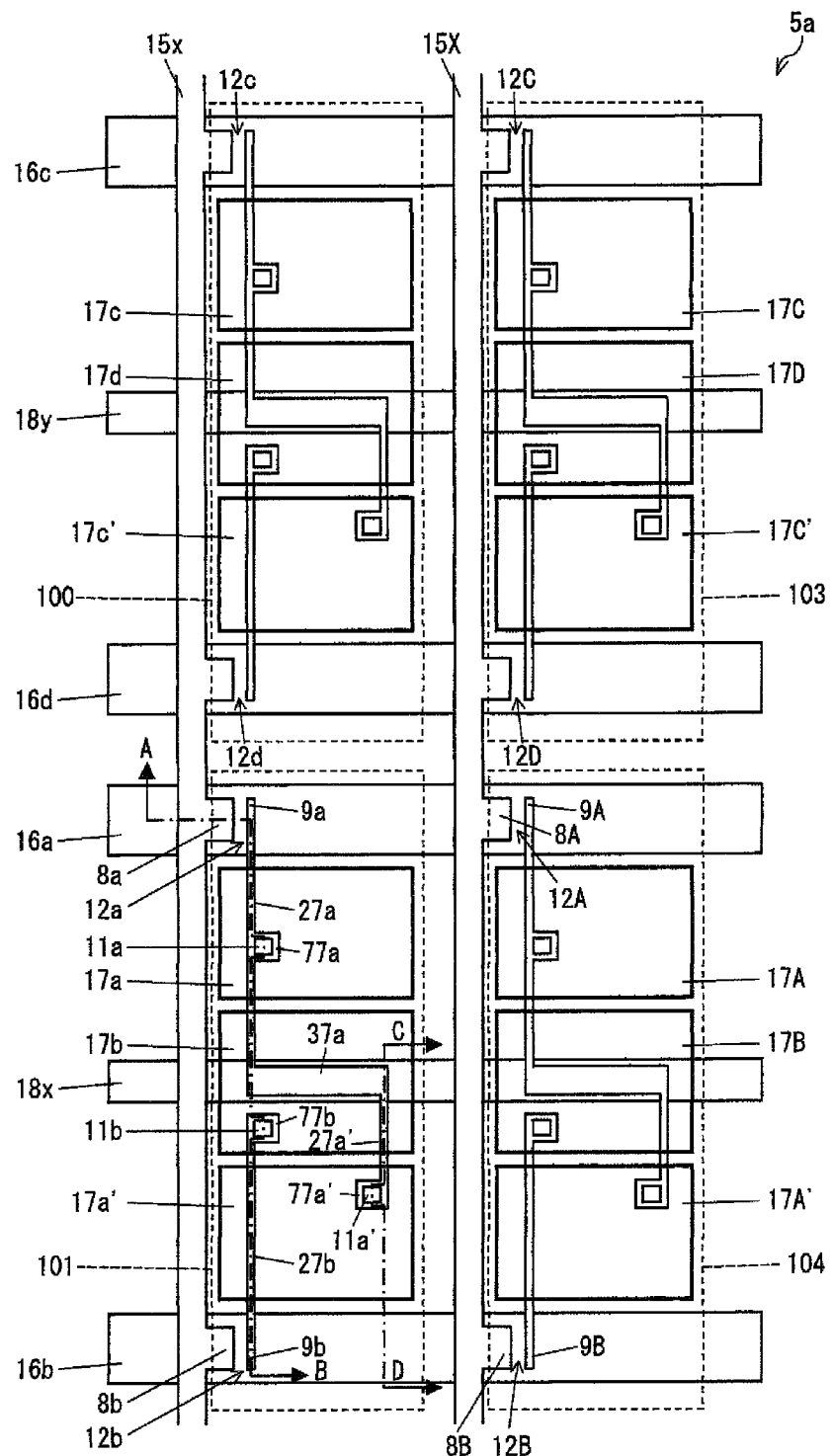

FIG. 6 illustrates a concrete example 1-2 of the liquid crystal panel 5a. According to the liquid crystal panel 5a shown in FIG. 6, three pixel electrodes are provided in each pixel region. Further, according to the liquid crystal panel 5a shown in FIG. 6, as with the liquid crystal panel shown in FIG. 2, a data signal line 15x is provided along a pixel 100 and a pixel 101; a data signal line 15X is provided along a pixel 103 and a pixel 104; a storage capacitor wire 18y is provided so as to traverse the pixels 100 and 103; and a storage capacitor wire 18x is provided so as to traverse the pixel 101 and 104.

In the liquid crystal panel 5a, a scanning signal line 16c is provided so that the scanning signal line 16c and one of two edge parts of the pixel 100 overlap each other, which two edge parts extend in the row direction; a scanning signal line 16d is provided so that the scanning signal line 16d and the other of the two edge parts overlap each other; and pixel electrodes 17c, 17d, and 17c' (FIG. 1 illustrates a state where the pixel electrodes 17c and 17c' are electrically connected to each other) are juxtaposed in the column direction between the scanning signal lines 16c and 16d when they are viewed from above. The scanning signal line 16c is provided so that the scanning signal line 16c and one of two edge parts of the pixel 103 overlap each other, which two edge parts extend in the row direction; the scanning signal line 16d is provided so that the scanning signal line 16d and the other of the two edge parts overlap each other; and pixel electrodes 17C, 17D, and 17C' are juxtaposed in the column direction between the scanning signal lines 16c and 16d when they are viewed from above.

Moreover, a scanning signal line 16a is provided so that the scanning signal line 16a and one of two edge parts of the pixel 101 overlap each other, which two edge parts extend in the row direction; a scanning signal line 16b is provided so that the scanning signal line 16b and the other of the two edge parts overlap each other; and pixel electrodes 17a, 17b, and 17a' are juxtaposed in the column direction between the scanning signal lines 16a and 16b when they are viewed from above. The scanning signal line 16a is provided so that the scanning signal line 16a and one of two edge parts of the pixel 104 overlap each other, which two edge parts extend in the row direction; the scanning signal line 16b is provided so that the scanning signal line 16b and the other of the two edge parts overlap each other; and pixel electrodes 17A, 17B, and 17A' are juxtaposed in the column direction between the scanning signal lines 16a and 16b when they are viewed from above.

In the pixel 101, the transistor 12a has a source electrode 8a and a drain electrode 9a which are provided above the scanning signal line 16a, and the transistor 12b has a source electrode 8b and a drain electrode 9b which are provided above the scanning signal line 16b. The source electrode 8a is connected to the data signal line 15x. The drain electrode 9a is connected to a wire 27a for drawing out a drain. The wire 27a is connected to a contact electrode 77a and a capacitor-coupling electrode 37a. The contact electrode 77a is connected to the pixel electrode 17a via a contact hole 11a. The capacitor-coupling electrode 37a and the pixel electrode 17b overlap each other via an interlayer insulating film. With the configuration, the coupling capacitor C101 (see FIG. 1) is formed between the pixel electrodes 17a and 17b.

The source electrode 8b of the transistor 12b is connected to the data signal line 15x. The drain electrode 9b is connected to a wire 27b for drawing out a drain. The wire 27b is connected to a contact electrode 77b. The contact electrode 77b is connected to the pixel electrode 17b via a contact hole 11b.

Further, the capacitor-coupling electrode 37a and the storage capacitor wire 18x overlap each other via a gate insulating film. This causes a storage capacitor Cha (see FIG. 1) to be formed, and a storage capacitor Chb (see FIG. 1) is formed between the pixel electrode 17b and the storage capacitor wire 18x. Further, the capacitor-coupling electrode 37a is connected to a capacitor-coupling electrode extension section 27a' which is connected to a contact electrode 77a'. The contact electrode 77a' is connected to a pixel electrode 17a' (third pixel electrode) via a contact hole 11a'. Note that a configuration (shapes and arrangements of respective members and their connecting relations) of each of the other pixels is identical to that of the pixel 101.

According to the configuration, sub-pixels including the respective pixel electrodes 17a and 17a' become "bright", and a sub-pixel including the pixel electrode 17b becomes "dark".

Figure 7:
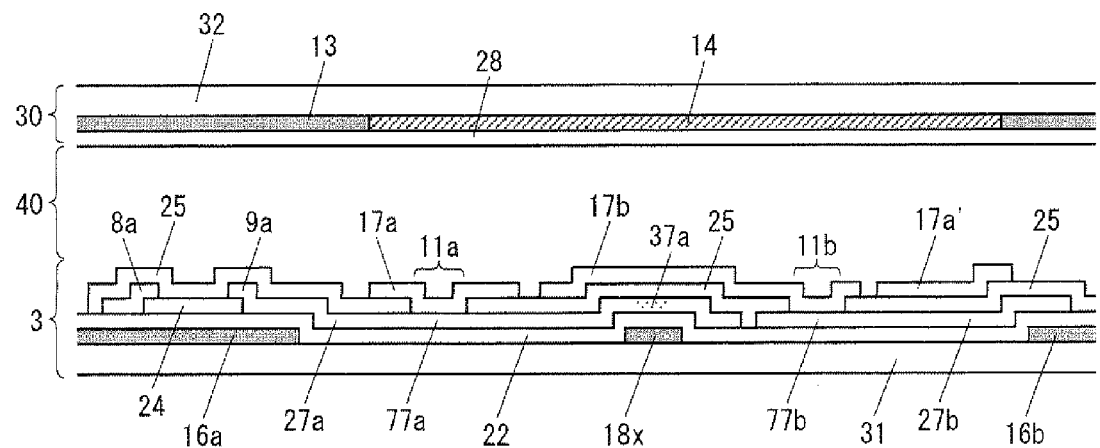
FIG. 7 is a cross-sectional view illustrating a concrete example of a cross-section taken on line A-B illustrated in FIG. 6.
Figure 8:
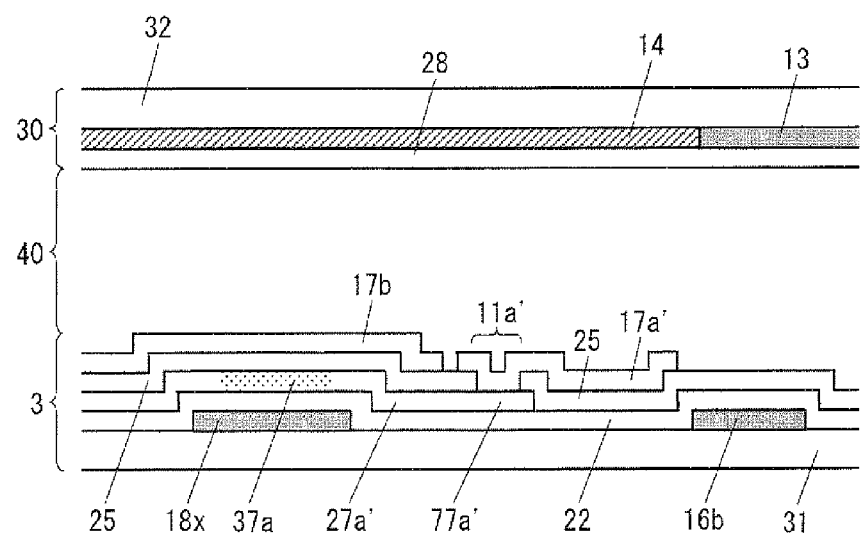
FIG. 8 is a cross-sectional view illustrating a concrete example of a cross-section taken on line C-D illustrated in FIG. 6.

FIG. 7 is a cross-sectional view taken on line A-B in FIG. 6. FIG. 8 is a cross-sectional view taken on line C-D in FIG. 6. As shown in FIGS. 7 and 8, the liquid crystal panel 5a includes an active matrix substrate 3, a color filter substrate 30 which faces the active matrix substrate 3, and a liquid crystal layer 40 sandwiched between the two substrates (3 and 30).

As shown in FIG. 7, according to the active matrix substrate 3, the scanning signal lines 16a and 16b and the storage capacitor wire 18x are provided on a glass substrate 31. Further, an inorganic gate insulating film 22 is provided so as to cover these members. There are provided, on the inorganic gate insulating film 22, a semiconductor layer 24 (i-layer and n+ layer), the source electrode 8a that is in contact with the n+ layer, the drain electrode 9a, the wires 27a and 27b each for drawing out a drain, the contact electrodes 77a and 77b, and the capacitor-coupling electrode 37a. An inorganic interlayer insulating film 25 is further provided so as to cover these members. Note that a part of the semiconductor layer 24 (typically, a channel section of a transistor) does not overlap the source electrode 8a and the drain electrode 9a, and the semiconductor layer 24 in the part has only the i-layer because the n+ layer in the part is eliminated by etching, etc. The pixel electrodes 17a, 17b, and 17a' are provided on the inorganic interlayer insulating film 25. An alignment film (not illustrated) is further provided so as to cover these members (pixel electrodes 17a, 17b, and 17a'). Note that the inorganic interlayer insulating film 25 is hollowed out in a region where the contact holes 11a and 11b are provided. This causes (i) the pixel electrode 17a and the contact electrode 77a to be connected to each other via the contact hole 11a and (ii) the pixel electrode 17b and the contact electrode 77b to be connected to each other via the contact hole 11b. Moreover, (i) the pixel electrode 17b and (ii) the capacitor-coupling electrode 37a that is connected to the wire 27a for drawing out a drain overlap each other, via the inorganic interlayer insulating film 25. This causes the coupling capacitor C101 (see FIG. 1) to be formed. Moreover, the capacitor-coupling electrode 37a and the storage capacitor wire 18x overlap each other via the inorganic gate insulating film 22. This causes the storage capacitor Cha (see FIG. 1) to be formed, and the storage capacitor Chb (see FIG. 1) is formed between the pixel electrode 17b and the storage capacitor wire 18x.

The color filter substrate 30 includes a black matrix 13 and a colored layer 14 provided on a glass substrate 32. A common electrode (com) 28 is provided on the black matrix 13 and colored layer 14. Further, an alignment film (not illustrated) is provided so as to cover the common electrode (com) 28.

As shown in FIG. 8, the capacitor-coupling electrode extension section 27a' drawn out from the capacitor-coupling electrode 37a is connected to the contact electrode 77a'. The contact electrode 77a' is connected to the pixel electrode 17a' via the contact hole 11a'.

Figure 9:
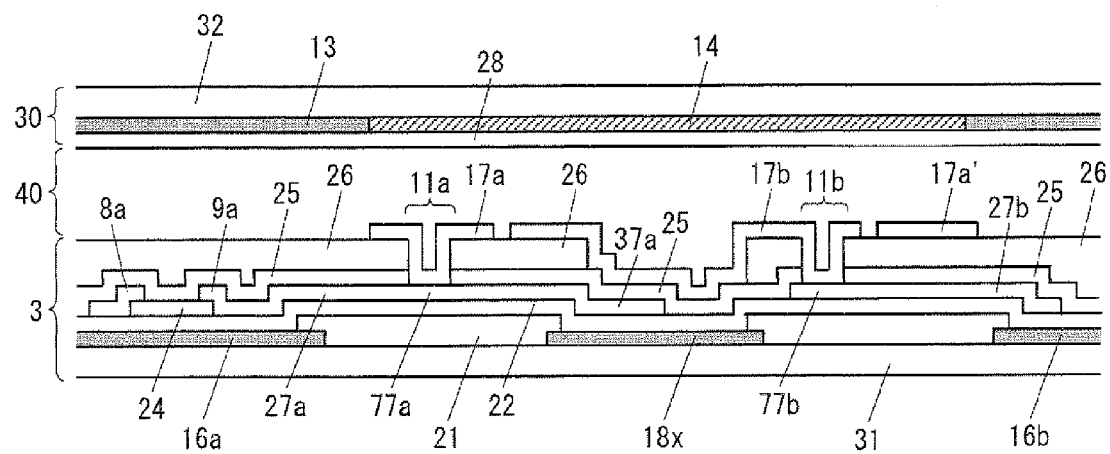
FIG. 9 is a cross-sectional view illustrating another concrete example of a cross-section taken on line A-B illustrated in FIG. 6.

The configuration of the A-B cross section shown in FIG. 7 can be configured as shown in FIG. 9. Specifically, a thick organic gate insulating film 21 and a thin inorganic gate insulating film 22 are provided on a glass substrate 31, and a thin inorganic interlayer insulating film 25 and a thick organic interlayer insulating film 26 are formed under the pixel electrode. This brings about effects of (i) reducing various parasitic capacitances and (ii) preventing short-circuiting of wires. In this case, as shown in FIG. 9, it is preferable that (i) a part of the organic gate insulating film 21 which part is underneath the capacitor-coupling electrode 37a is hollowed out and (ii) a part of the organic interlayer insulating film 26 which part is above the capacitor-coupling electrode 37a is hollowed out. This allows an increase in capacitance of the coupling capacitor C101 and capacitances of the respective storage capacitors Cha and Chb.

Figure 10:
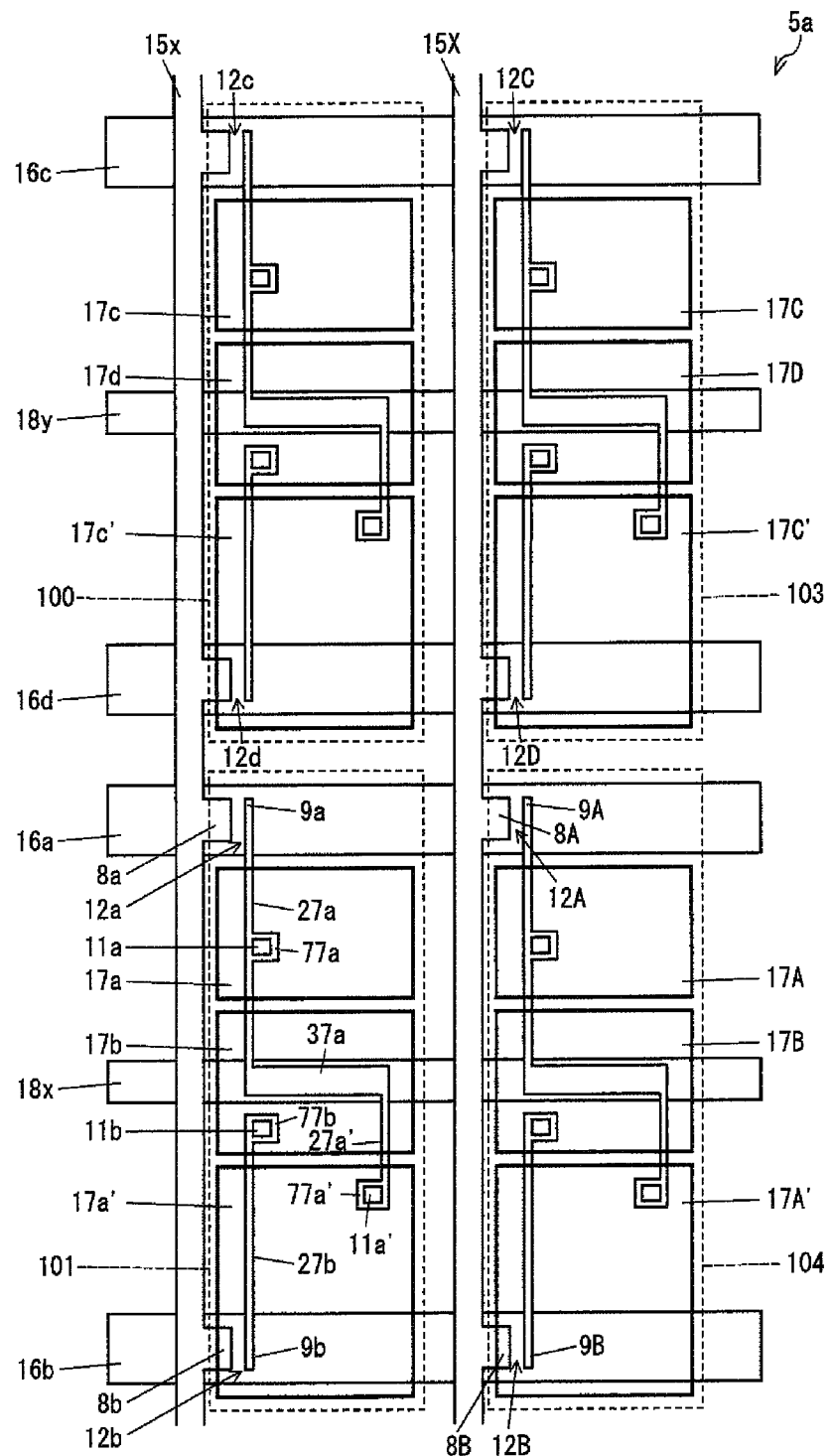

Note that the inorganic interlayer insulating film 25, the organic interlayer insulating film 26, and the contact holes 11a and 11b in FIG. 9 can be formed with the use of the method shown in FIG. 5. As shown in FIG. 9, in the case where the thin inorganic interlayer insulating film 25 and the thick organic interlayer insulating film 26 are provided under the pixel electrode, the liquid crystal panel 5a can be configured as shown in FIG. 10. That is, according to the configuration, the pixel electrode 17a' is provided so that the pixel electrode 17a' and the scanning signal line 16b overlap each other, via the inorganic interlayer insulating film 25 and the thick organic interlayer insulating film 26. This makes it possible to reduce parasitic capacitance between the pixel electrode 17a' and the scanning signal line 16b. Accordingly, in particular, an aperture ratio can be improved while increase of load on the scanning signal line 16*b* is being suppressed.

Complete Example 1-3 of Liquid Crystal Panel

Figure 11:
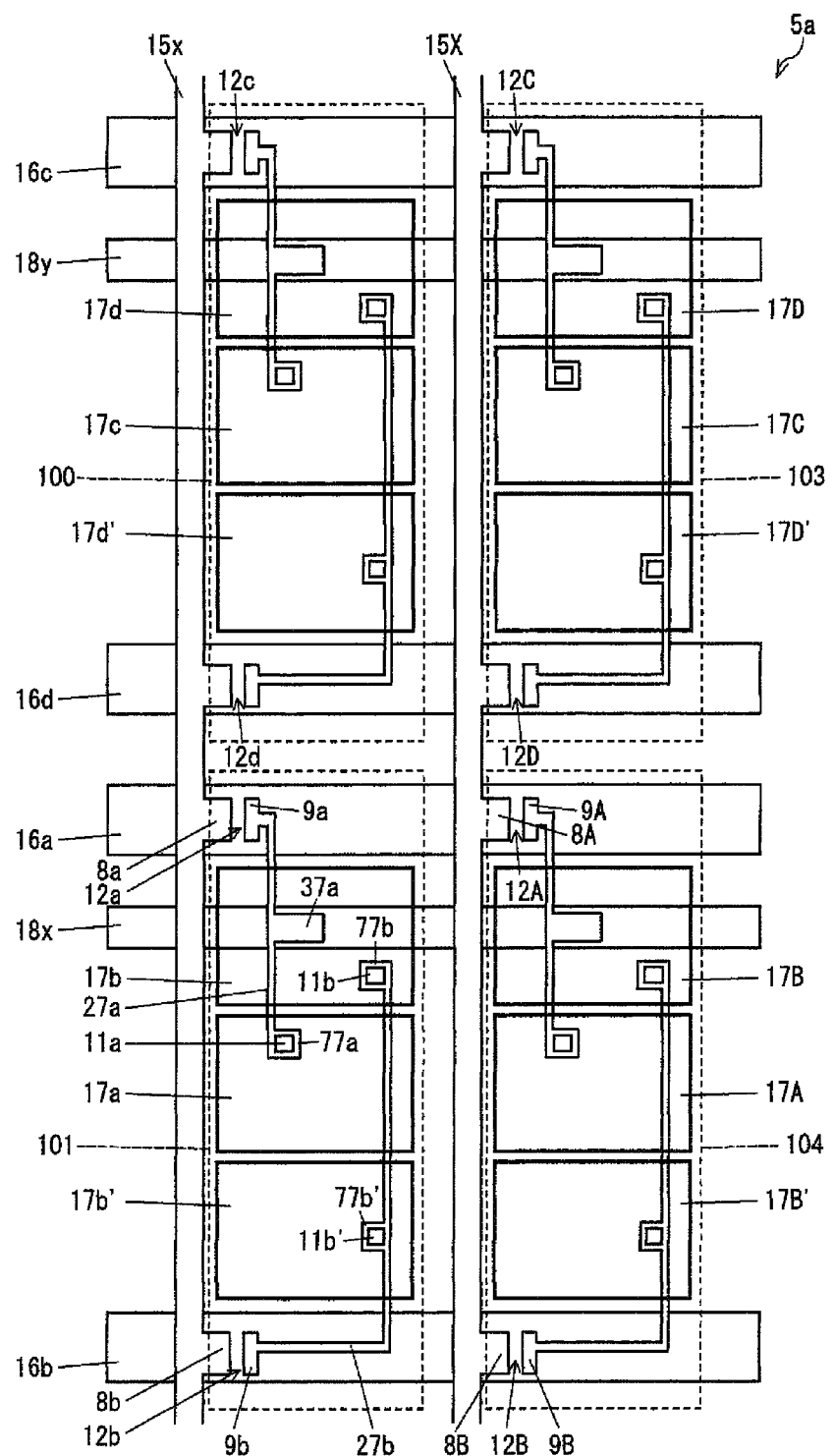

FIG. 11 illustrates Complete Example 1-3 of the liquid crystal panel 5*a*. According to the liquid crystal panel 5*a* shown in FIG. 11, three pixel electrodes are provided in each pixel region. Further, in the liquid crystal panel 5*a* shown in FIG. 11, as with the liquid crystal panel shown in FIG. 2, a data signal line 15*x* is provided along a pixel 100 and a pixel 101; a data signal line 15X is provided along a pixel 103 and a pixel 104; a storage capacitor wire 18*y* is provided so as to traverse the pixels 100 and 103; and a storage capacitor wire 18*x* is provided so as to traverse the pixel 101 and 104.

In the liquid crystal panel 3*a*, a scanning signal line 16*c* is provided so that the scanning signal line 16*c* and one of two edge parts of the pixel 100 overlap each other, which two edge parts extend in the row direction; a scanning signal line 16*d* is provided so that the scanning signal line 16*d* and the other of the two edge parts overlap each other; and pixel electrodes 17*d*, 17*c*, and 17*d*' are juxtaposed in the column direction between the scanning signal lines 16*c* and 16*d* when they are viewed from above. The scanning signal line 16*c* is provided so that the scanning signal line 16*c* and one of two edge parts of the pixel 103 overlap each other, which two edge parts extend in the row direction; the scanning signal line 16*d* is provided so that the scanning signal line 16*d* and the other of the two edge parts overlap each other; and pixel electrodes 17D, 17C, and 17D' are juxtaposed in the column direction between the scanning signal lines 16*c* and 16*d* when they are viewed from above.

Moreover, a scanning signal line 16*a* is provided so that the scanning signal line 16*a* and one of two edge parts of the pixel 101 overlap each other, which two edge parts extend in the row direction; a scanning signal line 16*b* is provided so that the scanning signal line 16*b* and the other of the two edge parts overlap each other; and pixel electrodes 17*b*, 17*a*, and 17*b*' are juxtaposed in the column direction between the scanning signal lines 16*a* and 16*b* when they are viewed from above. The scanning signal line 16*a* is provided so that the scanning signal line 16*a* and one of two edge parts of the pixel 104 overlap each other, which two edge parts extend in the row direction; the scanning signal line 16*b* is provided so that the scanning signal line 16*b* and the other of the two edge parts overlap each other; and pixel electrodes 17B, 17A, and 17B' are juxtaposed in the column direction between the scanning signal lines 16*a* and 16*b* when they are viewed from above.

In the pixel 101, the transistor 12*a* has a source electrode 8*a* and a drain electrode 9*a* which are provided above the scanning signal line 16*a*, and the transistor 12*b* has a source electrode 8*b* and a drain electrode 9*b* which are provided above the scanning signal line 16*b*. The source electrode 8*a* is connected to the data signal line 15*x*. The drain electrode 9*a* is connected to a wire 27*a* for drawing out a drain. The wire 27*a* is connected to a capacitor-coupling electrode 37*a* and a contact electrode 77*a*. The contact electrode 77*a* is connected to the pixel electrode 17*a* via a contact hole 11*a*. The capacitor-coupling electrode 37*a* and the pixel electrode 17*b* overlap each other via an interlayer insulating film. With the configuration, the coupling capacitor C101 (see FIG. 12 which will be explained later) is formed between the pixel electrodes 17*a* and 17*b*.

The source electrode 8*b* of the transistor 12*b* is connected to the data signal line 15*x*. The drain electrode 9*b* is connected to a wire 27*b* for drawing out a drain. The wire 27*b* is connected to the contact electrode 77*b*'. The contact electrode 77*b*' is connected to the pixel electrode 17*b*' (third pixel electrode) via a contact hole 11*b*'. Further, the wire 27*b* is connected to a contact electrode 77*b*. The contact electrode 77*b* is connected to the pixel electrode 17*b* via a contact hole 11*b*. The capacitor-coupling electrode 37*a*, and the storage capacitor wire 18*x* overlap each other via a gate insulating film. This causes storage capacitor Cha (see FIG. 12 which will be explained later) to be formed, and storage capacitor Chb (see FIG. 12 which will be explained later) is formed between the pixel electrode 17*b* and the storage capacitor wire 18*x*. Note that a configuration (shapes and arrangements of respective members and their connecting relations) of each of the other pixels is identical to that of the pixel 101.

According to the configuration, a sub-pixel including the pixel electrode 17*a* becomes "bright", and sub-pixels including the respective pixel electrodes 17*b* and 17*b*' become "dark".

Figure 12:
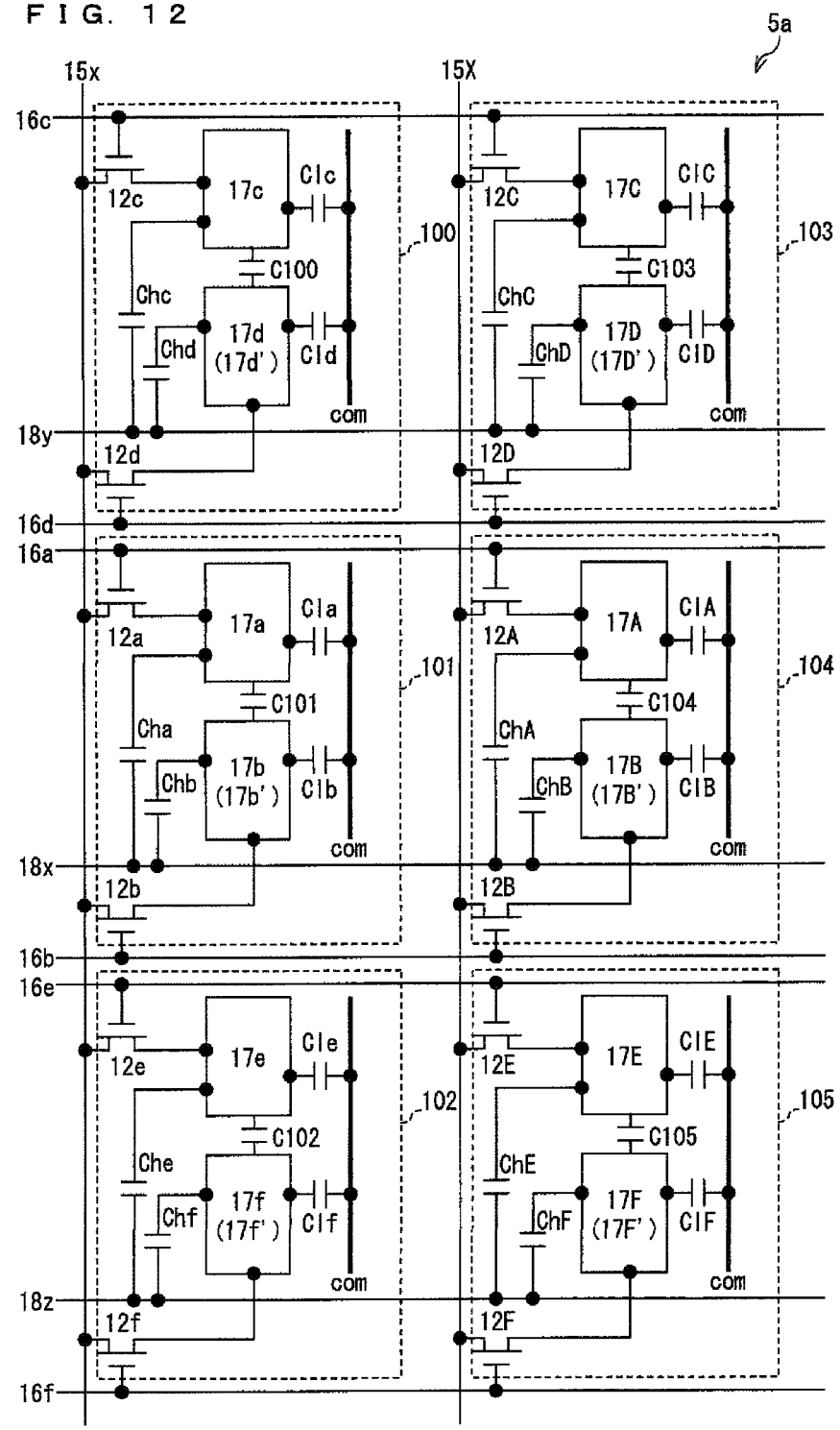
FIG. 12 is a circuit diagram illustrating a configuration of a liquid crystal panel 5a shown in FIG. 11.

FIG. 12 illustrates an equivalent circuit diagram of the liquid crystal panel shown in FIG. 11. The pixels have identical configurations in each of which, one data signal line and two scanning signal lines are provided for each of the pixels; the three pixel electrodes 17*d*, 17*c*, and 17*d*' (FIG. 12 illustrates a state where the pixel electrodes 17*d* and 17*d*' are electrically connected to each other) are provided in the pixel 100; the three pixel electrodes 17*b*, 17*a*, and 17*b*' are provided in the pixel 101; and the three pixel electrodes 17*f*, 17*e*, and 17*f*' are provided in the pixel 102. The pixel electrodes 17*c*, 17*d*, 17*d*', 17*a*, 17*b*, 17*b*', 17*e*, 17*f*, and 17*f*' are provided in the column direction. The three pixel electrodes 17D, 17C, and 17D' are provided in the pixel 103; the three pixel electrodes 17B, 17A, and 17B' are provided in the pixel 104; and the three pixel electrodes 17F, 17E, and 17F' are provided in the pixel 105. The pixel electrodes 17C, 17D, 17D', 17A, 17B, 17B', 17E, 17F, and 17F' are provided in the column direction. In the row direction, the pixel electrodes 17*c*, 17*d* (17*d*'), 17*a*, 17*b* (17*b*'), 17*e*, and 17*f* (17*f*') are provided adjacent to the pixel electrodes 17C, 17D (17D'), 17A, 17B (17B'), 17E, and 17F (17F'), respectively.

The following description exemplifies the pixel 101. The pixel electrodes 17*a* and 17*b* are coupled with each other via the coupling capacitor C101, the pixel electrode 17*a* is connected to the data signal line 15*x* via the transistor 12*a* connected to the scanning signal line 16*a*. The pixel electrodes 17*b* and 17*b*', which are electrically connected to each other, are connected to the data signal line 15*x* via the transistor 12*b* connected to the scanning signal line 16*b*. The storage capacitor Cha is formed between the pixel electrode 17*a* and the storage capacitor wire 18*x*, the storage capacitor Chb is formed between the pixel electrode 17*b* and the storage capacitor wire 18*x*. The liquid crystal capacitor Cla is formed between the pixel electrode 17*a* and the common electrode com, and the liquid crystal capacitor Clb is formed between (i) the pixel electrodes 17*b* and 17*b*' and (ii) the common electrode com.

Figure 47:
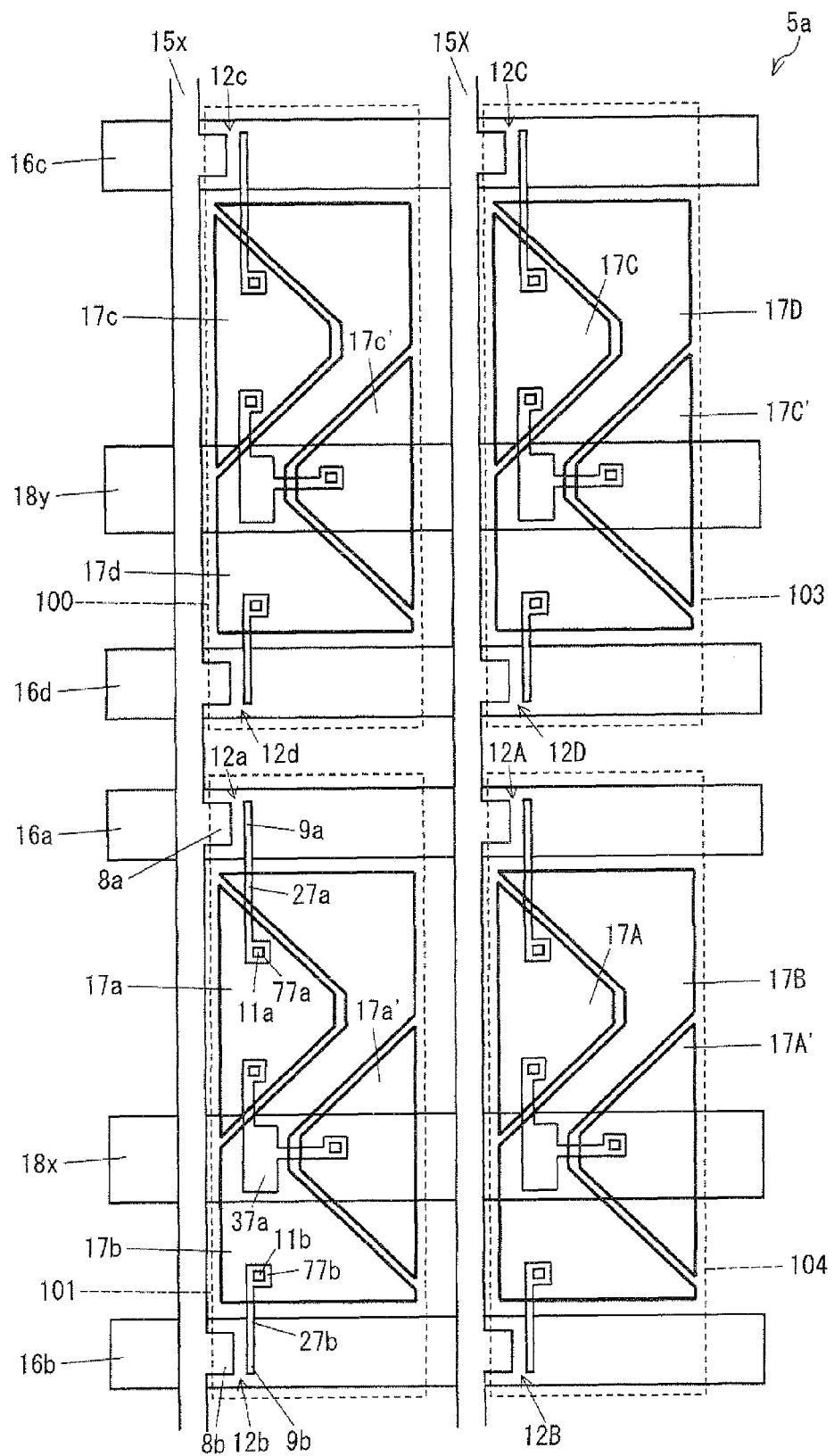

The liquid crystal panel of the present invention is not limited to the configuration as described above in which rectangular pixel electrodes are provided in the column direction. The liquid crystal panel of the present invention can be configured as shown in FIG. 47. FIG. 47 is a plan view illustrating a modification of concrete example 1-2 shown in FIG. 6. According to the pixel 101 of FIG. 47, a transistor 12*a* is provided in the vicinity of an intersection of a data signal line 15*x* and a scanning signal line 16*a*. (i) A pixel electrode 17*a* having a trapezoidal shape, (ii) a pixel electrode 17*a*', and (iii) a pixel electrode 17*b* are provided in a pixel region demarcated by both the signal lines (15*x* and 16*a*) and the scanning signal line 16b. The pixel electrode 17a', which has a trapezoidal shape, is provided in a position of substantial 315 degrees direction from the pixel electrode 17a, with respect to the row direction in which the storage capacitor wire 18x extends, and the trapezoidal shape of the pixel electrode 17a' is substantially identical to a shape obtained by rotating the pixel electrode 17a by 180 degrees. The pixel electrode 17b is provided, in an area of the pixel region except for the pixel electrodes 17a and 17a', so as to correspond to (so as to engage with) the shapes of the pixel electrodes 17a and 17a'. The storage capacitor wire 18x extends in the row direction so as to traverse the pixel electrodes 17b and 17a'.

Because of the configuration, the pixel electrodes 17a, 17b, and 17a' are arranged so that (i) part of the pixel electrode 17a comes close to the scanning signal line 16a, (ii) part of the pixel electrode 17a' comes close to the scanning signal line 16b, and (iii) one end of the pixel electrode 17b comes close to the scanning signal line 16a and the other end of the pixel electrode 17b comes close to the scanning signal line 16b. In other words, at least parts of the respective pixel electrodes 17a and 17a' are provided so as to come close to the respective scanning signal lines 16a and 16b. The pixel electrode 17b extends in the column direction as if to connect the scanning signal line 16a with the scanning signal line 16b. Note that the members shown in FIG. 47 which have the same functions as those of the members shown in FIG. 6 are given the same respective reference numerals, and explanations of the respective members are omitted.

According to the configuration, sub-pixels including the respective pixel electrodes 17a and 17a' become "bright", and a sub-pixel including the pixel electrode 17b becomes "dark". Further, the wires for drawing out from the respective transistors 12a and 12b can be reduced, as compared with the configuration show in FIG. 6. Further, the wires for drawing out from the capacitor-coupling electrodes 37a can be reduced, as compared with the configuration show in FIG. 6. This is because the pixel electrodes 17a and 17a', while they are staying close to each other, are coupled with each other via the capacitor-coupling electrode 37a. This brings about effects of (i) suppressing occurrence of image-sticking in a sub-pixel including the pixel electrode 17b, (ii) reducing possibility of breakage of the wires for drawing out, and (iii) improving an aperture ratio.

Figure 48:
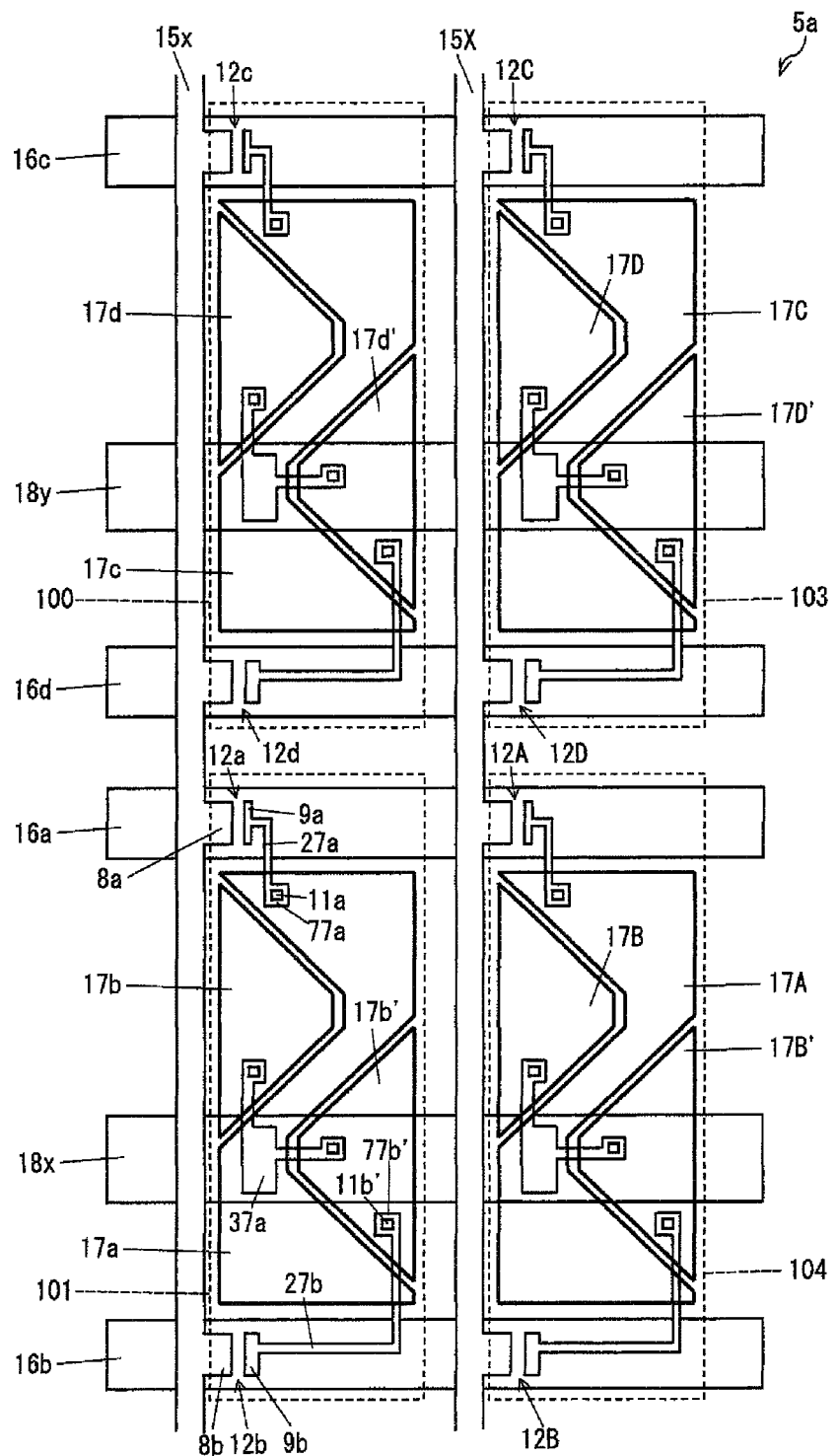

A liquid crystal panel of the present invention can be configured as shown in FIG. 48. FIG. 48 illustrates a modification of the present concrete example 1-3 shown in FIG. 11. According to the liquid crystal panel 5a shown in FIG. 48, at least parts of the respective pixel electrodes 17b and 17b', each of which has a trapezoidal shape, are provided so as to come close to the respective scanning signal lines 16a and 16b. The pixel electrode 17a, which is provided so as to correspond to (so as to engage with) the shapes of the pixel electrodes 17b and 17b', extends in the column direction as if to connect the scanning signal line 16a with the scanning signal line 16b.

According to the configuration, a sub-pixel including the pixel electrode 17a becomes "bright", and sub-pixels including the respective pixel electrodes 17b and 17b' become "dark". Moreover, as with the liquid crystal panel 5a shown in FIG. 47, an effect of improving an aperture ratio can be attained.

(Method for Driving Liquid Crystal Display Device)

The following describes a method for driving a liquid crystal display device, including the above-mentioned liquid crystal panel 5a, of the present invention. The driving method schematically has features described below.

A first feature resides in that the transistor 12b, connected to the capacitor-coupled electrode, is turned on at least once while the liquid crystal display device is being turned on. This allows the capacitor-coupled electrode (pixel electrode 17b) to be electrically connected to the data signal line 15x, as described, above. Accordingly, stored electric charge can be discharged (refreshed), and occurrence of image-sticking in a sub-pixel including the capacitor-coupled electrode can be suppressed.

A second feature resides in that (i) the transistor 12b is turned on at least once while the liquid crystal display device is being turned on whereas (ii) the transistor 12b is turned off while the signal electric potential Vcom is being applied to the data signal line 15x. This makes it possible to cause the pixel electrode 17b to have an electric potential of Vcom. As such, it is possible to prevent deterioration in display quality, in addition to the effect of discharging the stored charge.

A third feature resides in, in addition to the first and second features, that the transistor 12b connected to the pixel electrode 17b is turned off while the signal electric potential Vcom is being applied to the pixel electrodes 17a and 17b from the data signal line 15x via the transistors 12a and 12b. That is, the transistor 12a is turned on at the time when the transistor 12b is turned off, and therefore the signal electric potential Vcom is applied to the pixel electrode 17a. This makes it possible to reset electric potentials of the respective pixel electrodes in one (1) pixel region before writing a regular signal electric potential into the pixel electrode 17a. That is, an electric potential of the capacitor-coupled pixel electrode 17b can be fixed to Vcom. This makes it possible to reliably discharge electric charge stored in the pixel electrode 17b and to prevent deterioration in display quality.

The following describes details of (i) a concrete driving method having the first through third features and (ii) a configuration of a gate driver which realizes the driving method. The driving method described below employs a charge sharing method. However, the present embodiment is not limited to this.

(Driving Method-1)

Figure 13:
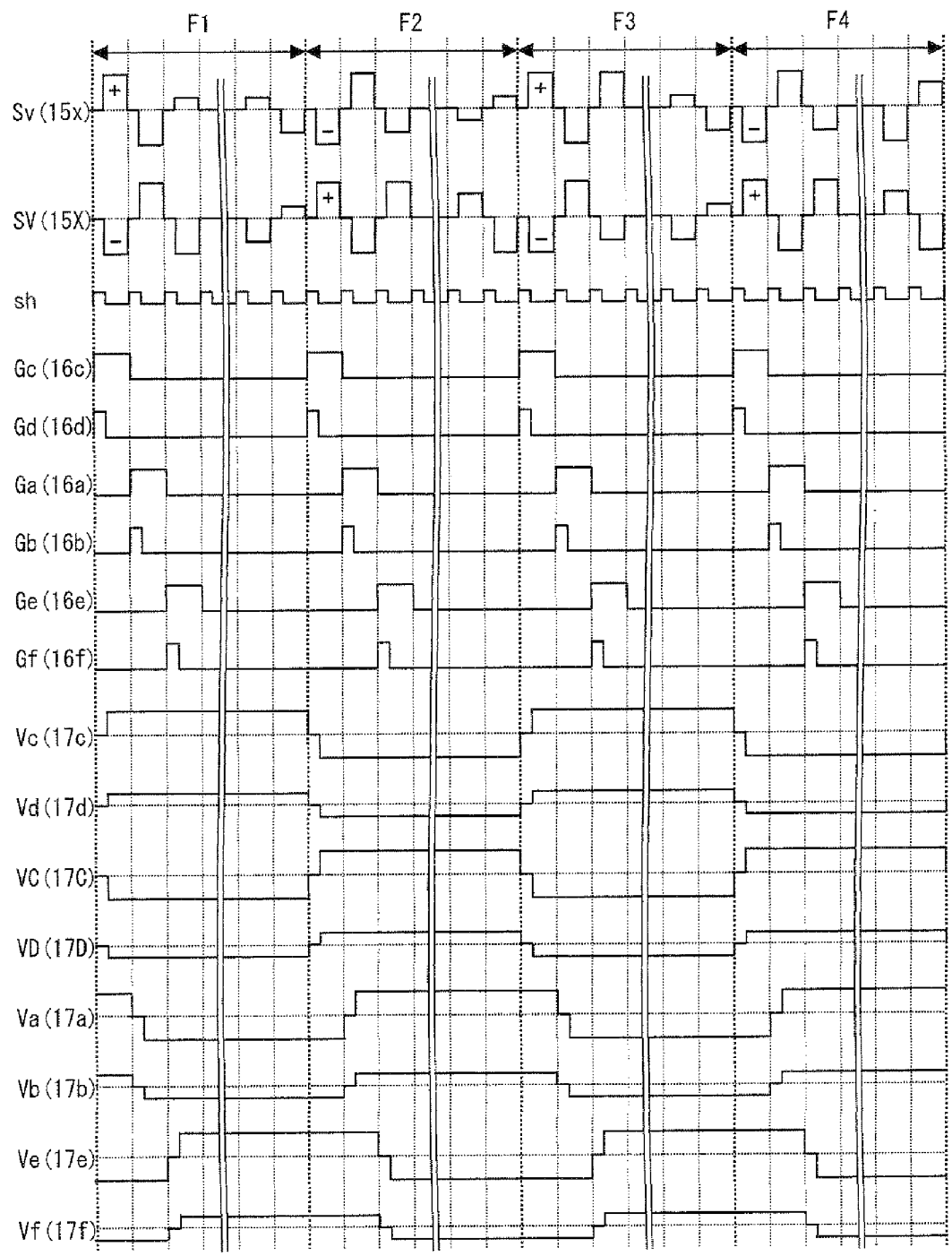
FIG. 13 is a timing chart showing a method for driving a liquid crystal display device including a liquid crystal panel 5a, 5b, or 5c.

FIG. 13 is a timing chart showing a method for driving the liquid crystal display device of the present invention that includes the liquid crystal panel 5a. Sv and SV indicate signal electric potentials applied to respective two adjacent data signal lines (e.g., 15x and 15X). Ga through Gf indicate gate on-pulse signals to be applied to the scanning signal lines 16a through 16f, respectively. Vc, Vd, Va, Vb, VC, and VD indicate electric potentials of respective pixel electrodes 17c, 17d, 17a, 17b, 17C, and 17D. sh indicates a charge sharing signal. During a period in which the charge sharing signal is being active ("H"), charge sharing is carried out by short-circuiting all of the data signal lines or by externally supplying an identical electric potential to all of the data signal lines.

According to the driving method, as shown in FIG. 13, (i) a polarity of a signal electric potential applied to a data signal line is reversed for each horizontal scanning period (1H), (ii) polarities of respective signal electric potentials to be applied during corresponding horizontal scanning periods in frames are reversed for each frame, and (iii) signal electric potentials having respective reverse polarities are applied to any two adjacent data signal lines during a same horizontal scanning period, and (iv) charge sharing is carried out at the beginning of each of the horizontal scanning periods.

Specifically, in F1 of consecutive frames F1 through F4, two scanning signal lines, which extend over and under a corresponding one (1) of pixels arranged in the column direction, are selected at a time successively (e.g., the scanning signal lines 16c and 16d are selected→the scanning signal lines 16a and 16b are selected→the scanning signal lines 16e and 16f are selected (see FIG. 1)). One (e.g., the data signal line 15x) of two adjacent data signal lines is supplied with (i) a signal electric potential having a positive polarity during a first horizontal scanning period (e.g., including a writing period for the pixel electrodes 17c and 17d), (ii) a signal electric potential having a negative polarity during a second horizontal scanning period (e.g., including a writing period for the pixel electrodes 17a and 17b), and (iii) a signal electric potential having a positive polarity during a third horizontal scanning period (e.g., including a writing period for the pixel electrodes 17e and 17f). The other (e.g., the data signal line 15X) of the two data signal lines is supplied with (1) a signal electric potential having a negative polarity during the first horizontal scanning period (e.g., including a writing period for the pixel electrodes 17C and 17D), (ii) a signal electric potential having a positive polarity during the second horizontal scanning period (e.g., including a writing period for the pixel electrodes 17A and 17B), and (iii) a signal electric potential having a negative polarity during the third horizontal scanning period (e.g., including a writing period for the pixel electrodes 17E and 17F). Note that a charge sharing electric potential (Vcom) is applied at the beginning of each, of horizontal scanning periods.

The periods, for carrying out writing with respect to pixel electrodes connected to the respective two scanning signal lines which extend over and under the corresponding one of the pixels arranged in the column direction, are set to be different from each other. Specifically, in FIG. 1, a period during which a signal electric potential having a positive polarity is written into the pixel electrode 17c in response to the scanning signal line 16c being selected becomes longer than a period during which a signal electric potential having Vcom is written into the pixel electrode 17d in response to the scanning signal line 16d being selected. A period during which a signal electric potential having a negative polarity is written into the pixel electrode 17a in response to the scanning signal line 16a being selected becomes longer than a period during which a signal electric potential having Vcom is written into the pixel electrode 17b in response to the scanning signal line 16b being selected. Moreover, the operations in which writing is carried out with respect to the respective pixel electrodes in one (1) pixel are carried out during an identical horizontal scanning period. Further, timing, at which the operations (i.e., active periods) in which the writing is carried out with respect to the respective pixel electrodes are completed, is set so that the operation which requires a shorter writing period is completed earlier than the operation which requires a longer writing period. Specifically, the operation in which the writing is carried out with respect to the pixel electrode 17d is completed earlier than the operation in which the writing is carried out with respect to the pixel electrode 17c is completed. The operation in which the writing is carried out with respect to the pixel electrode 17D is completed earlier than the operation in which the writing is carried out with respect to the pixel electrode 17C is completed; and the operation in which the writing is carried out with respect to the pixel electrode 17b is completed earlier than the operation in which the writing is carried out with respect to the pixel electrode 17a is completed.

Thus, (i) a gate on-pulse signal (second gate on-pulse signal) that is applied to a scanning signal line connected to a capacitor-coupled pixel electrode has a pulse width which is narrower than that of a gate on-pulse signal (first gate on-pulse signal) which is applied to a scanning signal line connected to a pixel electrode into which a regular signal electric potential is written, and (ii) the pulse signal width of the second gate on-pulse signal is set so that the second gate on-pulse signal becomes non-active before the first gate on-pulse signal becomes non-active. Accordingly, (i) the sub-pixel including the pixel electrode 17c (positive polarity) becomes "bright", (ii) the sub-pixel including the pixel electrode 17d (positive polarity) becomes "dark", (iii) the sub-pixel including the pixel electrode 17C (negative polarity) becomes "bright", (iv) the sub-pixel including the pixel electrode 17D (negative polarity) becomes "dark", (v) the sub-pixel including the pixel electrode 17a (negative polarity) becomes "bright", and (vi) the sub-pixel including the pixel electrode 17b (negative polarity) becomes "dark".

Note that a positive polarity and a negative polarity in F2 are reverse to those in F1. Accordingly, the sub-pixel including the pixel electrode 17c (negative polarity) becomes "bright", the sub-pixel including the pixel electrode 17d (negative polarity) becomes "dark", the sub-pixel including the pixel electrode 17C (positive polarity) becomes "bright", the sub-pixel including the pixel electrode 17D (positive polarity) becomes "dark", the sub-pixel including the pixel electrode 17a (positive polarity) becomes "bright", and the sub-pixel including the pixel electrode 17b (positive polarity) becomes "dark". In the subsequent frames F3 and F4, the operation for F1 and F2 is carried out again.

According to the driving method of the present embodiment, it is possible to separately apply signal electric potentials, in each frame, to the respective pixel electrodes (17d, 17b, 17D, and 17B) at the timing different from the timing at which signal electric potentials are applied to the respective pixel electrodes (17c, 17a, 17C, and 17A), to each of which regular writing is carried out. The pixel electrodes (17d, 17b, 17D, and 17B) are capacitor-coupled with the respective pixel electrodes (17c, 17a, 17C, and 17A) connected to the data signal lines (15x and 15X) via the respective transistors (12c, 12a, 12C, and 12A in case of FIGS. 1 and 2). This makes it possible to provide a pixel-division liquid crystal display device.

Moreover, according to the present driving method, the Vcom signal is applied to all the pixel electrodes in each pixel region at the beginning of each horizontal scanning period. It is therefore possible to reset to Vcom an electric potential of each of the pixel electrodes before a regular signal electric potential is written into the each of the pixel electrodes. It follows that it is possible to discharge (refresh) electrical charge stored in the capacitor-coupled pixel electrode. As such, it is possible to suppress occurrence of image-sticking in the sub-pixel including the capacitor-coupled pixel electrode and to prevent deterioration in display quality. Moreover, according to the present driving method, it is not necessary to adjust W/L ratios of channels of the transistors unlike a conventional configuration but the active matrix substrate can be configured to have channels whose sizes are substantially identical to each other. This makes it possible to suppress deterioration of display quality due to variation in characteristics of transistors.

Figure 51:
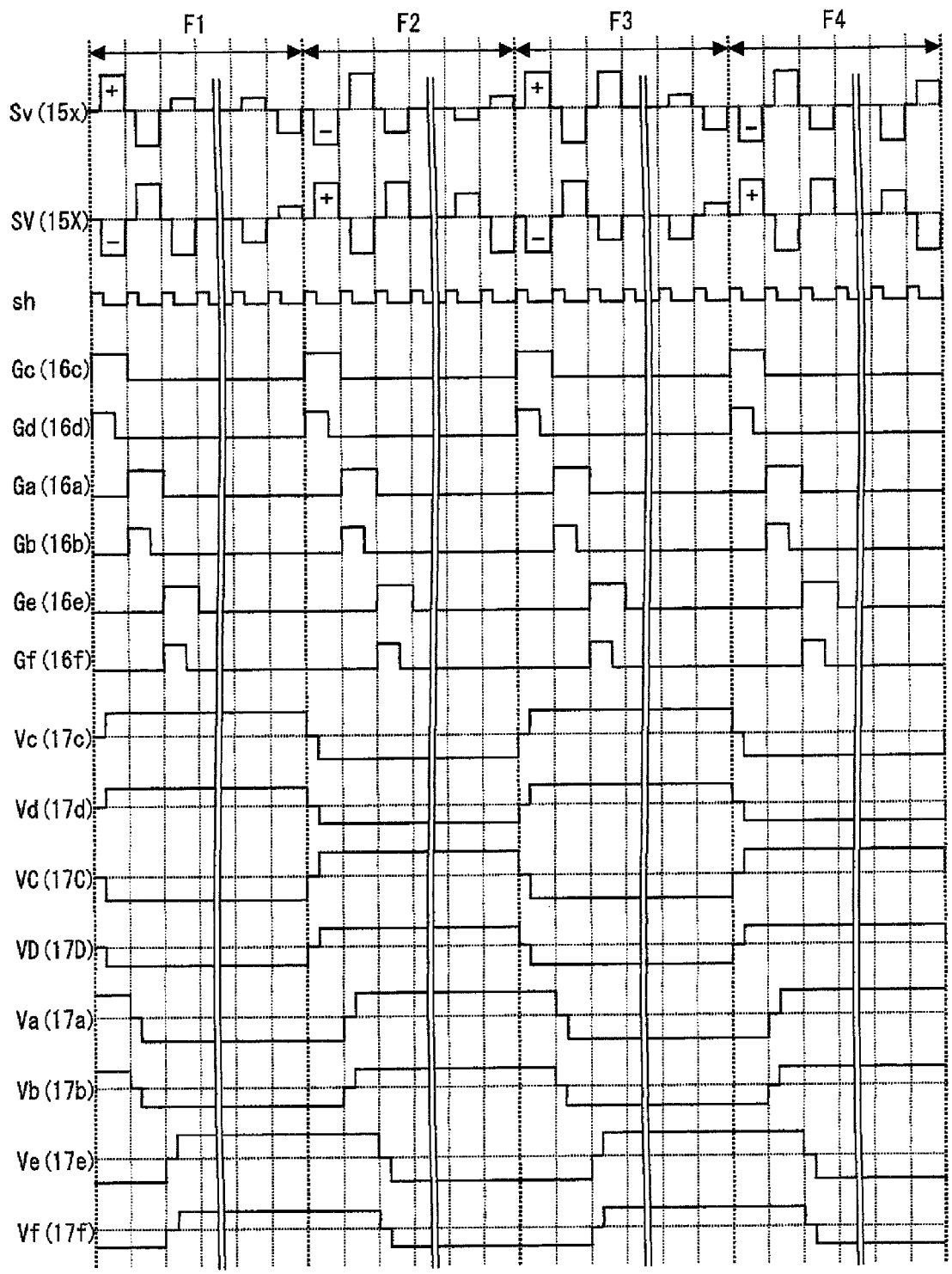
FIG. 51 is a timing chart showing another driving method other than that shown in FIG. 13.

A driving method shown in FIG. 51 can be employed instead of the driving method shown in FIG. 13. In the driving method shown in FIG. 51, each of second gate on-pulse signals (Gd, Gb, and Gf) is set to have a pulse width which is broader than a charge sharing period (a pulse width of sh). According to the driving method shown in FIG. 51, the signal electric potential Vcom is written into, during the charge sharing period, the pixel electrodes (17d, 17b, and 17f) which are capacitor-coupled with the respective pixel electrodes (17c, 17a, and 17e) to each of which regular writing is carried out. After that, regular signal electric potentials, which are written into the respective pixel electrodes (17c, 17a, and 17e), are applied to the respective pixel electrodes (17d, 17b, and 17l) only during a predetermined period. This brings about an effect of adjusting (improving) brightness during, in particular, a white display. According to the driving method shown in FIG. 51, by adjusting the pulse widths of the second gate on-pulse signals, it is possible to independently adjust brightness of each of the pixel electrodes (17d, 17b, and 17f; capacitor-coupled electrodes) which are connected to the respective pixel electrodes (17c, 17a, and 17e) connected to the data signal line via the respective transistors. This makes it possible to set the liquid crystal display device to have arbitrary display brightness.

(Circuit Configuration-1 of Gate Driver)

Figure 14:
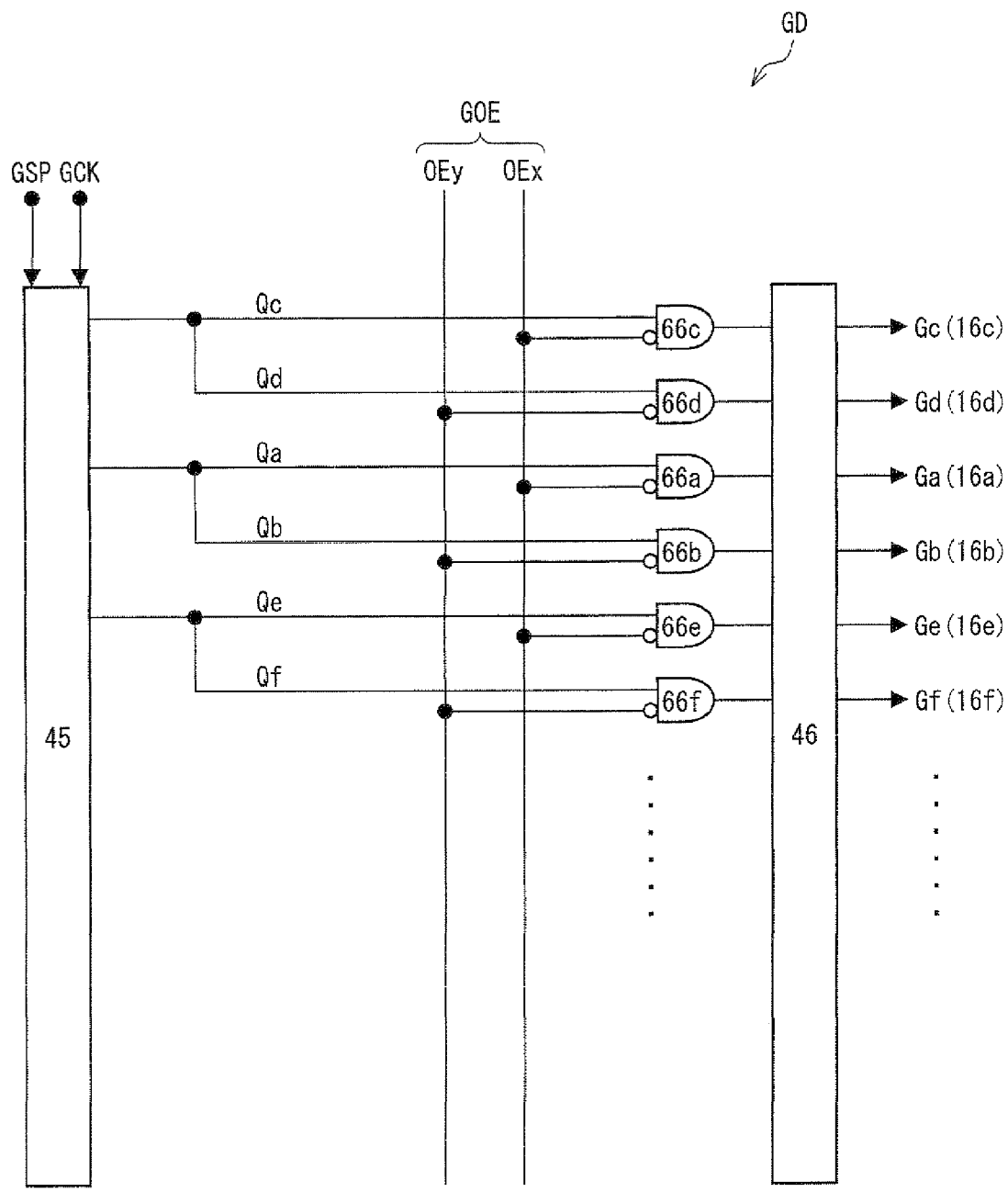
FIG. 14 is a circuit diagram illustrating a configuration of a gate driver that drives liquid crystal panel 5a, 5b, or 5c.

FIG. 14 is a circuit diagram illustrating a circuit configuration of a gate driver of the present liquid crystal display device, which gate driver realizes the driving method shown in FIG. 13. As illustrated in FIG. 14, a gate driver GD includes a shift register 45, a plurality of AND circuits (66a through 66f) provided in a column direction, and an output circuit 46. The shift register 45 is supplied with a gate start pulse signal GSP and a gate clock signal GCK. An output signal of each of constituent circuits, which are connected in series and constitute the shift register 45, is made up of two signals. One of the two signals is supplied to a corresponding odd-numbered AND circuit and the other of the two signals is supplied to a corresponding even-numbered AND circuit that is adjacent to the odd-numbered AND circuit. A gate driver output control signal GOE is made up of two signals (OEx and OEy). An inverted signal of the signal OEx is supplied to the odd-numbered AND circuits, and an inverted signal of the signal OEy is supplied to the even-numbered AND circuits. Further, an output signal of each of the AND circuits becomes a gate on-pulse signal via the output circuit 46, and this gate on-pulse signal is supplied to a corresponding scanning signal line.

For example, an output signal of a corresponding one of the constituent circuits in the shift register 45 is made up of two signals. One of the two signals is supplied, as a signal (Qc), to the AND circuit 66c and the other of the two signals is supplied, as a signal (Qd), to the AND circuit 66d. Further, the AND circuit 66c is supplied with the inverted signal of the signal OEx, and the AND circuit 66d is supplied with the inverted signal of the signal OEy. The output circuit 46 generates a gate on-pulse signal Gc in accordance with an output signal of the AND circuit 66c, and this gate on-pulse signal Gc is supplied to the scanning signal line 16c. The output circuit 46 generates a gate on-pulse signal Gd in accordance with an output signal of the AND circuit 66d, and this gate on-pulse signal Gd is supplied to the scanning signal line 16d.

Similarly, an output signal of a corresponding another one of the constituent circuits in the shift register 45 is made up of two signals. One of the two signals is supplied, as a signal (Qa), to the AND circuit 66a and the other of the two signals is supplied, as a signal (Qb), to the AND circuit 66b. Further, the AND circuit 66a is supplied with the inverted signal of the signal OEx, and the AND circuit 66b is supplied with the inverted signal of the signal OEy. The output circuit 46 generates a gate on-pulse signal Ga in accordance with an output signal of the AND circuit 66a, and this gate on-pulse signal Ga is supplied to the scanning signal line 16a. The output circuit 46 generates a gate on-pulse signal Gb in accordance with an output signal of the AND circuit 66b, and this gate on-pulse signal Gb is supplied to the scanning signal line 16b.

Figure 15:
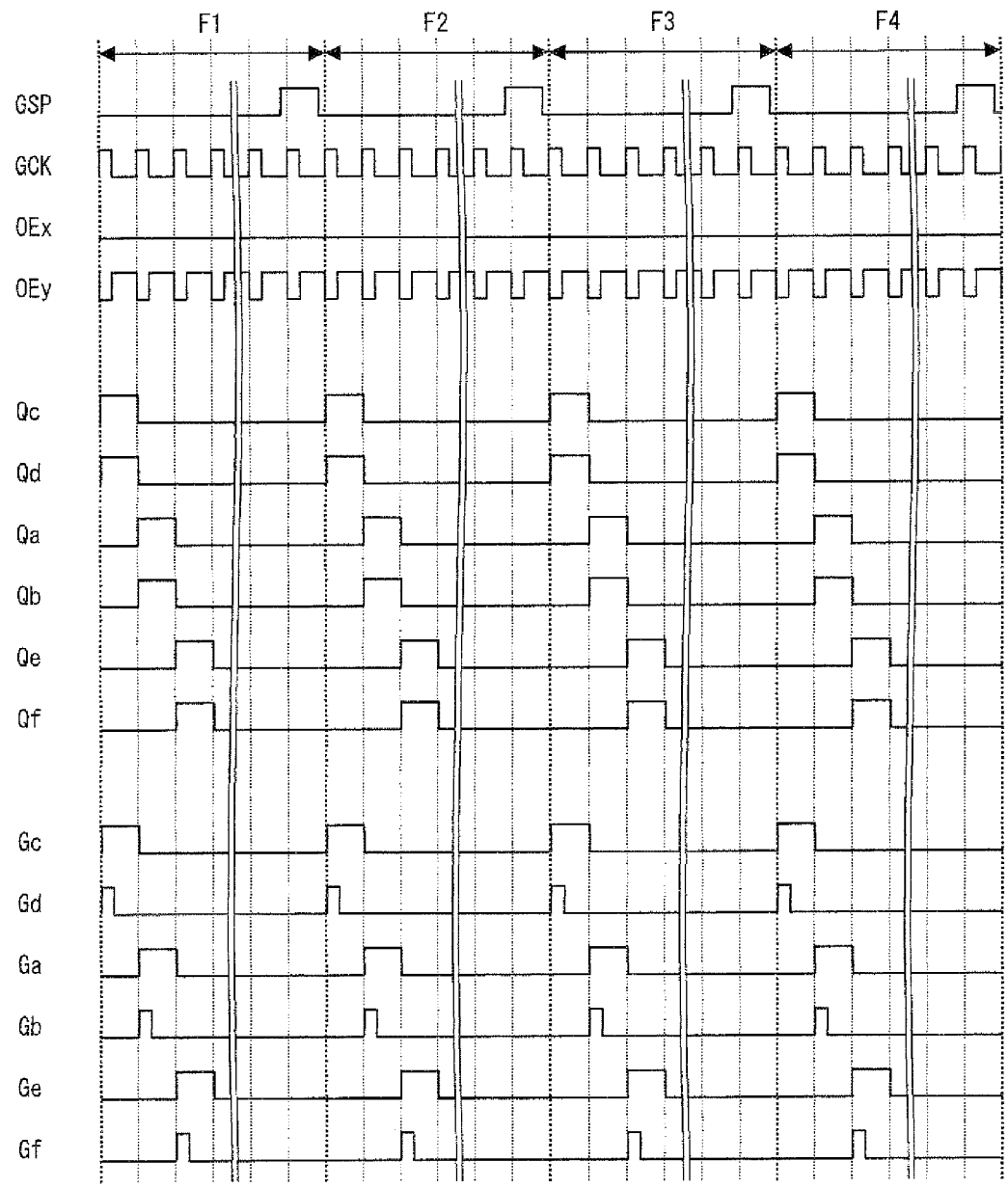
FIG. 15 is a timing chart showing a method for driving a gate driver shown in FIG. 14.

FIG. 15 is a timing chart illustrating how the gate driver illustrated in FIG. 14 operates. As illustrated in FIG. 15, for example, the signal OEx is always "L" in all frames, whereas the signal OEy keeps "L" until a predetermined period of time elapses from the beginning of each horizontal scanning period. Note that the signal OEx is not always "L". For example, in a case where a falling edge of a waveform of a gate on-pulse does not change sharply and the falling edge is kept in a subsequent horizontal scanning period, the signal Oex can be "H" at latest at the end of each horizontal scanning period.

According to the timing chart of FIG. 15, it is possible to (i) sequentially cause the gate on-pulse signals Ge, Ga, and Ge to be "H" (active) and (ii) sequentially cause the gate on-pulse signals Gd, Gb, and Gf to be "H" (active). Further, it is possible to cause the gate on-pulse signals Gc, Ga, and Ge (writing pulse signals) to have a gate on-pulse (writing pulse) width (i.e., "H" period (active period)) which is different from that of the gate on-pulse signals Gd, Gb, and Gf. Hence, the driving method shown in FIG. 13 is realized.

Note that, according to the driving method shown in FIG. 15, it is possible to have (i) the effect of suitably setting a width of a gate on-pulse (writing pulse), and (ii) the effect of simplifying a circuit configuration of the driver because it is possible to generate, with use of an output signal of a corresponding identical one of the constituent circuits in the shift register, two gate on-pulse signals which are supplied to respective two scanning signal lines which extend over and under a corresponding one (1) of pixels arranged in the column direction.

(Driving Method-2)

Figure 16:
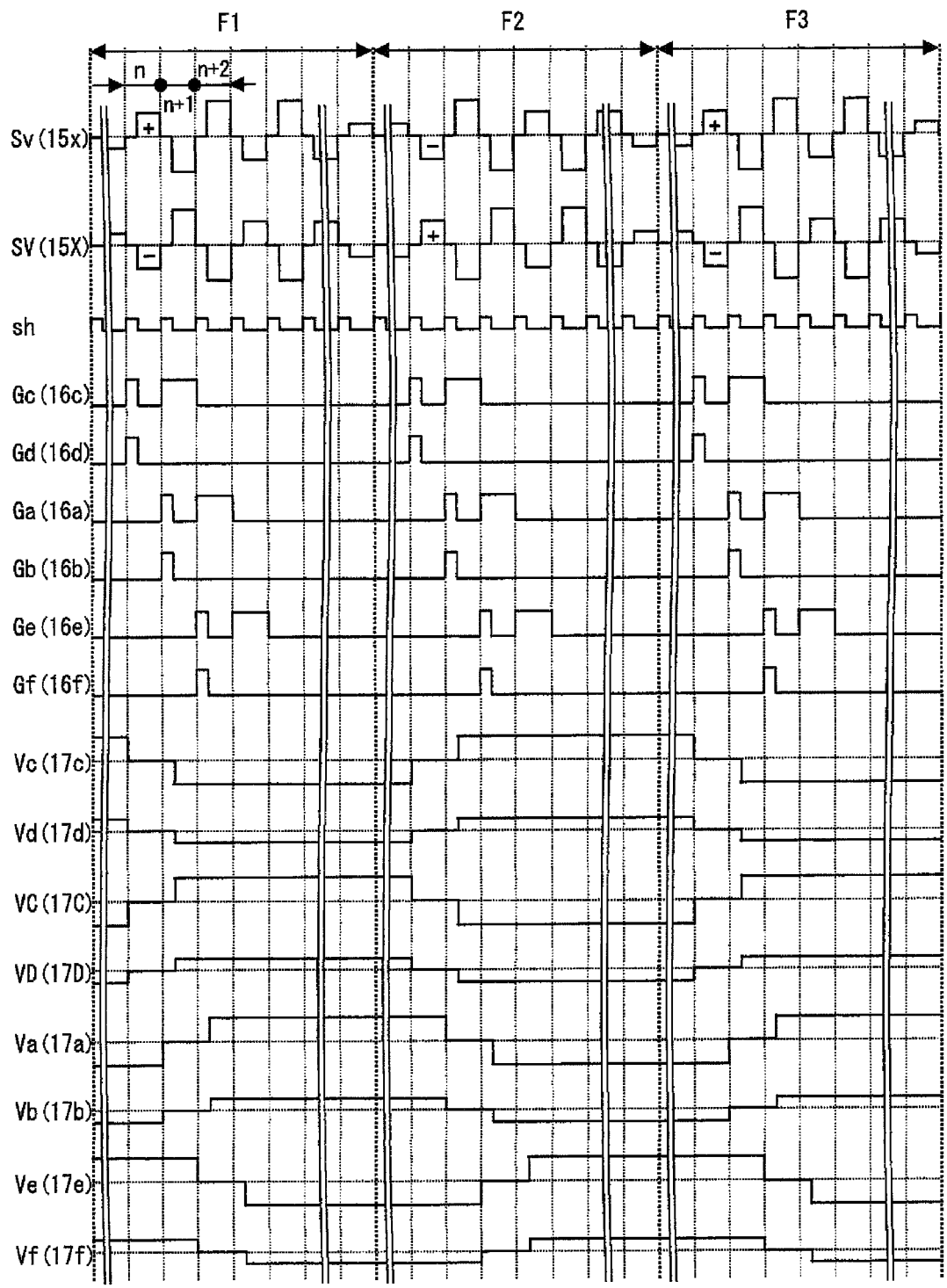
FIG. 16 is a timing chart showing another method for driving a liquid crystal display device including a liquid crystal panel 5a, 5b, or 5c.

FIG. 16 is a timing chart illustrating another driving method of the present liquid crystal display device. The same reference signs as those in FIG. 13 are used in FIG. 16. Further, also in this driving method, as shown in FIG. 13, (i) a polarity of a signal electric potential applied to a data signal line is reversed for each horizontal scanning period (1H), (ii) polarities of respective signal electric potentials to be applied during corresponding horizontal scanning periods in frames are reversed for each frame, and (iii) signal electric potentials having respective reverse polarities are applied to any two adjacent data signal lines during a single horizontal scanning period, and (iv) charge sharing is carried out at the beginning of each of the horizontal scanning periods.

In the present driving method, two scanning signal lines which extend over and under a corresponding one of the pixels arranged in the column direction are concurrently selected in a horizontal scanning period that is one (1) horizontal scanning period before a horizontal scanning period in which regular writing is carried out, and then Vcom is applied to all pixel electrodes in a corresponding pixel region.

Specifically, the following operations are carried out. Namely, in F1 of consecutive frames F1 through F4, two scanning signal lines, which extend over and under a corresponding one (1) of the pixels arranged in the column direction, are selected at a time successively (e.g., the scanning signal lines 16c and 16d→the scanning signal lines 16a and 16b (see FIG. 1)). A signal electric potential having a positive polarity is applied, during an nth horizontal scanning period, to one (e.g., the data signal line 15x) of two adjacent data signal lines, and a Vcom signal is applied at the beginning of the nth horizontal scanning period. A signal electric potential having a negative polarity is applied, during a (n+1)th horizontal scanning period (e.g., including a period in which writing is carried out with respect to the pixel electrode 17c), to the one of the two adjacent data signal lines, and a Vcom signal is applied at the beginning of the (n+1)th horizontal scanning period. A signal electric potential having a positive polarity is applied, during a (n+2)th horizontal scanning period (e.g., including a period in which writing is carried out with respect to the pixel electrode 17a), to the one of the two adjacent data signal lines, and a Vcom signal is supplied at the beginning of the (n+2)th horizontal scanning period. On the other hand, a signal electric potential having a negative polarity is applied, during the nth horizontal scanning period, to the other (e.g., the data signal line 15X) of the two adjacent data signal lines, and a Vcom signal is applied at the beginning of the nth horizontal scanning period. A signal electric potential having a positive polarity is applied, during the (n+1)th horizontal scanning period (e.g., including a period in which writing is carried out with respect to the pixel electrode 17C), to the other data signal line, and a Vcom signal is applied at the beginning of the (n+1)th horizontal scanning period. A signal electric potential having a negative polarity is applied, during the (n+2)th horizontal scanning period (e.g., including a period in which writing is carried out with respect to the pixel electrode 17A), to the other data signal line, and a Vcom signal is applied at the beginning of the (n+2)th horizontal scanning period.

As a result, a sub-pixel including the pixel electrode 17*c* (negative polarity) becomes "bright", a sub-pixel including the pixel electrode 17*d* (negative polarity) becomes "dark", a sub-pixel including the pixel electrode 17C (positive polarity) becomes "bright", a sub-pixel including the pixel electrode 17D (positive polarity) becomes "dark", a sub-pixel including the pixel electrode 17*a* (positive polarity) becomes "bright", and a sub-pixel including the pixel electrode 17*b* (positive polarity) becomes "dark".

The following description focuses on the pixel 101. In the pixel 101, the transistors 12*a* and 12*b* both turn on in the horizontal scanning period (n+1). Note that the horizontal scanning period (n+1) is one (1) horizontal scanning period before the horizontal scanning period (n+2) in which regular writing is carried out. In response to the turning on of the transistors 12*a* and 12*b*, the Vcom is applied to the pixel electrode 17*a* into which a regular signal electric potential is to be written and the pixel electrode 17*b* which is capacitor-coupled with the pixel electrode 17*a*. Then, while the Vcom is being applied, the transistors 12*a* and 12*b* both turn off. Consequently, a signal electric potential, having a negative polarity which is applied to the data signal line 15*x* in the (n+1)th horizontal scanning period, is applied, as a regular writing signal, to the pixel electrode 17*c* in the pixel 100, whereas the signal electric potential having the negative polarity is not supplied to the pixel electrode 17*a* in the pixel 101. In the (n+2)th horizontal scanning period following the (n+1)th horizontal scanning period, only the transistor 12*a* turns on, and therefore the Vcom is applied to the pixel electrode 17*a* at the beginning of the (n+2)th horizontal scanning period. Then, a signal electric potential having a positive polarity is applied, as a regular writing signal, to the pixel electrode 17*a*.

As a result of this driving method, in F1, the sub-pixel including the pixel electrode 17*c* (negative polarity) becomes "bright", the sub-pixel including the pixel electrode 17*d* (negative polarity) becomes "dark", the sub-pixel including the pixel electrode 17C (positive polarity) becomes "bright", the sub-pixel including the pixel electrode 17D (positive polarity) becomes "dark", the sub-pixel including the pixel electrode 17*a* (positive polarity) becomes "bright", and the sub-pixel including the pixel electrode 17*b* (positive polarity) becomes "dark".

The polarities (positive, negative) of the pixel electrodes in F1 are reversed in F2. That is, in F2, the sub-pixel including the pixel electrode 17*c* (positive polarity) becomes "bright", the sub-pixel including the pixel electrode 17*d* (positive polarity) becomes "dark", the sub-pixel including the pixel electrode 17C (negative polarity) becomes "bright", the sub-pixel including the pixel electrode 17D (negative polarity) becomes "dark", the sub-pixel including the pixel electrode 17*a* (negative polarity) becomes "bright", and the sub-pixel including the pixel electrode 17*b* (negative polarity) becomes "dark". In subsequent frames F3 and F4, the operation for F1 and F2 is carried out again.

As such, according to the present driving method, the Vcom has been applied to the pixel electrodes 17*a* and 17*b* from the data signal line 15*x* at the time point when the transistor 12*b* turns off. It follows that the electric potentials of the respective pixel electrodes 17*a* and 17*b* can be fixed (reset) to Vcom at the point when a regular signal electric potential is written into the pixel electrode 17*a*. This makes it possible to reliably discharge electric charge stored in a capacitor-coupled electrode (pixel electrode 17*b*), and to prevent a deterioration in display quality.

In the present driving method, the reset operation is carried out in a horizontal scanning period that is one (1) horizontal scanning period (1H) before a horizontal scanning period in which regular writing is carried out. However, the timing for the reset operation is not particularly limited. This operation can also be carried out in a horizontal scanning period that is 2H or more before the horizontal scanning period in which the regular writing is carried out. Further, the number of the reset operations to be carried out is not limited to one (1), and therefore can be two or more.

Figure 52:
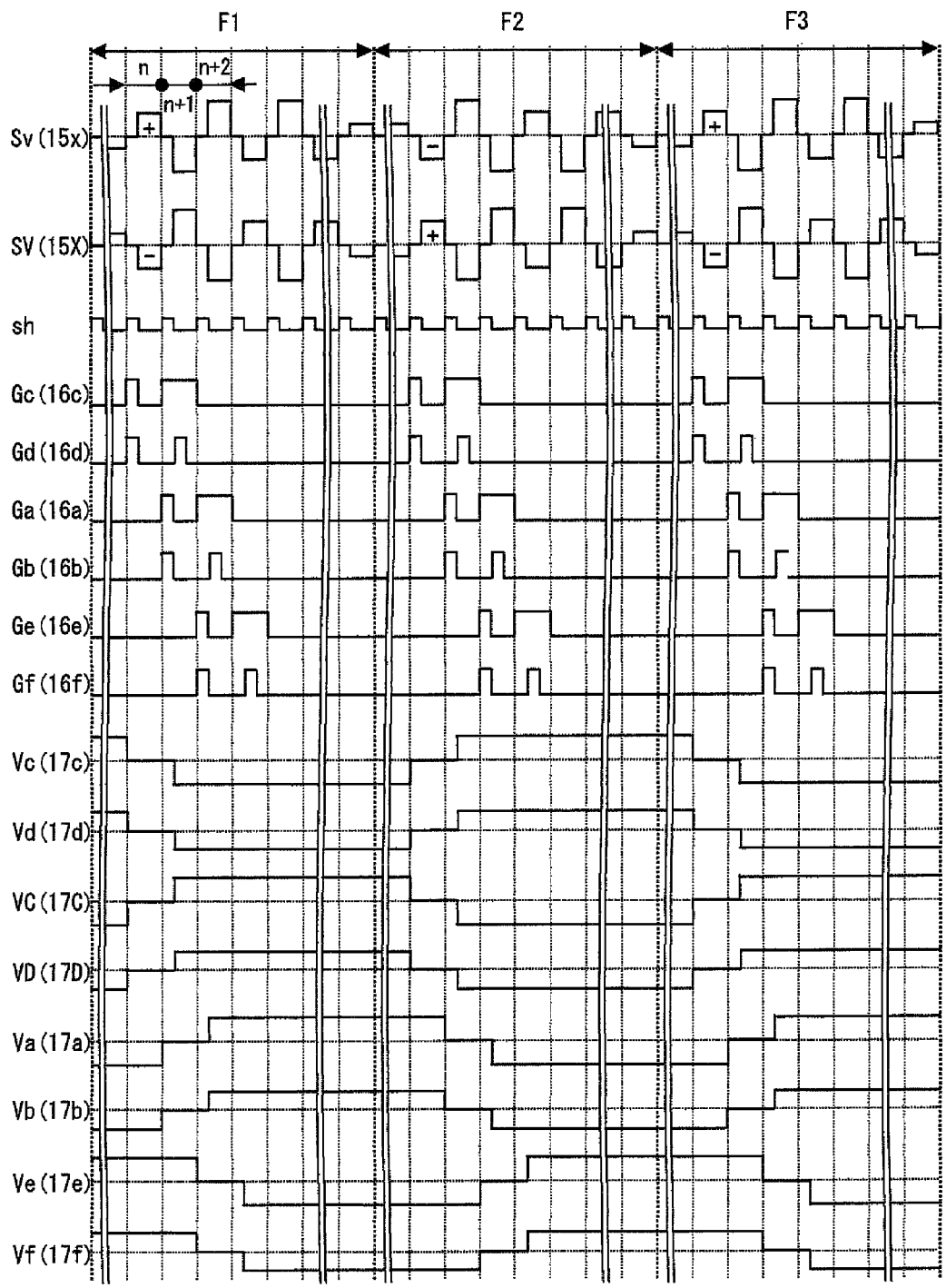
FIG. 52 is a timing chart showing another driving method other than that shown in FIG. 16.

A driving method shown in FIG. 52 can be employed instead of the driving method shown in FIG. 16. According to the driving method shown in FIG. 52, the second gate on-pulse signals (Gd, Gb, and Gf) are set to have a high-level (H level) for only a predetermined time period in a horizontal scanning period during which regular writing is carried out. Specifically, in FIG. 52, the second gate on-pulse signals rise in sync with timing at which respective charge sharing signals (sh) become low-levels (L level), and maintain their high-levels for only a predetermined time period, and then fall before the respective first gate on-pulse signals (Ge, Ga, and Ge) fall. According to the driving method shown in FIG. 52, regular signal electric potentials, which are to be written into the respective pixel electrodes (17*c*, 17*a*, and 17*e*), are written into the respective pixel electrodes (17*d*, 17*b*, and 17*f*) for only a predetermined time period in a horizontal scanning period during which regular writing is carried out. Note that the pixel electrodes (17*d*, 17*b*, and 17*f*) are capacitor-coupled with the respective pixel electrodes (17*c*, 17*a*, and 17*e*) to which regular writing is carried out. This brings about an effect of adjusting (improving) brightness during, in particular, a white display. According to the driving method shown in FIG. 52, the high-level period of the second gate on-pulse signal can be adjusted, and therefore it is possible to independently adjust brightness of each of the pixel electrodes (17*d*, 17*b*, and 17*f*; capacitor-coupled electrodes) coupled with the respective pixel electrodes (17*c*, 17*a*, and 17*e*) connected to the data signal line via the respective transistors. This allows the liquid crystal display device to have arbitrary display brightness. Note that the high-level period of the second gate on-pulse signals is not limited to the example shown in FIG. 52, provided that the high-level period of the second gate on-pulse signals is set, at least in a low-level period of the charge sharing signal, so as to be shorter than a time period during which the regular signal electric potentials are written into the respective pixel electrodes (17*c*, 17*a*, and 17*e*).

(Circuit Configuration-2 of Gate Driver)

Figure 17:
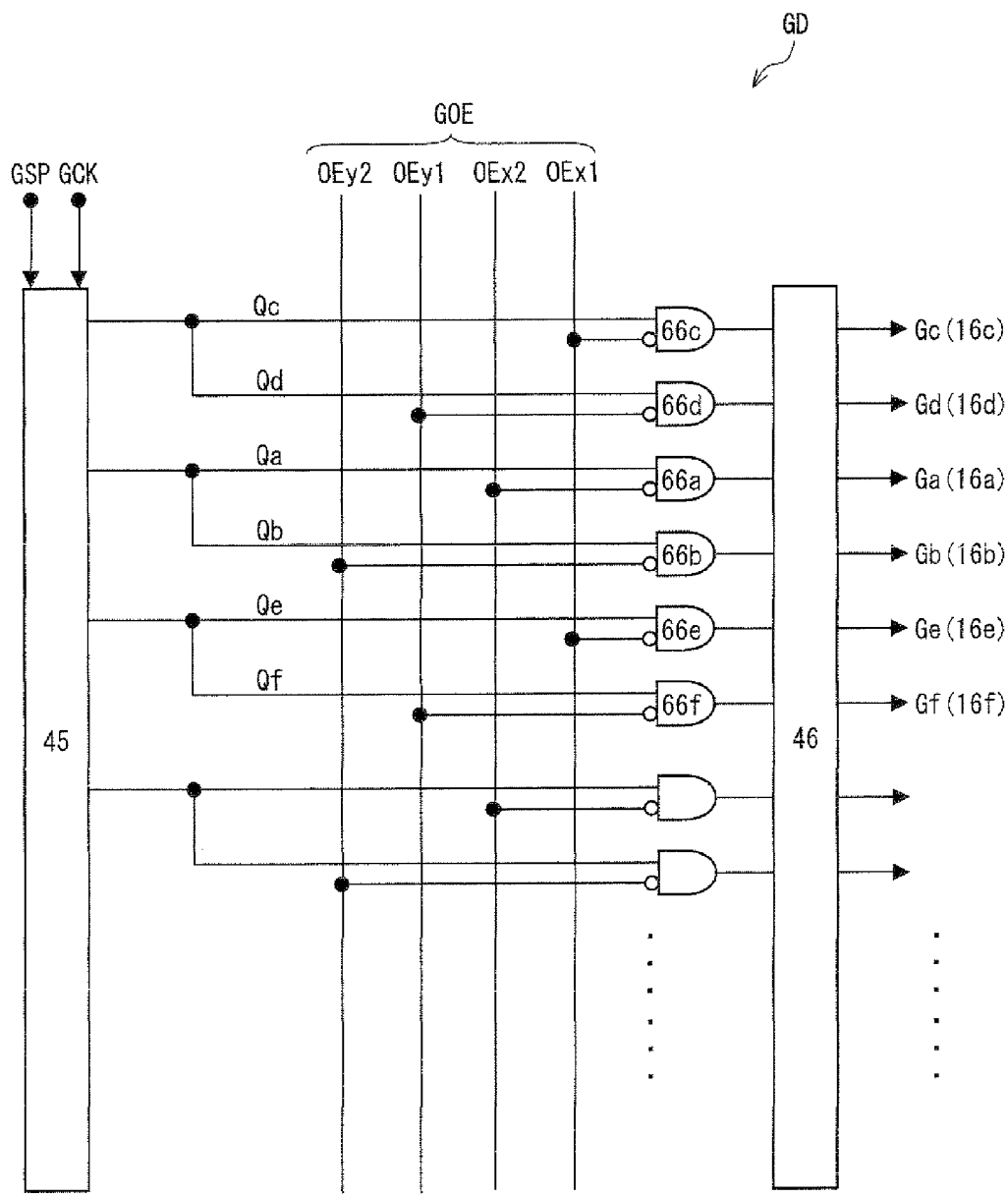
FIG. 17 is a circuit diagram illustrating another configuration of a gate driver that drives a liquid crystal panel 5a, 5b, or 5c.

FIG. 17 is a circuit diagram illustrating a circuit configuration of a gate driver included in the present liquid crystal display device, which gate driver realizes the driving method shown in FIG. 16. As illustrated in FIG. 17, a gate driver GD includes a shift register 45, a plurality of AND circuits (66a to 66f) provided in a column direction, and an output circuit 46. The shift register 45 is supplied with a gate start pulse signal GSP and a gate clock signal GCK. An output signal of each of constituent circuits, which are connected in series and constitute the shift register 45, is made up from two signals. One of the two signals is supplied to a corresponding odd-numbered AND circuit and the other of the two signals is supplied to a corresponding even-numbered AND circuit that is adjacent to the odd-numbered AND circuit. A gate driver output control signal GOE is made up of four signals (OEx1, OEx2, OEy1, and OEy2). Inverted signals of the signals OEx1 and OEx2 are one by one alternately supplied to the odd-numbered AND circuits in order, and inverted signals of the signals OEy1 and OEy2 are one by one alternately supplied to the even-numbered AND circuits in order. Further, an output signal of each of the AND circuits becomes a gate on-pulse signal via the output circuit 46, and this gate on-pulse signal is supplied to a corresponding scanning signal line.

For example, an output signal of a corresponding one of the constituent circuits in the shift register 45 is made up of two signals. One of the two signals is supplied, as a signal (Qc), to the AND circuit 66c and the other of the two signals is supplied, as a signal (Qd), to the AND circuit 66d. Further, the AND circuit 66c is supplied with the inverted signal of the signal OEx1, and the AND circuit 66d is supplied with the inverted signal of the signal OEy1. The output circuit 46 generates a gate on-pulse signal Gc in accordance with an output signal of the AND circuit 66c, and this gate on-pulse signal Gc is supplied to the scanning signal line 16c. The output circuit 46 generates a gate on-pulse signal Gd in accordance with an output signal of the AND circuit 66d, and this gate on-pulse signal Gd is supplied to the scanning signal line 16d.

Similarly, an output signal of a corresponding another one of the constituent circuits in the shift register 45 is made up of two signals. One of the two signals is supplied, as a signal (Qa), to the AND circuit 66a and the other of the two signals is supplied, as a signal (Qb), to the AND circuit 66b. Further, the AND circuit 66a is supplied with the inverted signal of the signal OEx2, and the AND circuit 66b is supplied with the inverted signal of the signal OEy2. The output circuit 46 generates a gate on-pulse signal Ga in accordance with an output signal of the AND circuit 66a, and this gate on-pulse signal Ga is supplied to the scanning signal line 16a. The output circuit 46 generates a gate on-pulse signal Gb in accordance with an output signal of the AND circuit 66b, and this gate on-pulse signal Gb is supplied to the scanning signal line 16b.

Figure 18:
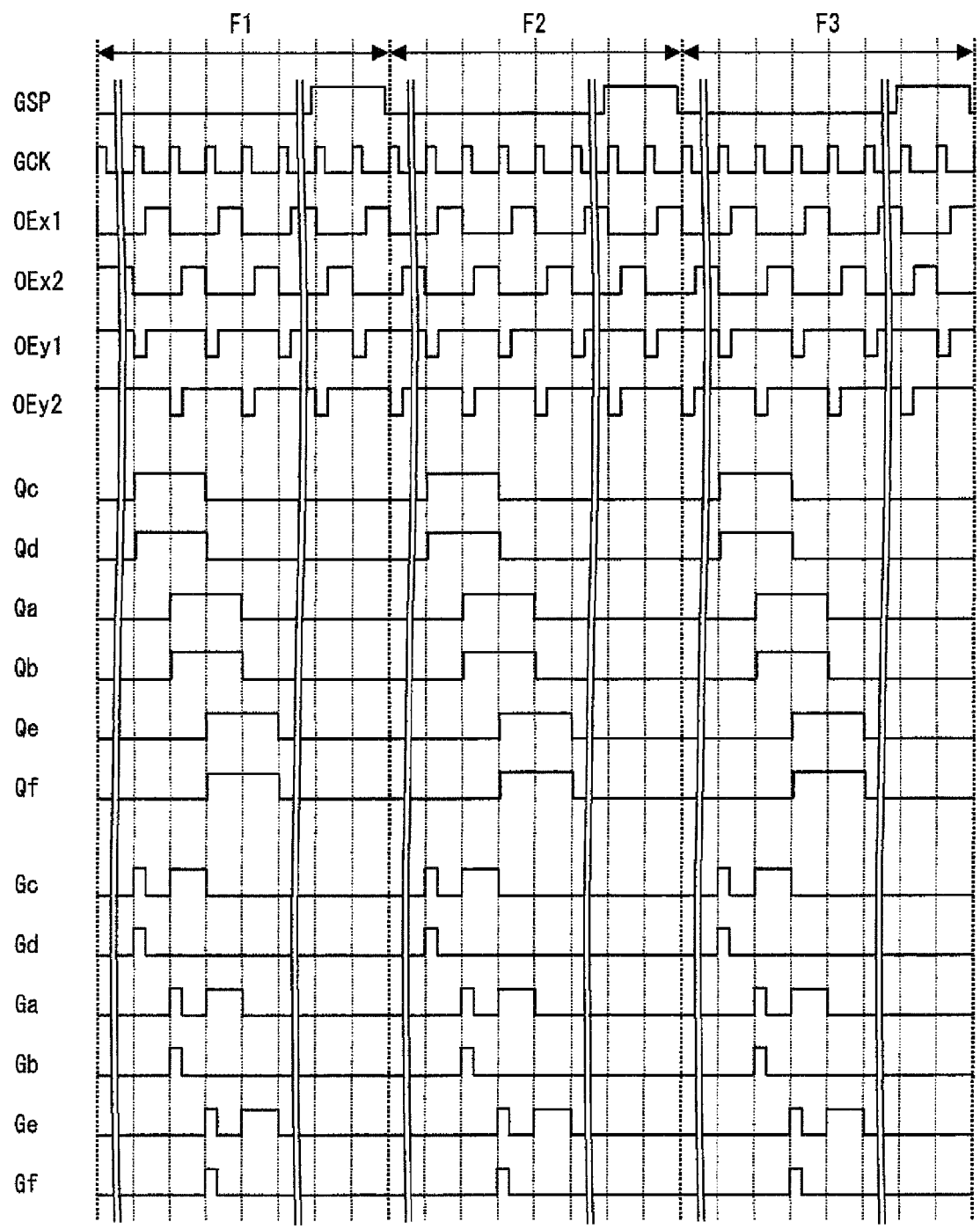
FIG. 18 is a timing chart showing a method for driving a gate driver shown in FIG. 17.

FIG. 18 is a timing chart illustrating how the gate driver illustrated in FIG. 17 operates. As illustrated in FIG. 18, for example, each of the signals OEx1 and OEx2 has a cycle of two horizontal scanning periods (2H). Each of the signals OEx1 and OEx2 is "L" in one half (1H) of the cycle (2H), is "L" until a predetermined period of time elapses from the beginning of the other half (1H) of the cycle (2H), and is "H" (active) in the rest of the other half (1H) of the cycle (2H). The signal OEx1 is shifted by 1H from the signal OEx2. Each of the signals OEy1 and OEy2 has a cycle of two horizontal scanning periods (2H). Each of the signals OEy1 and OEy2 is "L" until a predetermined period of time elapses from the beginning of the one half (1H) of the cycle (2H), is "H" (active) in the rest of the one half (1H), and is "H" in the other half (1H) of the cycle (2H). The signal OEy1 is shifted by 1H from the signal OEy2. Output signals Q, each of which maintains "H" for two horizontal scanning periods, are sequentially outputted from the respective constituent circuits of the shift register 45. Hence, the driving method shown in FIG. 16 is realized.

(Driving Method-3)

Figure 19:
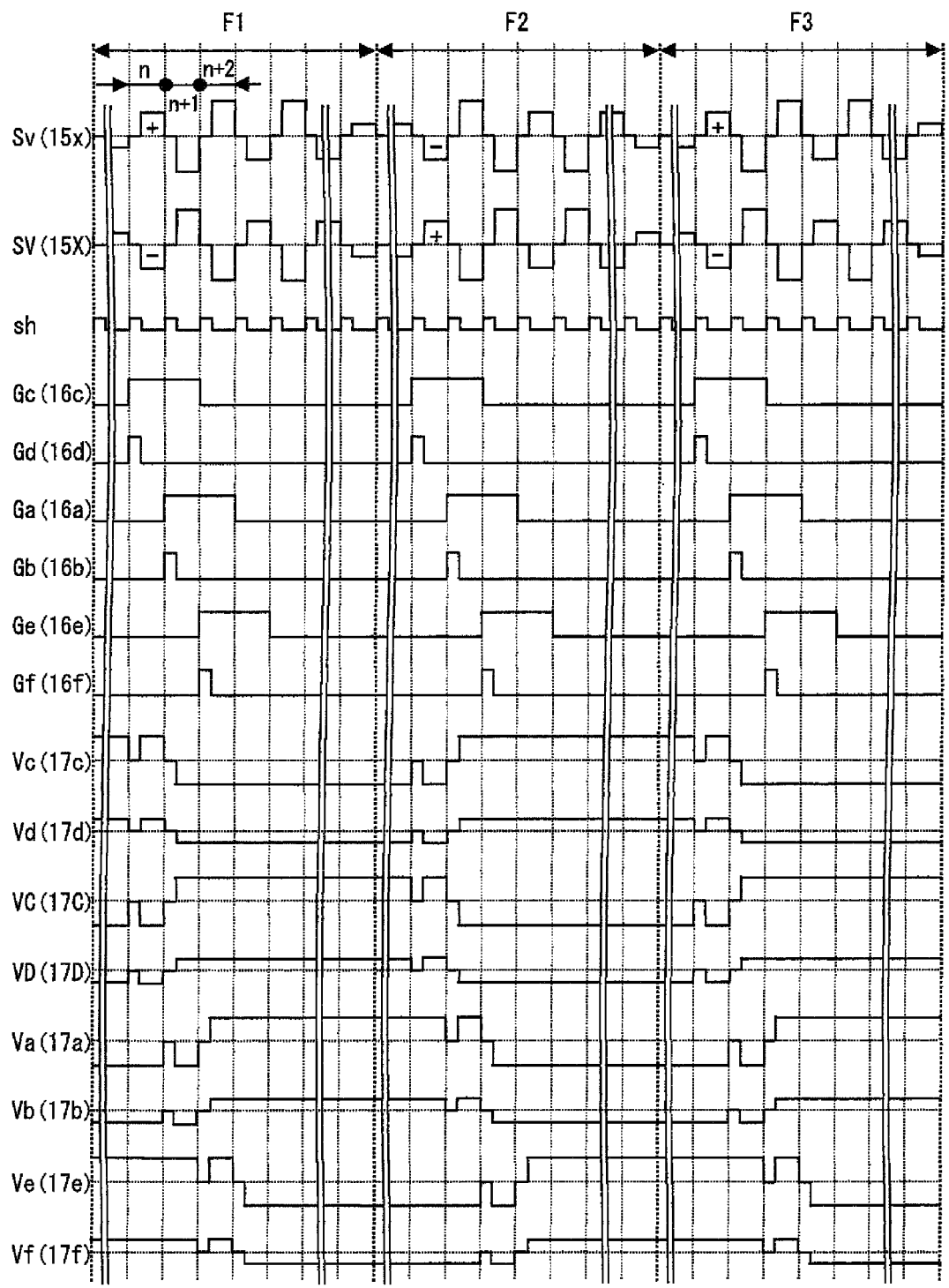
FIG. 19 is a timing chart showing another method for driving a liquid crystal display device including a liquid crystal panel 5a, 5b, or 5c.

FIG. 19 is a timing chart illustrating a further driving method of the present liquid crystal display device. In the above-described Driving Method-2, in a horizontal scanning period that is one (1) horizontal scanning period before a horizontal scanning period in which regular writing is carried out, the following operation is carried out: The pixel electrodes 17a and 17b are supplied with Vcom, and thereafter the transistors 12a and 12b are both turned off until regular writing is carried out on the pixel electrode 17a. On the other hand, according to the driving method shown in FIG. 19, the following operation is carried out in a horizontal scanning period that is one (1) horizontal scanning period before a horizontal scanning period in which regular writing is carried out. Specifically, the Vcom is applied to the pixel electrodes 17a and 17b, and then a signal electric potential is applied to the pixel electrode 17a by causing (i) only the transistor 12b to turn off and (ii) the transistor 12a to keep turning on. The following description specifically exemplifies and discusses the pixel 101. The description here mainly deals with differences from Driving Method-2, whereas omitting description of features in common with Driving Method-2.

The following description focuses on the pixel 101. In the pixel 101, the transistors 12a and 12b both turn on in a horizontal scanning period (n+1). Note that the horizontal scanning period (n+1) is one (1) horizontal scanning period before a horizontal scanning period (n+2) in which regular writing is carried out. In response to the turning on of the transistors 12a and 12b, the Vcom is applied to the pixel electrode 17a into which a regular signal electric potential is to be written and the pixel electrode 17b which is capacitor-coupled with the pixel electrode 17a. Further, while the Vcom is being applied, only the transistor 12b turns off. Consequently, in the (n+1)th horizontal scanning period, a signal electric potential of a negative polarity supplied to the data signal line 15x is applied, as a regular writing signal, to the pixel electrode 17c in the pixel 100, and the same signal electric potential is also applied to the pixel electrode 17a in the pixel 101. That is, at a timing 1H before the regular writing, a data signal (signal electric potential) for the pixel electrode 17c in the pixel 100 is written into the pixel electrode 17a. Because the transistor 12a stays on, in the next (n+2)th horizontal scanning period, Vcom is applied to the pixel electrode 17a until a predetermined period of time elapses from the beginning of this horizontal scanning period, and thereafter a signal electric potential of a positive polarity, serving as a regular writing signal, is applied to the pixel electrode 17a.

As such, in the present driving method, as well as in the above-described Driving Method-2, the Vcom has been applied to the pixel electrodes 17a and 17b from the data signal line 15x at the time point when the transistor 12b is turned off. It follows that the electric potentials of the respective pixel electrodes 17a and 17b can be fixed (reset) to Vcom at the point when a regular signal electric potential is written into the pixel electrode 17a. Therefore, even if a signal electric potential which is not the regular signal electric potential is applied to the pixel electrode 17a after the electric potentials of the pixel electrodes 17a and 17b are both set to the Vcom once, a sum of total capacitances of the pixel electrodes 17a and 17b does not change. This makes it possible to reliably discharge electric charge stored in a capacitor-coupled electrode (pixel electrode 17b), and to prevent impairment of display quality.

(Circuit Configuration-3 of Gate Driver)

Figure 20:
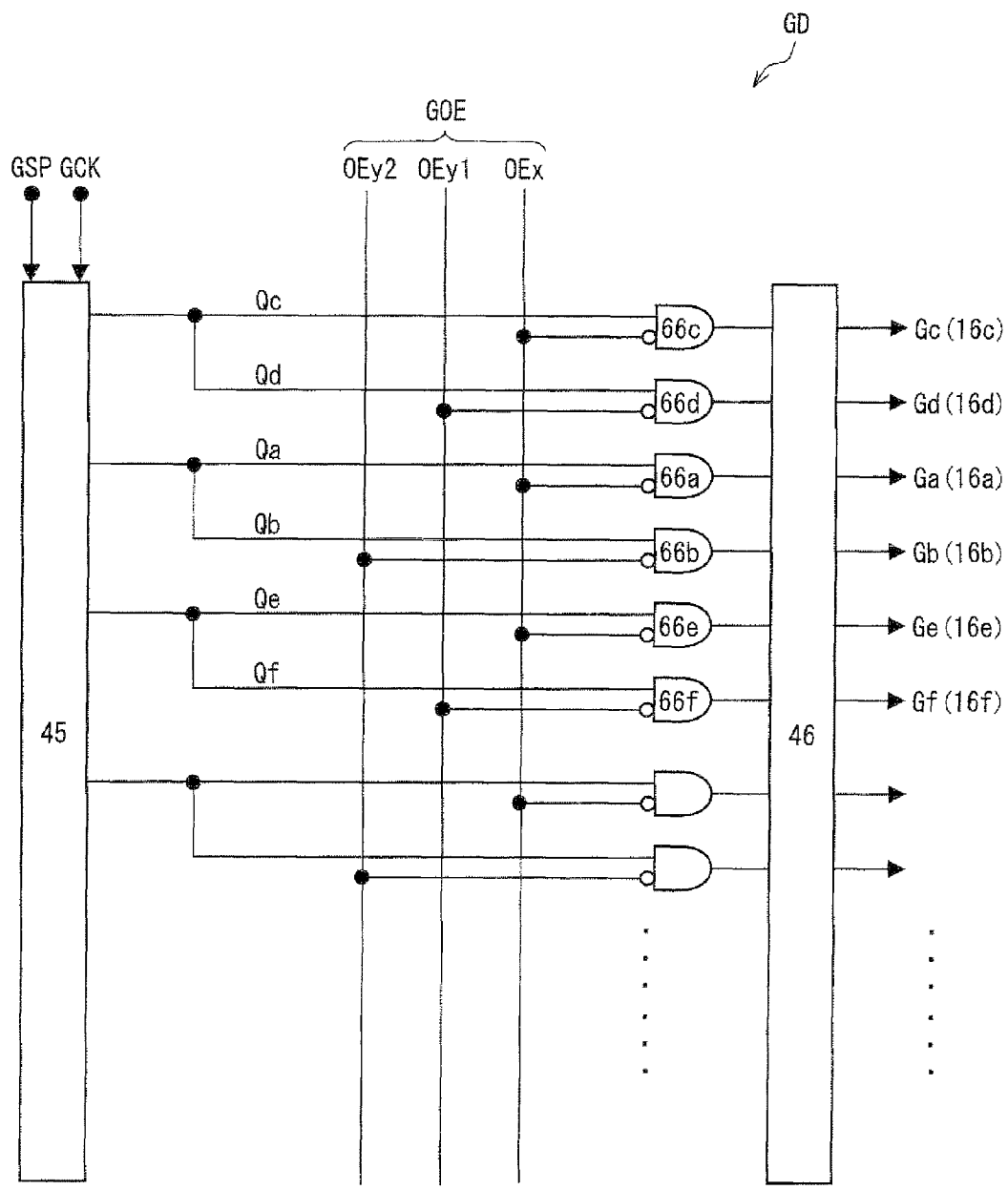
FIG. 20 is a circuit diagram illustrating another configuration of a gate driver that drives a liquid crystal panel 5a, 5b, or 5c.
Figure 21:
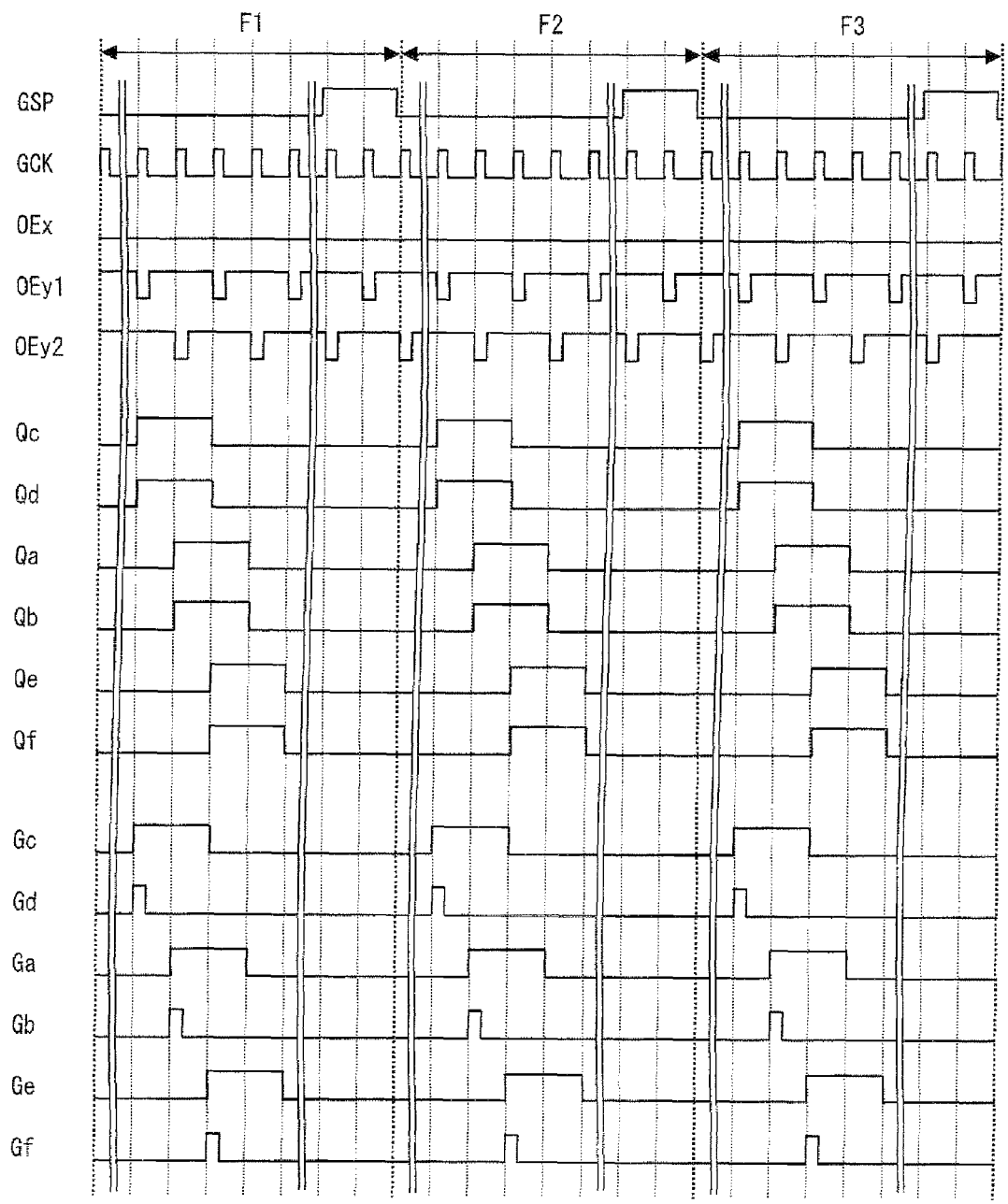
FIG. 21 is a timing chart showing a method for driving a gate driver shown in FIG. 20.

FIG. 20 is a circuit diagram illustrating a circuit configuration of a gate driver included in the present liquid crystal display device, which gate driver realizes the driving method shown in FIG. 21. As illustrated in FIG. 20, a gate driver GD includes a shift register 45, a plurality of AND circuits (66a to 66f) provided in a column direction, and an output circuit 46. The shift register 45 is supplied with a gate start pulse signal GSP and a gate clock signal GCK. An output signal of each of constituent circuits, which are connected in series and constitute the shift register 45, is made up of two signals. One of the two signals is supplied to a corresponding odd-numbered AND circuit, and the other of the two signals is supplied to a corresponding even-numbered AND circuit that is adjacent to the odd-numbered AND circuit. A gate driver output control signal GOE is made up of three signals (OEx, OEy1, and OEy2). An inverted signal of the signal OEx is supplied to the odd-numbered AND circuits, and inverted signals of the signals OEy1 and OEy2 are one by one alternately supplied to the even-numbered AND circuits in order. Further, an output signal of each of the AND circuits becomes a gate on-pulse signal via the output circuit 46, and this gate on-pulse signal is supplied to a corresponding scanning signal line.

For example, an output signal of a corresponding one of the constituent circuits in the shift register 45 is made up of two signals. One of the two signals is supplied, as a signal (Qc), to the AND circuit 66c and the other of the two signals is supplied, as a signal (Qd), to the AND circuit 66d. Further, the AND circuit 66c is supplied with the inverted signal of the signal OEx, and the AND circuit 66d is supplied with the inverted signal of the signal OEy1. The output circuit 46 generates a gate on-pulse signal Gc in accordance with an output signal of the AND circuit 66c, and this gate on-pulse signal Gc is supplied to the scanning signal line 16c. The output circuit 46 generates a gate on-pulse signal Gd in accordance with an output signal of the AND circuit 66d, and this gate on-pulse signal Gd is supplied to the scanning signal line 16d.

Similarly, an output signal of a corresponding another one of the constituent circuits in the shift register 45 is made up of two signals. One of the two signals is supplied, as a signal (Qa), to the AND circuit 66a and the other of the two signals is supplied, as a signal (Qb), to the AND circuit 66b. Further, the AND circuit 66a is supplied with the inverted signal of the signal OEx, and the AND circuit 66b is supplied with the inverted signal of the signal OEy2. The output circuit 46 generates a gate on-pulse signal Ga in accordance with an output signal of the AND circuit 66a, and this gate on-pulse signal Ga is supplied to the scanning signal line 16a. The output circuit 46 generates a gate on-pulse signal Gb in accordance with an output of the AND circuit 66b, and this gate on-pulse signal Gb is supplied to the scanning signal line 16b.

FIG. 21 is a timing chart illustrating how the gate driver illustrated in FIG. 20 operates. As illustrated in FIG. 21, for example, the signal OEx is always "L" in all frames. Note that the signal OEx may not be always "L". For example, in a case where a falling edge of a waveform of a gate on-pulse does not change sharply and the falling edge is kept in a subsequent horizontal scanning period, the signal OEx can be "L" at latest at the end of each horizontal scanning period. Each of the signals OEy1 and OEy2 has a cycle of two horizontal scanning periods (2H). Each of the signals OEy1 and OEy2 is "L" until a predetermined period of time elapses from the beginning of one half (1H) of the cycle (2H), is "H" (active) in the rest of the one half (1H), and is "H" (active) in the other half (1H) of the cycle (2H). The signal OEy1 is shifted by 1H from the signal OEy2. Output signals Q, each of which maintains "H" for two horizontal scanning periods, are sequentially outputted from the respective constituent circuits of the shift register 45. Hence, the driving method shown in FIG. 19 is realized.

(Driving Method-4)

Figure 22:
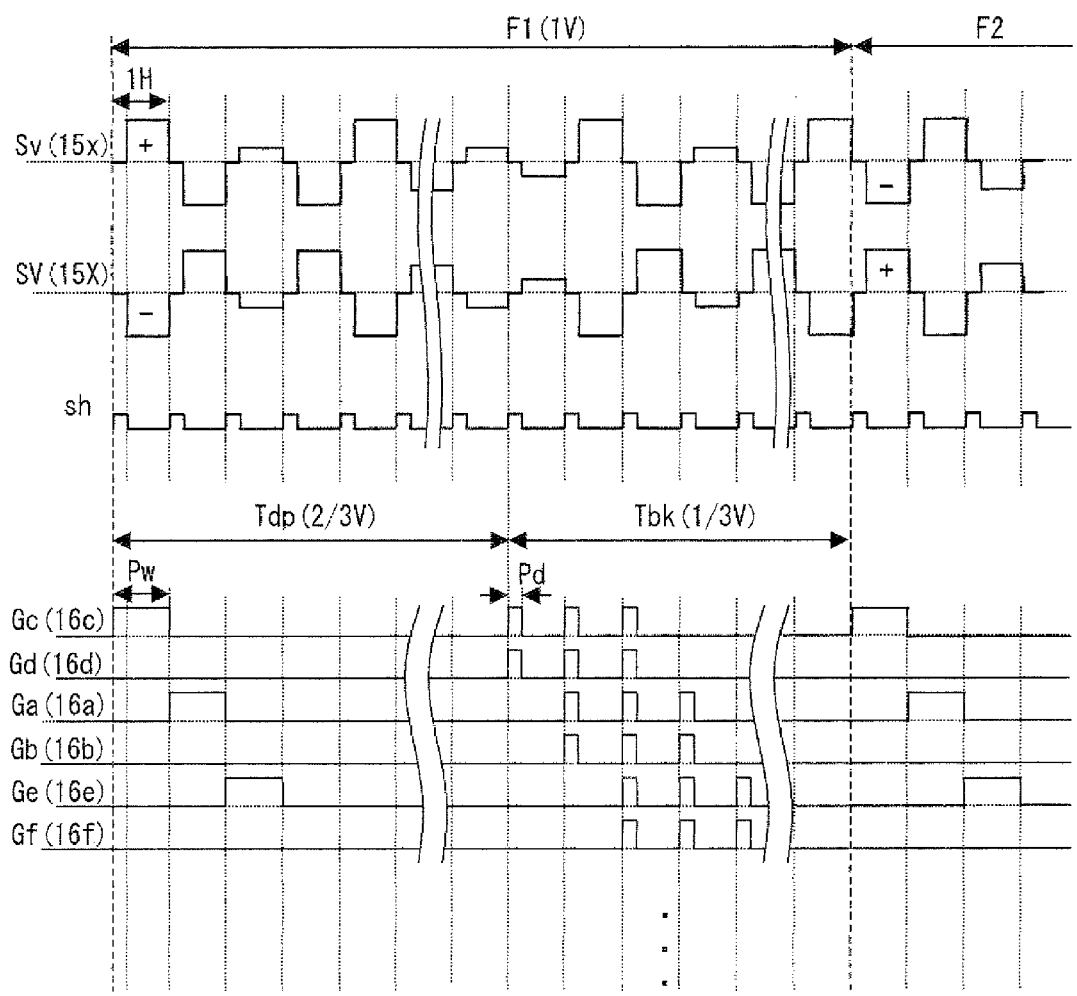
FIG. 22 is a timing chart showing another method for driving a liquid crystal display device including a liquid crystal panel 5a, 5b, or 5c.

FIG. 22 is a timing chart illustrating still a further driving method of the present liquid crystal display device. The same reference signs as those in FIG. 13 are used in FIG. 22. Further, also in this driving method, as shown in FIG. 13, (i) a polarity of a signal electric potential applied to a data signal line is reversed for each horizontal scanning period (1H), (ii) polarities of respective signal electric potentials to be applied during corresponding horizontal scanning periods in frames are reversed for each frame, (iii) signal electric potentials having respective reverse polarities are applied to any two adjacent data signal lines during a single horizontal scanning period, and (iv) charge sharing is carried out at the beginning of each of the horizontal scanning periods.

The following description schematically discusses the present driving method. Namely, after a predetermined time period (e.g., a time period corresponding to approximately two-thirds ($2/3$V) of one (1) vertical scanning period (1V)) has elapsed since a regular signal electric potential is written into pixel electrodes (the pixel electrodes 17a, 17c, 17e, 17A, 17C, and 17E in FIG. 1), a signal electric potential (Vcom) for discharging (refreshing) of electric charge is applied to the pixel electrodes (17a, 17c, 17e, 17A, 17C, and 17E) and their respective capacitor-coupled electrodes (the pixel electrodes 17b, 17d, 17f, 17B, 17D, and 17F in FIG. 1) that are capacitor-coupled with the respective pixel electrodes (17a, 17c, 17e, 17A, 17C, and 17E). This makes it possible to insert a black display period to each display line. This brings about (i) an effect of discharging electric charge stored in a capacitor-coupled electrode and (ii) an effect of reducing the possibility of occurrence of tailing image-sticking caused when a display is made to be impulse type.

Specifically, in a $2/3$V period of F1, one of two scanning signal lines, which extend over and under a corresponding one (1) of pixels arranged in the column direction, is selected successively (e.g., the scanning signal line 16c→the scanning signal line 16a→the scanning signal line 16e (see FIG. 1)). One (e.g., the data signal line 15x) of two adjacent data signal lines is supplied with (i) a signal electric potential having a positive polarity during a first horizontal scanning period (e.g., including a writing period for the pixel electrodes 17c and 17d), (ii) a signal electric potential having a negative polarity during a second horizontal scanning period (e.g., including a writing period for the pixel electrodes 17a and 17b), and (iii) a signal electric potential having a positive polarity during a third horizontal scanning period (e.g., including a writing period for the pixel electrodes 17e and 17f). The other (e.g., the data signal line 15X) of the two data signal lines is supplied with (i) a signal electric potential having a negative polarity during the first horizontal scanning period (e.g., including a writing period for the pixel electrodes 17C and 17D), (ii) a signal electric potential having a positive polarity during the second horizontal scanning period (e.g., including a writing period for the pixel electrodes 17A and 17B), and (iii) a signal electric potential having a negative polarity during the third horizontal scanning period (e.g., including a writing period for the pixel electrodes 17E and 17F). Note that a charge sharing electric potential (Vcom) is applied at the beginning of each of horizontal scanning periods.

In the rest of F1, i.e., a $1/3$V period, at the beginning of each horizontal scanning period, two scanning signal lines, which extend over and under a corresponding one (1) of pixels arranged in the column direction, are selected at a time successively (e.g., the scanning signal lines 16c and 16d→the scanning signal lines 16a and 16b→the scanning signal lines 16e and 16f (see FIG. 1)). The corresponding data signal lines (e.g., the data signal lines 15x and 15X) are supplied with Vcom.

The following description focuses on the pixel 101. In the pixel electrode 17a, for example, the following operations are carried out. Specifically, while the transistor 12a is turning on in response to a pixel data writing pulse Pw included in the gate on-pulse signal Ga, an electric potential of the data signal line 15x connected to a source terminal of the transistor 12a is applied to the pixel electrode 17a via the transistor 12a. Thus, a data signal Sv serving as a voltage of the data signal line 15x is written into the pixel electrode 17a. Then, after an image display period Tdp elapses, a black voltage application pulse Pb is applied to gate terminals of the respective transistors 12a and 12b. Consequently, while the transistors 12a and 12b are turning on, (i) the pixel electrode 17a is connected to the data signal line 15x via the transistor 12a and (ii) the pixel electrode 17b is connected to the data signal line 15x via the transistor 12b. This causes (i) electric charge stored in a pixel capacitor of the pixel electrode 17b to be discharged and (ii) a black voltage (Vcom) to be applied to the pixel capacitors of the respective pixel electrodes 17a and 17b.

Thus, during the image display period Tdp, the pixel 101 carries out display in accordance with a digital image signal, by causing the pixel capacitors to hold a voltage corresponding to the electric potential of the data signal line 15x, which electric potential is applied to the pixel electrode 17a via the transistor 12a. On the other hand, the pixel 101 displays black, by causing the pixel capacitors to hold the black voltage (Vcom) during a period Tbk (a subtraction of the image display period Tdp from one (1) frame (1V) period from) between (i) appearance of the black voltage application pulses Pb in the gate on-pulse signals Ga and Gb which are supplied to the respective gate terminals of the transistors 12a and 12b and (ii) appearance of a next pixel data writing pulse Pw in the gate on-pulse signal Ga. Consequently, a black pixel is formed.

The black voltage application pulse Pb has a narrow width. Therefore, in order for each pixel capacitor to surely hold the black voltage as the holding voltage, the black voltage application pulse Pb is applied to the scanning signal line in at least consecutive two, preferably three or more horizontal scanning periods (i.e., at least consecutive 2H, preferably 3H or more) in each frame period. In FIG. 22, the black voltage application pulse Pb appears in consecutive three horizontal scanning periods in one (1) frame period (1V).

According to the present driving method, a black display period is inserted in each display line. This causes a display to be impulse type, while (i) preventing circuit configuration such as the driving circuit from becoming complicated and (ii) avoiding an increase in operating frequency. This provides additional effects of such as reducing the possibility of occurrence of tailing image-sticking in a moving image and improving moving-image display quality, in addition to the effects given by discharge of electric charge.

The description of each of the driving methods has dealt with the example where a liquid crystal panel is configured to have two pixel electrodes (e.g., the pixel electrodes 17a and 17b) in one (1) pixel (e.g., the pixel 101). However, each of the driving methods is also applicable to a case where three pixel electrodes are provided in one (1) pixel. For example, in the liquid crystal panel illustrated in FIG. 6, the pixel electrode 17a' is electrically connected to the pixel electrode 17a, and therefore an electric potential fluctuation of the pixel electrode 17a' is identical to that of the pixel electrode 17a. Hence, it is possible to employ the above-described driving methods regardless of the number of pixel electrodes provided in one (1) pixel.

Further, although each of the driving methods employs the charge sharing method, the present embodiment is not limited to this. Instead, for example, the following driving method can be employed: A period is secured in which all transistors turn on in one (1) frame period; and the Vcom is supplied to all data signal lines during such a period.

A specific circuit configuration of a source driver for realizing the charge sharing method employed by the present driving methods will be described later, together with configurations of a "liquid crystal display unit and liquid crystal display device".

Embodiment 2

Figure 23:
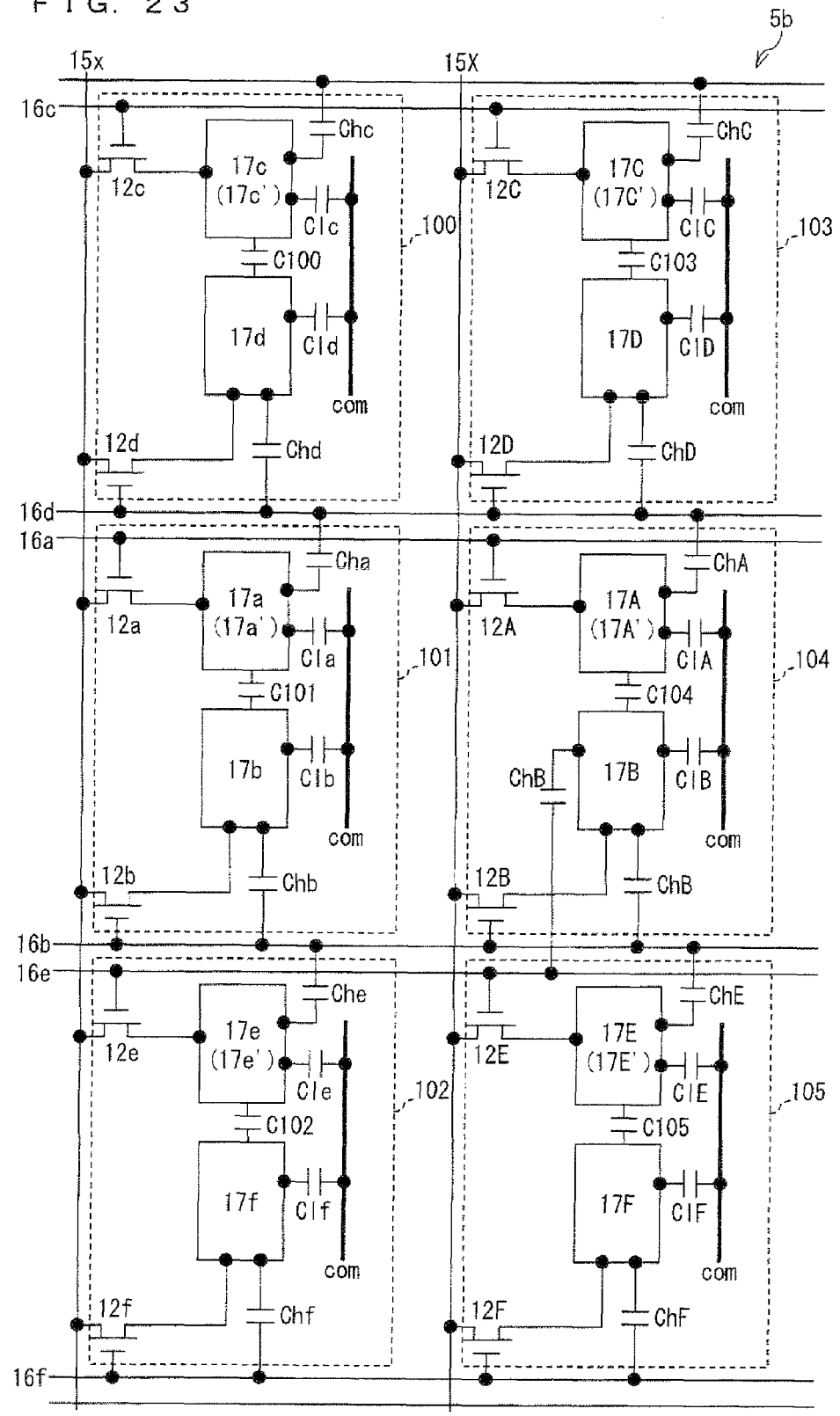
FIG. 23 is a circuit diagram illustrating a configuration of a liquid crystal panel 5b.

FIG. 23 is an equivalent circuit diagram illustrating part of a liquid crystal panel of Embodiment 2. As illustrated in FIG. 23, a liquid crystal panel 5b includes: data signal lines (15x and 15X) that extend in a column direction (vertical direction in FIG. 23); scanning signal lines (16a to 16f) that extend in a row direction (horizontal direction in FIG. 23); pixels (100 to 105) that are provided in the row and column directions; and a common electrode (counter electrode) com. The liquid crystal panel 5b includes pixels configured in an identical manner. Note that a pixel array including the pixels 100 through 102 is adjacent to a pixel array including the pixels 103 through 105. Since the liquid crystal panel 5b is of a Cs on-gate configuration, it has an advantage of not needing to provide the storage capacitor wires (18x through 18z), unlike the liquid crystal panel 5a shown in FIG. 1.

In the liquid crystal panel 5b, one (1) data signal line and two scanning signal lines are provided for each one (1) pixel. Two pixel electrodes 17c and 17d are provided in the pixel 100, two pixel electrodes 17a and 17b are provided in the pixel 101, and two pixel electrodes 17e and 17f are provided in the pixel 102. The pixel electrodes 17c, 17d, 17a, 17b, 17e, and 17f are provided in the column direction. Two pixel electrodes 17C and 17D are provided in the pixel 103, two pixel electrodes 17A and 17B are provided in the pixel 104, and two pixel electrodes 17E and 17F are provided in the pixel 105. The pixel electrodes 17C, 17D, 17A, 17B, 17E, and 17F are provided in the column direction. In the row direction, the pixel electrodes 17c, 17d, 17a, 17b, 17e, and 17f are provided adjacent to the pixel electrodes 17C, 17D, 17A, 17B, 17E, and 17F, respectively.

Since these pixels are configured in an identical manner, the following description mainly exemplifies and discusses the pixel 101.

Figure 24:
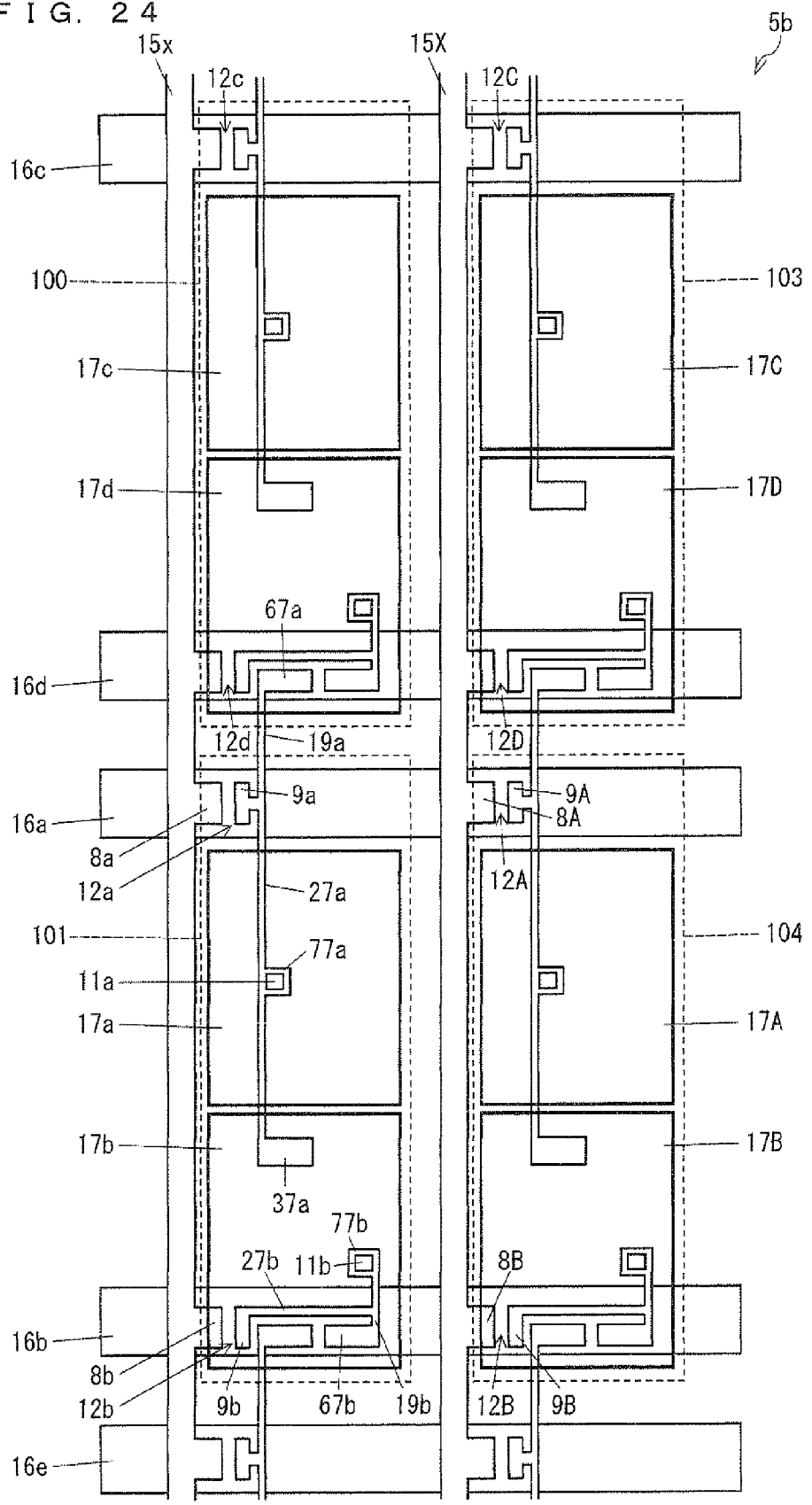
FIG. 24 is a plan view illustrating a configuration (in a concrete example 2-1) of a liquid crystal panel 5b.

According to the pixel 101, the pixel electrodes 17a and 17b are coupled with each other via a coupling capacitor C101. The pixel electrode 17a is connected to the data signal line 15x via a transistor 12a connected to the scanning signal line 16a. The pixel electrode 17b is connected to the data signal line 15x via a transistor 12b connected to the scanning signal line 16b. A storage capacitor Cha is formed between the pixel electrode 17a and the scanning signal line 16d. A storage capacitor Chb is formed between the pixel electrode 17b and the scanning signal line 16b. A liquid crystal capacitor Cla is formed between the pixel electrode 17a and the common electrode com. A liquid crystal capacitor Clb is formed between the pixel electrode 17b and the common electrode com Concrete Example 2-1 of Liquid Crystal Panel FIG. 24 illustrates a concrete example 2-1 of a liquid crystal panel 5b. In the liquid crystal panel 5b of FIG. 24, a data signal line 15x is provided so as to extend along a pixel 100 and, a pixel 101, and a data signal line 15X is provided so as to extend along a pixel 103 and a pixel 104.

Here, a scanning signal line 16c is provided so that the scanning signal line 16c and one of two edge parts of the pixel 100 overlap each other, which two edge parts extend in the row direction, and a scanning signal line 16d is provided so that the scanning signal line 16d and the other of the two edge parts of the pixel 100 overlap each other. Pixel electrodes 17c and 17d are juxtaposed in the column direction between the scanning signal lines 16c and 16d when they are viewed from above. The scanning signal line 16c is provided so that the scanning signal line 16c and one of two edge parts of the pixel 103 overlap each other, which two edge parts extend in the row direction, and the scanning signal line 16d is provided so that the scanning signal line 16d and the other of the two edge parts of the pixel 103 overlap each other. Pixel electrodes 17C and 17D are juxtaposed in the column direction between the scanning signal lines 16c and 16d when they are viewed from above.

Further, a scanning signal line 16a is provided so that the scanning signal line 16a and one of two edge parts of the pixel 101 overlap each other, which two edge parts extend in the row direction, and a scanning signal line 16b is provided so that the scanning signal line 16b and the other of the two edge parts of the pixel 101 overlap each other. Pixel electrodes 17a and 17b are juxtaposed in the column direction between the scanning signal lines 16a and 16b when they are viewed from above. The scanning signal line 16a is provided so that the scanning signal line 16a and one of two edge parts of the pixel 104 overlap each other, which two edge parts extend in the row direction, and the scanning signal line 16b is provided so that the scanning signal line 16b and the other of the two edge parts of the pixel 104 overlap each other. Pixel electrodes 17A and 17B are juxtaposed in the column direction between the scanning signal lines 16a and 16b when they are viewed, from above.

In the pixel 101, a transistor 12a has a source electrode 8a and a drain electrode 9a which are provided above the scanning signal line 16a. Further, a transistor 12b has a source electrode 8b and a drain electrode 9b which are provided above the scanning signal line 16b. The source electrode 8a is connected to the data signal line 15x. The drain electrode 9a is connected to a wire 27a for drawing out a drain. The wire 27a is connected to a contact electrode 77a and a capacitor-coupling electrode 37a. The contact electrode 77a is connected to the pixel electrode 17a via a contact hole 11a. The capacitor-coupling electrode 37a and the pixel electrode 17b overlap each other via an interlayer insulating film. With the configuration, a coupling capacitor C101 (see FIG. 23) is formed between the pixel electrodes 17a and 17b. Moreover, the drain electrode 9a electrically connected to the pixel electrode 17a is connected to a storage capacitor electrode 67a via a wire 19a for drawing out a drain, and the storage capacitor electrode 67a and a scanning signal line 16d which is adjacent to the scanning signal line 16a overlap each other via a gate insulating film. With the configuration, a storage capacitor Cha (see FIG. 23) is formed.

Furthermore, the source electrode 8b of the transistor 12b is connected to the data signal line 15x. The drain electrode 9b is connected to a wire 27b for drawing out a drain. The wire 27b is connected to a contact electrode 77b. The contact electrode 77b is connected to the pixel electrode 17b via a contact hole 11b. Moreover, the drain electrode 9b, which is electrically connected to the pixel electrode 17b, is connected to a storage capacitor electrode 67b via a wire 19b for drawing out a drain, and the storage capacitor electrode 67b and the scanning signal line 16b overlap each other via a gate insulating film. This causes a storage capacitor Chb (see FIG. 23) to be formed. Note that a configuration (shapes and arrangements of respective members and their connecting relations) of each of the other pixels is identical to that of the pixel 101.

With the configuration of the present concrete example, a sub-pixel including the pixel electrode 17a becomes "bright", and a sub-pixel including the pixel electrode 17b becomes "dark".

Figure 25:
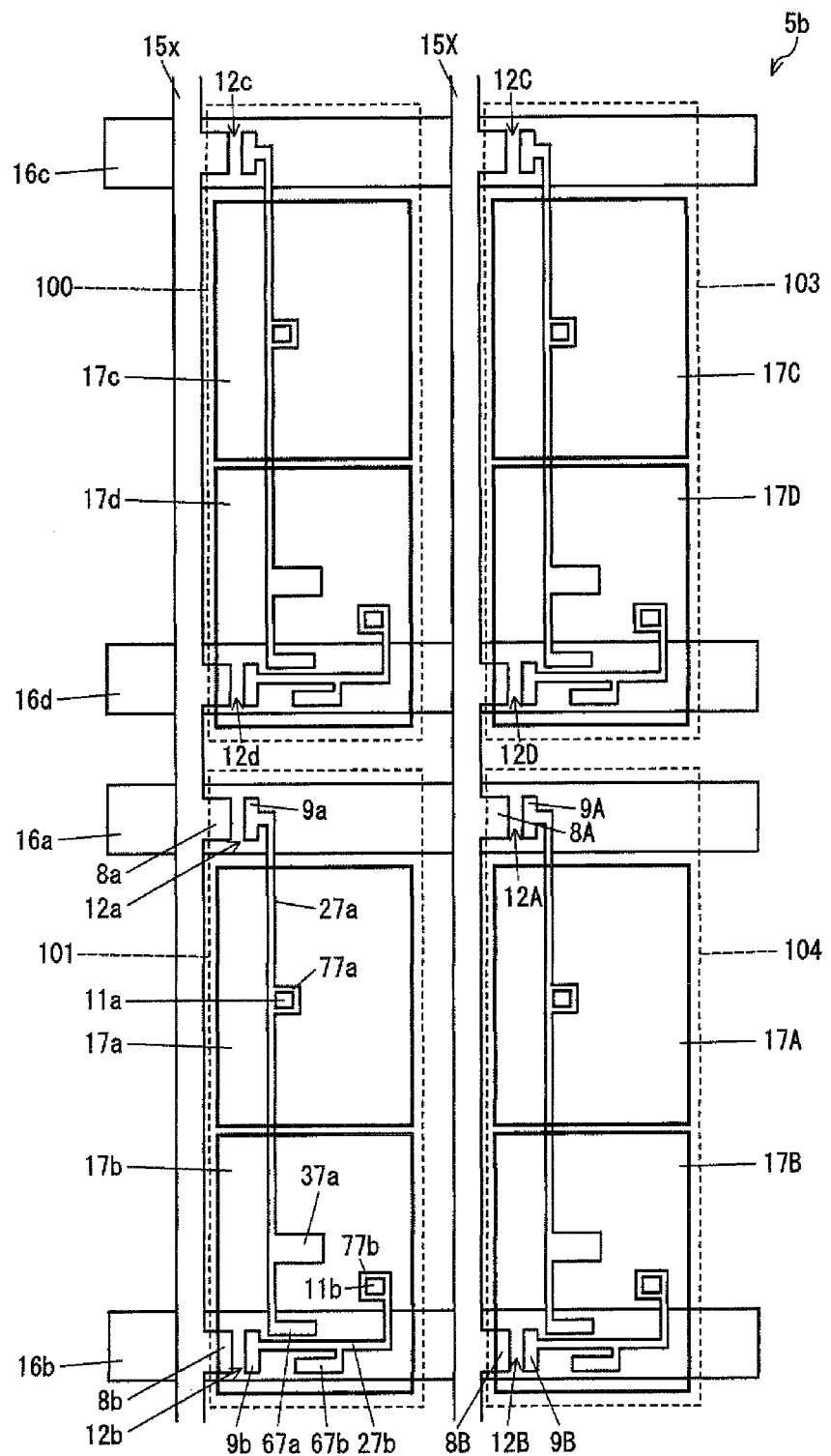
FIG. 25 is a plan view illustrating another configuration of a liquid crystal panel 5b.

Note that the storage capacitors Cha and Chb can be formed as shown in FIG. 25. That is, as shown in FIG. 25, the drain electrode 9a is connected to a storage capacitor electrode 67a via a wire 27a for drawing out a drain, and the storage capacitor electrode 67a and the scanning signal line 16b overlap each other via the gate insulating film. This causes the storage capacitor Cha to be formed. Moreover, the drain electrode 9b is connected to the storage capacitor electrode 67b via a wire 27b for drawing out a drain, and the storage capacitor electrode 67b and the scanning signal line 16b overlap each other via a gate insulating film. This causes the storage capacitor Chb to be formed.

Concrete Example 2-2 of Liquid Crystal Panel

Figure 26:
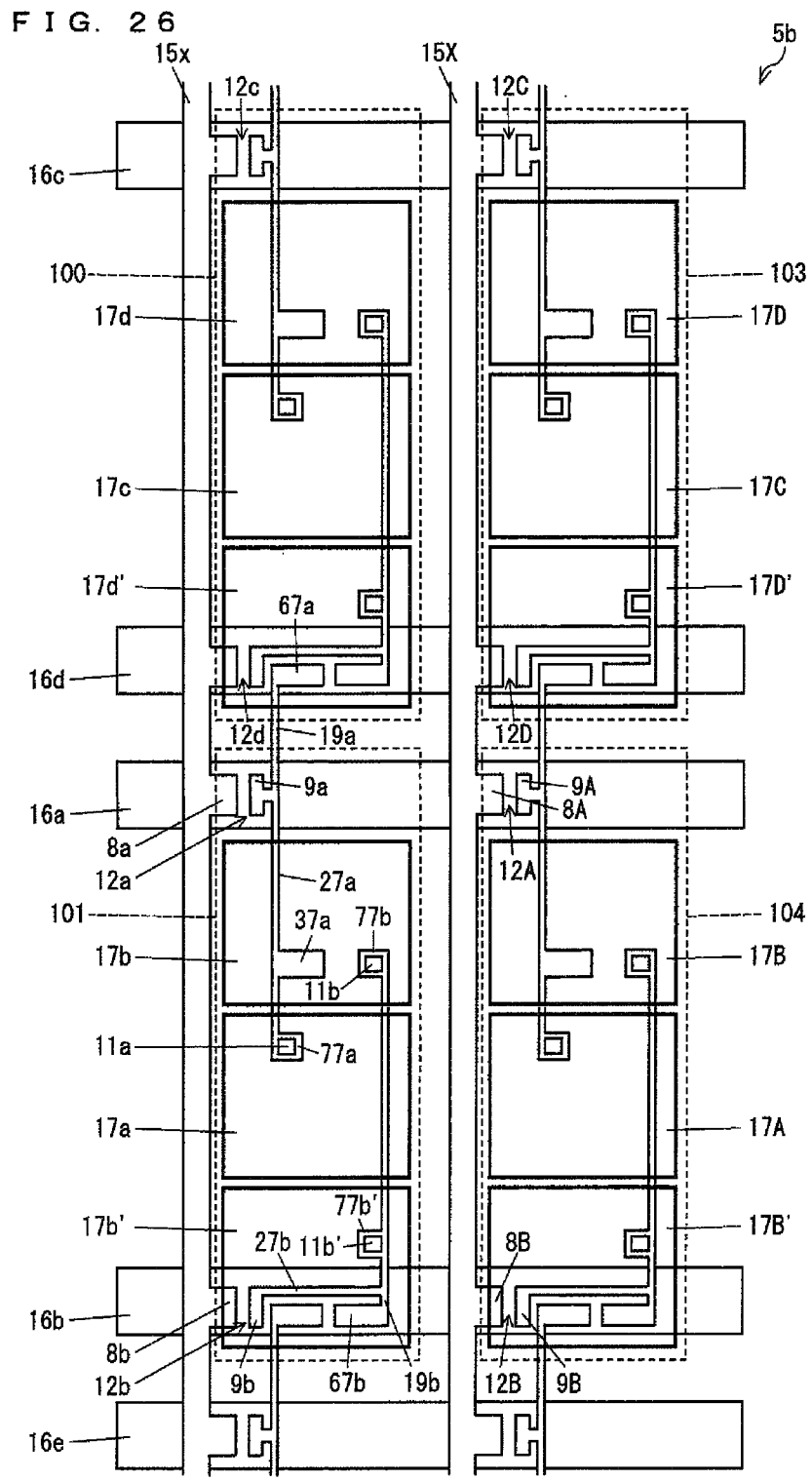
FIG. 26 is a plan view illustrating another configuration (in a concrete example 2-2) of a liquid crystal panel 5b.

FIG. 26 illustrates a concrete example 2-2 of the liquid crystal panel 5b. According to the liquid crystal panel 5b shown in FIG. 26, three pixel electrodes are provided in each pixel region. In the liquid crystal panel 5b of FIG. 26, as well as in the liquid crystal panel of FIG. 24, a data signal line 15x is provided so as to extend along a pixel 100 and a pixel 101, and a data signal line 15X is provided so as to extend along a pixel 103 and a pixel 104.

Here, a scanning signal line 16c is provided so that the scanning signal line 16c and one of two edge parts of the pixel 100 overlap each other, which two edge parts extend in the row direction, and a scanning signal line 16d is provided so that the scanning signal line 16d and the other of the two edge parts of the pixel 100 overlap each other. Pixel electrodes 17d, 17c, and 17d' are juxtaposed in the column direction between the scanning signal lines 16c and 16d when they are viewed from above. The scanning signal line 16c is provided so that the scanning signal line 16c and one of two edge parts of the pixel 103 overlap each other, which two edge parts extend in the row direction, and the scanning signal line 16d is provided so that the scanning signal line 16d and the other of the two edge parts of the pixel 103 overlap each other. Pixel electrodes 17D, 17C, and 17D' are juxtaposed in the column direction between the scanning signal lines 16c and 16d when they are viewed from above.

Further, a scanning signal line 16a is provided so that the scanning signal line 16a and one of two edge parts of the pixel 101 overlap each other, which two edge parts extend in the row direction, and a scanning signal line 16b is provided so that the scanning signal line 16b and the other of the two edge parts of the pixel 101 overlap each other. Pixel electrodes 17b, 17a, and 17b' are juxtaposed in the column direction between the scanning signal lines 16a and 16b when they are viewed from above. The scanning signal line 16a is provided so that the scanning signal line 16a and one of two edge parts of the pixel 104 overlap each other, which two edge parts extend in the row direction, and the scanning signal line 16b is provided so that the scanning signal line 16b and the other of the two edge parts of the pixel 104 overlap each other. Pixel electrodes 17B, 17A, and 17B' are juxtaposed in the column direction between the scanning signal lines 16a and 16b when they are viewed from above.

In the pixel 101, a transistor 12a has a source electrode 8a and a drain electrode 9a which are provided above the scanning signal line 16a. Further, a transistor 12b has a source electrode 8b and a drain electrode 9b which are provided above the scanning signal line 16b. The source electrode 8a is connected to the data signal line 15x. The drain electrode 9a is connected to a wire 27a for drawing out a drain. The wire 27a is connected to a capacitor-coupling electrode 37a and a contact electrode 77a. The contact electrode 77a is connected to the pixel electrode 17a via a contact hole 11a. The capacitor-coupling electrode 37a and the pixel electrode 17b overlap each other via an interlayer insulating film. With the configuration, a coupling capacitor C101 (see FIG. 23) is formed between the pixel electrodes 17a and 17b. Moreover, the drain electrode 9a which is electrically connected to the pixel electrode 17a is connected to a storage capacitor electrode 67a via a wire 19a for drawing out a drain, and the storage capacitor electrode 67a overlaps, via a gate insulating film, a scanning signal line 16d which is adjacent to the scanning signal line 16a. With the configuration, a storage capacitor Cha (see FIG. 23) is formed.

The source electrode 8b of the transistor 12b is connected to the data signal line 15x. The drain electrode 9b is connected to a wire 27b for drawing out a drain. The wire 27b is connected to the contact electrodes 77b and 77b'. The contact electrode 77b is connected to the pixel electrode 17b via a contact hole 11b, and the contact electrode 77b' is connected to the pixel electrode 17b' via a contact hole 11b'. Moreover, the drain electrode 9a which is electrically connected to the pixel electrodes 17b and 17b' is connected to the storage capacitor electrode 67b via a wire 19b for drawing out a drain. The storage capacitor electrode 67b and the scanning signal line 16b overlap each other via the gate insulating film. With the configuration, the storage capacitor Chb (see FIG. 23) is formed. Note that a configuration (shapes and arrangements of respective members and their connecting relations) of each of the other pixels is identical to that of the pixel 101.

According to the configuration of the present concrete example, a sub-pixel including the pixel electrode 17a becomes "bright" and sub-pixels respectively including the pixel electrodes 17b and 17b' become "dark".

Figure 27:
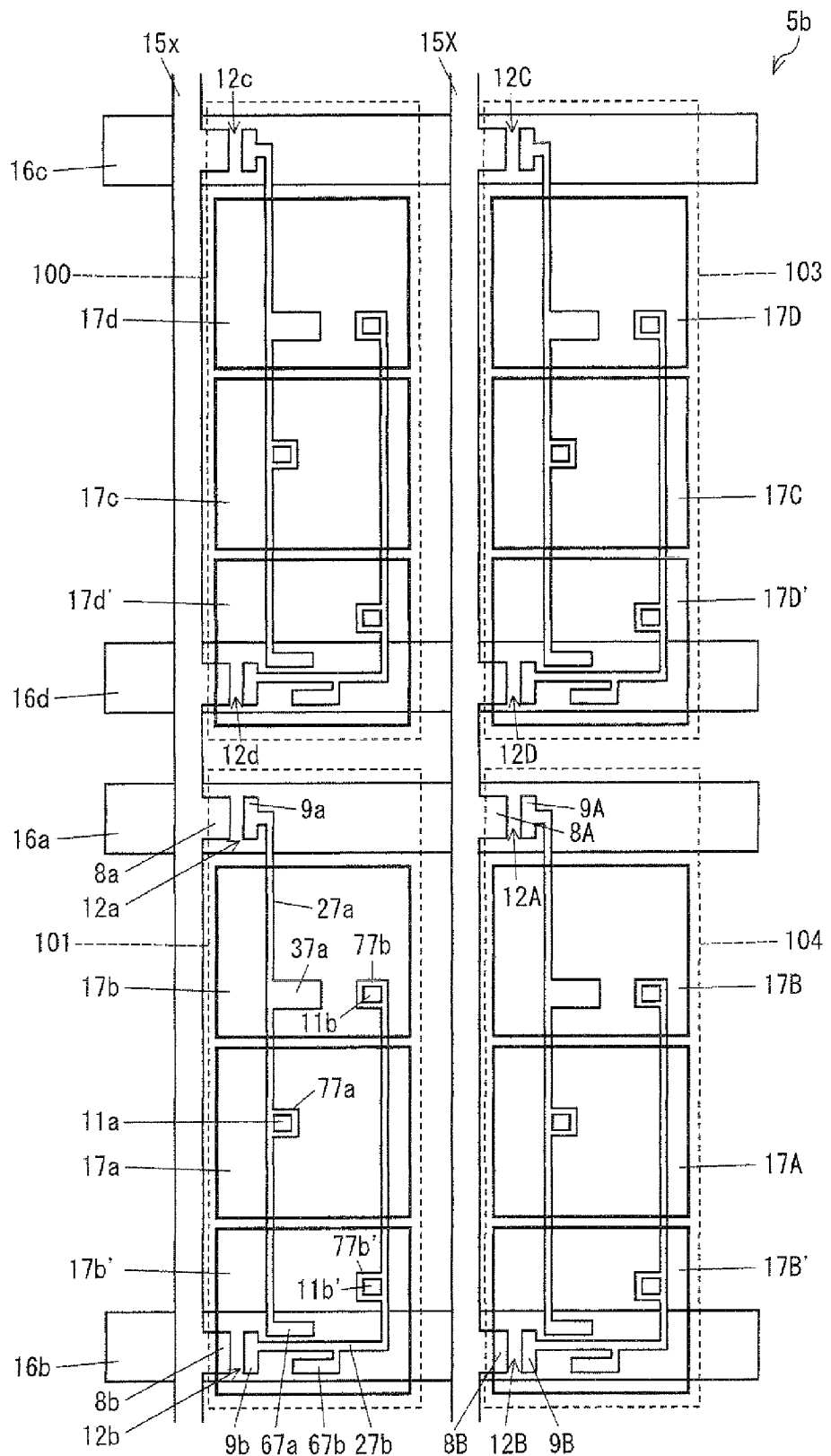
FIG. 27 is a plan view illustrating another configuration of a liquid crystal panel 5b.

Note that the storage capacitors Cha and Chb can be formed by a configuration shown in FIG. 27. That is, as shown in FIG. 27, the drain electrode 9a is connected to a storage capacitor electrode 67a via a wire 27a for drawing out a drain, and the storage capacitor electrode 67a and the scanning signal line 16b overlap each other via the gate insulating film. With the configuration, a storage capacitor Cha is formed. Moreover, the drain electrode 9b is connected to the storage capacitor electrode 67b via a wire 27b for drawing out a drain, and the storage capacitor electrode 67b and the scanning signal line 16b overlap each other via a gate insulating film. With the configuration, a storage capacitor Chb is formed.

Concrete Example 2-3 of Liquid Crystal Panel

Figure 28:
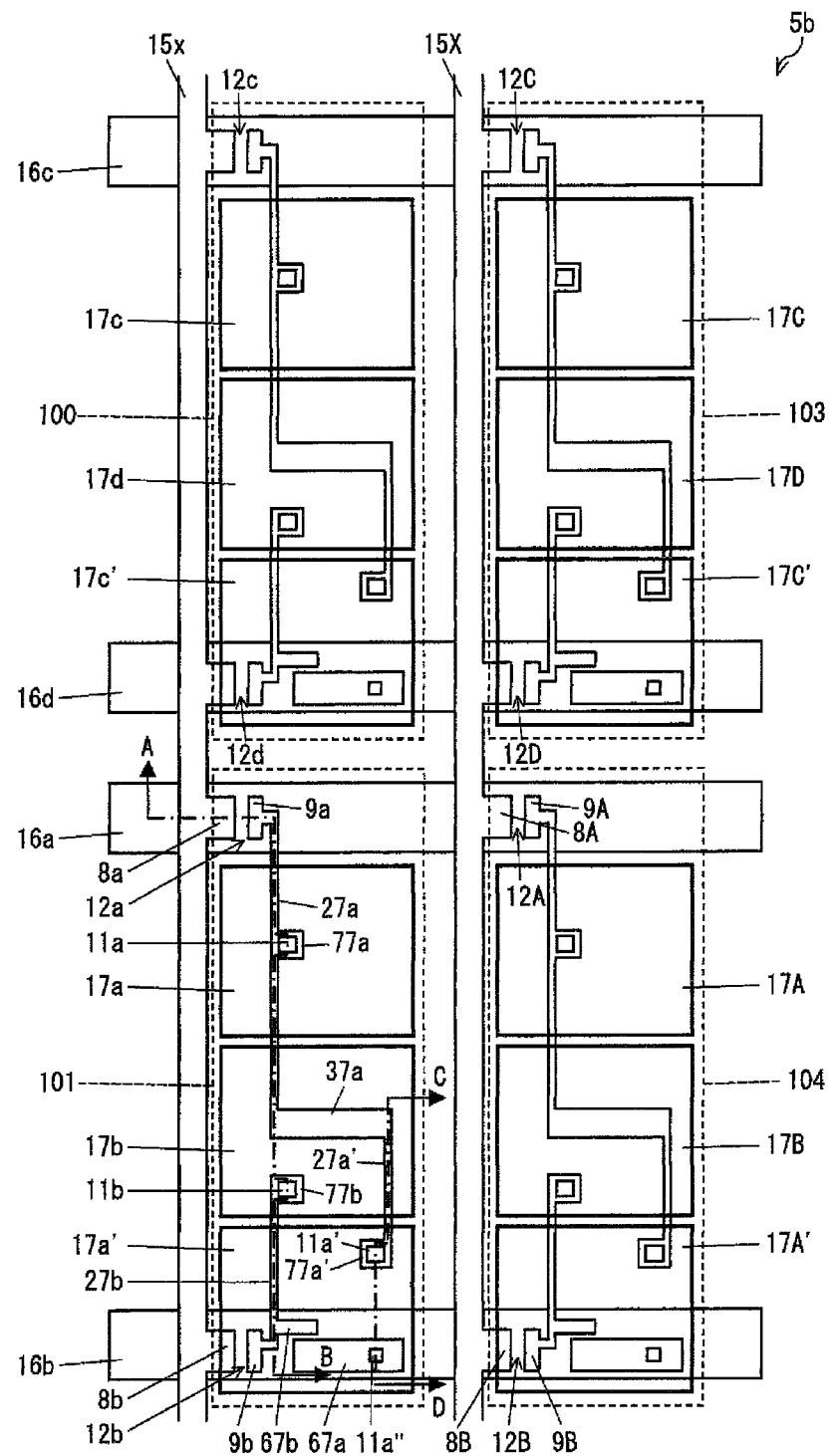
FIG. 28 is a plan view illustrating another configuration (in a concrete example 2-3) of a liquid crystal panel 5b.

FIG. 28 illustrates the liquid crystal panel 5b of a concrete example 2-3. In the liquid crystal panel 5b of FIG. 28, three pixel electrodes are provided in each pixel region. In this liquid crystal panel 5b of FIG. 28, as well as in the liquid crystal panel of FIG. 24, a data signal line 15x is provided along a pixel 100 and a pixel 101; data signal line 15X is provided along a pixel 103 and a pixel 104.

Here, a scanning signal line 16c is provided so that the scanning signal line 16c and one of two edge parts of the pixel 100 overlap each other, which two edge parts extend in the row direction, and a scanning signal line 16d is provided so that the scanning signal line 16d and the other of the two edge parts of the pixel 100 overlap each other. Pixel electrodes 17c, 17d, and 17c' are juxtaposed in the column direction between the scanning signal lines 16c and 16d when they are viewed from above. The scanning signal line 16c is provided so that the scanning signal line 16c and one of two edge parts of the pixel 103 overlap each other, which two edge parts extend in the row direction, and the scanning signal line 16d is provided so that the scanning signal line 16d and the other of the two edge parts of the pixel 103 overlap each other. Pixel electrodes 17C, 17D, and 17C' are juxtaposed in the column direction between the scanning signal lines 16c and 16d when they are viewed from above.

Further, a scanning signal line 16a is provided so that the scanning signal line 16a and one of two edge parts of the pixel 101 overlap each other, which two edge parts extend in the row direction, and a scanning signal line 16b is provided so that the scanning signal line 16b and the other of the two edge parts of the pixel 101 overlap each other. Pixel electrodes 17a, 17b, and 17a' are juxtaposed in the column direction between the scanning signal lines 16a and 16b when they are viewed from above. The scanning signal line 16a is provided so that the scanning signal line 16a and one of two edge parts of the pixel 104 overlap each other, which two edge parts extend in the row direction, and the scanning signal line 16b is provided so that the scanning signal line 16b and the other of the two edge parts of the pixel 104 overlap each other. Pixel electrodes 17A, 17B, and 17A' are juxtaposed in the column direction between the scanning signal lines 16a and 16b when they are viewed from above.

In the pixel 101, a transistor 12a has a source electrode 8a and a drain electrode 9a which are provided above the scanning signal line 16a. Further, a transistor 12b has a source electrode 8b and a drain electrode 9b which are provided above the scanning signal line 16b. The source electrode 8a is connected to the data signal line 15x. The drain electrode 9a is connected to a wire 27a for drawing out a drain. The wire 27a is connected to a contact electrode 77a and a capacitor-coupling electrode 37a. The contact electrode 77a is connected to the pixel electrode 17a via a contact hole 11a. The capacitor-coupling electrode 37a and the pixel electrode 17b overlap each other via an interlayer insulating film. With the configuration, a coupling capacitor C101 (see FIG. 23) is formed between the pixel electrodes 17a and 17b. Further, a capacitor-coupling electrode extension section 27a' connected to the capacitor-coupling electrode 37a is connected to a contact electrode 77a'. The contact electrode 77a' is connected to a pixel electrode 17a' via a contact hole 11a'. The pixel electrode 17a' is also connected to a storage capacitor electrode 67a via a contact hole 11a". The storage capacitor electrode 67a and the scanning signal line 16b overlap each other via a gate insulating film. With the configuration, a storage capacitor (corresponding to Cha in FIG. 23) is formed between the pixel electrode 17a and the scanning signal line 16b.

The source electrode 8b of the transistor 12b is connected to the data signal line 15x. The drain electrode 9b is connected to a wire 27b for drawing out a drain. The wire 27b is connected to a contact electrode 77b. The contact electrode 77b is connected to a pixel electrode 17b via a contact hole 11b. Further, a storage capacitor electrode 67b and the scanning signal line 16b overlap each other via the gate insulating film. With the configuration, a storage capacitor (corresponding to Chb in FIG. 23) is formed between the pixel electrode 17b and the scanning signal line 16b. Note that other pixels each have a configuration (shapes and arrangements of respective members and their connecting relations) identical to that of the pixel 101.

According to the configuration of the present concrete example, sub-pixels respectively including the pixel electrodes 17a and 17a' become "bright", and a sub-pixel including the pixel electrode 17b becomes "dark".

As described above, the feature of the liquid crystal panels 5b shown in FIGS. 24 through 28 resides in that the storage capacitor is formed on the scanning signal line 16b (Cs on-gate configuration). This does not require any storage capacitor line, and therefore has an effect of simplifying the configuration and an effect of improving an aperture ratio.

It is preferable, as described above, that the storage capacitors Cha and Chb in the liquid crystal panel 5b having the Cs on-gate configuration are formed by causing (i) the storage capacitor electrodes 67a and 67b of the pixel 101 and (ii) the (second) scanning signal line 16d which extends under the pixel 100 to overlap each other or by causing (a) the storage capacitor electrodes 67a and 67b of the pixel 101 and (b) the (second) scanning signal line 16b which extends under the pixel 101 to overlap each other. This is because of the following reason. Namely, if the storage capacitors Cha and Chb are formed by causing (i) the storage capacitor electrodes 67a and 67b of the pixel 101 and (ii) the (first) scanning signal line 16a which extends over the pixel 101 to overlap each other, then there will occur a fluctuation in each electric potential of the pixel electrodes 17a and 17b, due to a fluctuation in electric potential of the gate on-pulse signal which is applied to the (first) scanning signal line 16a, after the transistor 12a, which is connected to the (first) scanning signal line 16a, turns off. This may cause a deterioration in display quality. Therefore, in the liquid crystal panel 5b of the present embodiment, it is preferable that (i) the storage capacitor Cha is formed between the first pixel electrode 17a and the second scanning signal line (the scanning signal line 16b which extends under the pixel 101 or the scanning signal line 16d which extends under the pixel 100), and (ii) the storage capacitor Chb is formed between the second pixel electrode 17b and the second scanning signal line (the scanning signal line 16b which extends under the pixel 101 or the scanning signal line 16d which extends under the pixel 100).

Figure 29:
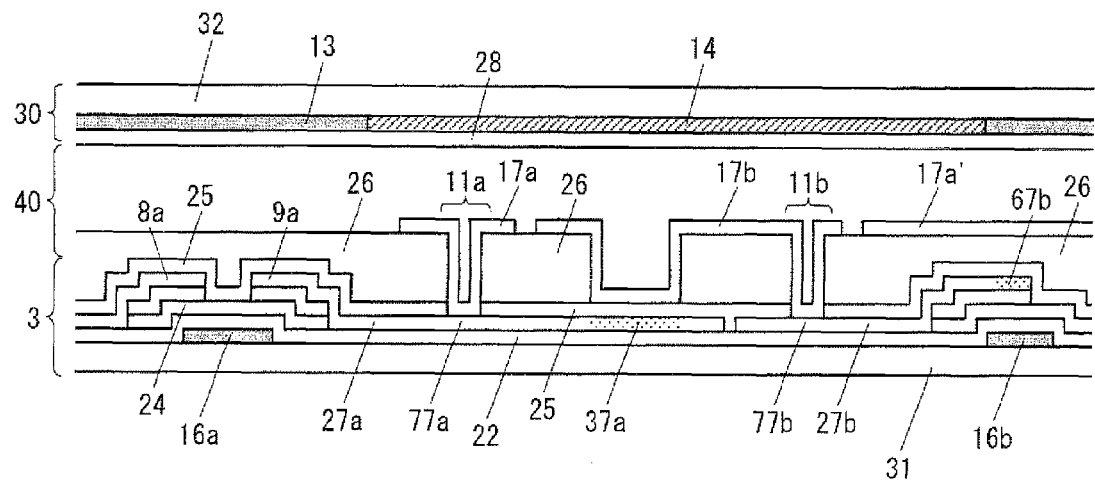
FIG. 29 is a cross-sectional view illustrating a concrete example of a cross-section taken on line A-B illustrated in FIG. 28.
Figure 30:
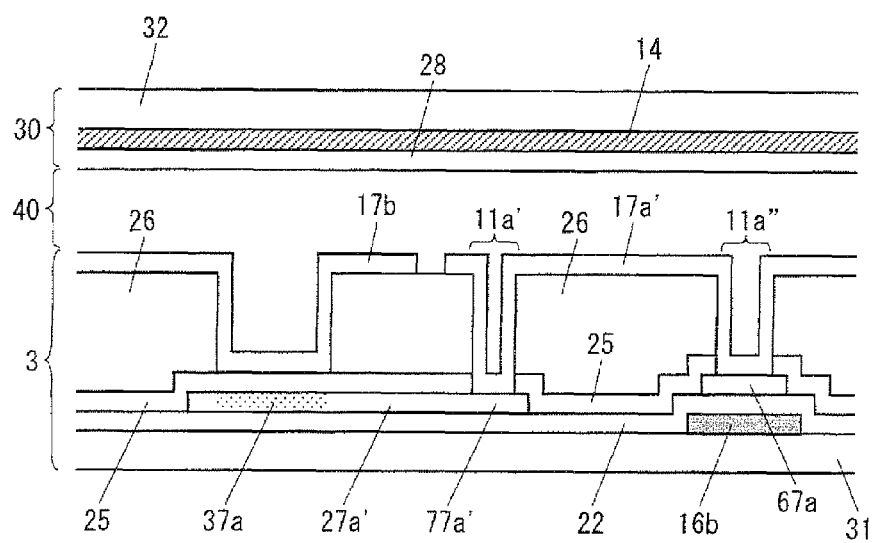
FIG. 30 is a cross-sectional view illustrating a concrete example of a cross-section taken on line C-D illustrated in FIG. 28.

The following description exemplifies the liquid crystal panel 5b shown in FIG. 28 in order to concretely describe a configuration of a cross section of the liquid crystal panel 5b. FIG. 29 is a cross sectional view taken on line A-B in FIG. 28. FIG. 30 is a cross-sectional view taken on line C-D in FIG. 28. As shown in FIGS. 29 and 30, the liquid crystal panel 5b includes an active matrix substrate 3, a color filter substrate 30 which faces the active matrix substrate 3, and a liquid crystal layer 40 sandwiched between the two substrates (3 and 30).

According to the active matrix substrate 3, scanning signal lines 16a and 16b are provided on a glass substrate 31 (see FIG. 29). Further, an inorganic gate insulating film 22 is provided so as to cover the scanning signal lines 16a and 16b. There are provided, on the inorganic gate insulating film 22, a semiconductor layer 24 (i-layer and n+ layer), the source electrode 8a that is in contact with the n+ layer, the drain electrode 9a, the wires 27a and 27b each for drawing out a drain, the contact electrodes 77a and 77b, and the capacitor-coupling electrode 37a. An inorganic interlayer insulating film 25 and an organic interlayer insulating film 26 are further provided in this order so as to cover the wires and electrodes. Note that, since the n+ layer is removed by a process such as etching, only the i-layer remains in part of the semiconductor layer 24 (typically, a channel section of a transistor) in which part (i) the semiconductor layer 24 and (ii) the source electrode 8a and the drain electrode 9a do not overlap each other. The pixel electrodes 17a, 17b, and 17a' are provided on the organic interlayer insulating film 26, and an alignment film (not illustrated) is further provided so as to cover the pixel electrodes (17a, 17b, and 17a'). According to the embodiment, the inorganic interlayer insulating film 25 and the organic interlayer insulating film 26 are hollowed out in contact holes 11a and 11b so that (i) the pixel electrode 17a and the contact electrode 77a are connected to each other via the contact hole 11a and (ii) the pixel electrode 17b and the contact electrode 77b are connected to each other via the contact hole 11b. Moreover, the pixel electrode 17b and the capacitor-coupling electrode 37a that is connected to the wire 27a overlap each other via the inorganic interlayer insulating film 25. This causes a coupling capacitor C101 (see FIG. 23) to be formed. Note that the organic interlayer insulating film 26 is hollowed out in an area above the capacitor-coupling electrode 37a.

The source electrode 8b of the transistor 12b is connected to the data signal line 15x. The drain electrode 9b is connected to the wire 27b which is connected to a storage capacitor electrode 67b and the contact electrode 77b. The contact electrode 77b is connected to the pixel electrode 17b via the contact hole 11b. Further, the storage capacitor electrode 67b and the scanning signal line 16b overlap each other via a gate insulating film. With the configuration, a storage capacitor (corresponding to the capacitor Chb shown in FIG. 23) is formed between the pixel electrode 17b and the scanning signal line 16b. Note that a configuration (shapes and arrangements of respective members and their connecting relations) of each of the other pixels is identical to that of the pixel 101.

Meanwhile, in the color filter substrate 30, a black matrix 13 and a colored layer 14 are provided on a glass substrate 32. On the black matrix 13 and the colored layer 14, a common electrode (coin) 28 is provided. An alignment film (not illustrated) is further provided so as to cover the common electrode (com) 28.

Moreover, as shown in FIG. 30, a capacitor-coupling electrode extension section 27a' connected to the capacitor-coupling electrode 37a is connected to the contact electrode 77a'. The contact electrode 77a' is connected to the pixel electrode 17a' via the contact hole 11a'. The pixel electrode 17a' is connected to the storage capacitor electrode 67a via the contact hole 11a''. The storage capacitor electrode 67a and the scanning signal line 16b overlap each other via the inorganic gate insulating film 22. This causes a storage capacitor (corresponding to Cha shown in FIG. 23) to be formed.

Note that, in FIGS. 29 and 30, the inorganic gate insulating film 22 is used as the gate insulating film. However, as described in the other concrete examples, the thick organic gate insulating film 21 and the thin inorganic gate insulating film 22 can be provided on the substrate.

Concrete Example 2-4 of Liquid Crystal Panel

Figure 31:
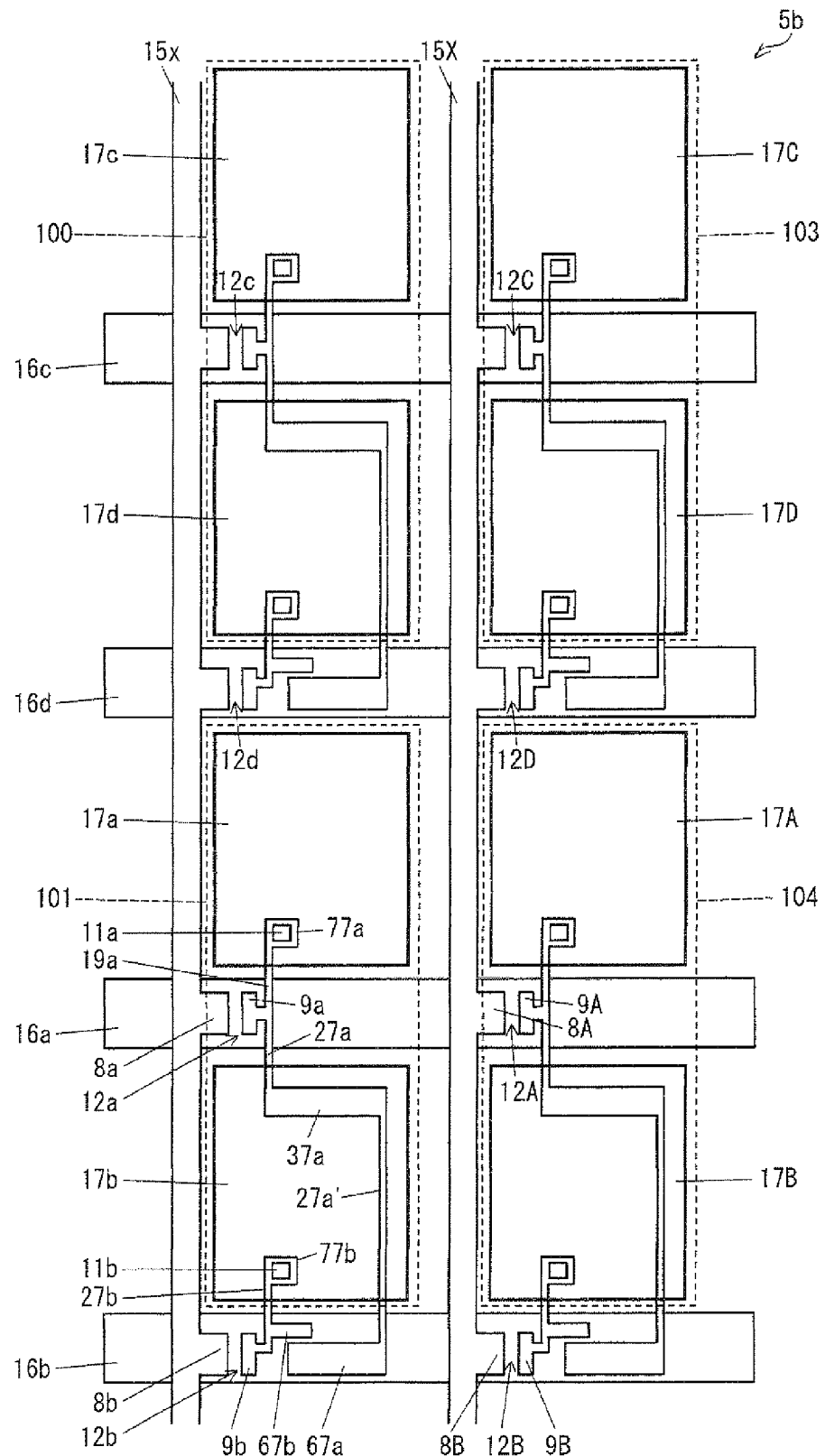
FIG. 31 is a plan view illustrating another configuration (in concrete example 2-4) of a liquid crystal panel 5b.

FIG. 31 illustrates a concrete example 2-4 of the liquid crystal panel 5b. According to the liquid crystal panel 5b shown in FIG. 31, two pixel electrodes are provided in each pixel region. Further, in the liquid crystal panel 5b shown in FIG. 31, a data signal line 15x is provided so as to extend along a pixel 100 and a pixel 101, and a data signal line 15X is provided so as to extend along a pixel 103 and a pixel 104. A scanning signal line 16c is provided so as to traverse central regions of the respective pixels 100 and 103 which central regions extend in the row direction. A scanning signal line 16a is provided so as to traverse central regions of the respective pixels 101 and 104 which central regions extend in the row direction. In the pixel 100, pixel electrodes 17c and 17d are provided in the column direction so that the scanning signal line 16c is sandwiched between the pixel electrodes 17c and 17d. In the pixel 101, pixel electrodes 17a and 17b are provided in the column direction so that the scanning signal line 16a is sandwiched between the pixel electrodes 17a and 17b. In the pixel 103, pixel electrodes 17C and 17D are provided in the column direction so that the scanning signal line 16c is sandwiched between the pixel electrodes 17C and 17D. In the pixel 104, pixel electrodes 17A and 17B are provided in the column direction so that the scanning signal line 16a is sandwiched between the pixel electrodes 17A and 17B.

In the pixel 101, the transistor 12a has a source electrode 8a and a drain electrode 9a which are provided above the scanning signal line 16a, and the transistor 12b has a source electrode 8b and a drain electrode 9b which are provided above the scanning signal line 16b. The source electrode 8a is connected to the data signal line 15x. The drain electrode 9a is connected to a wire 19a for drawing out a drain. The wire 19a is connected to a contact electrode 77a. The contact electrode 77a is connected to the pixel electrode 17a via a contact hole 11a. The drain electrode 9a is connected to a wire 27a for drawing out a drain. The wire 27a is connected to the capacitor-coupling electrode 37a. The capacitor-coupling electrode 37a and the pixel electrode 17b overlap each other via an interlayer insulating film. With the configuration, a coupling capacitor C101 (see FIG. 32) is formed between the pixel electrodes 17a and 17b. Further, a capacitor-coupling electrode extension section 27a' connected to the capacitor-coupling electrode 37a is connected to the storage capacitor electrode 67a. The storage capacitor electrode 67a and the scanning signal line 16b overlap each other via a gate insulating film. With the configuration, a storage capacitor Cha (see FIG. 32) is formed.

The source electrode 8b of the transistor 12b is connected to the data signal line 15x. The drain electrode 9b is connected to a wire 27b for drawing out a drain. The wire 27b is connected to a contact electrode 77b. The contact electrode 77b is connected to the pixel electrode 17b via a contact hole 11b. Further, the drain electrode 9b, which is electrically connected to the pixel electrode 17b, is connected to the storage capacitor electrode 67b via the wire 27b. The storage capacitor electrode 67b and the scanning signal line 16b overlap each other via a gate insulating film. With the configuration, a storage capacitor Chb (see FIG. 32) is formed. Note that a configuration (shapes and arrangements of respective members and their connecting relations) of each of the other pixels is identical to that of the pixel 101.

According to the configuration of the present concrete example, a sub-pixel including the pixel electrodes 17a becomes "bright", and a sub-pixel including the pixel electrode 17b becomes "dark".

Figure 32:
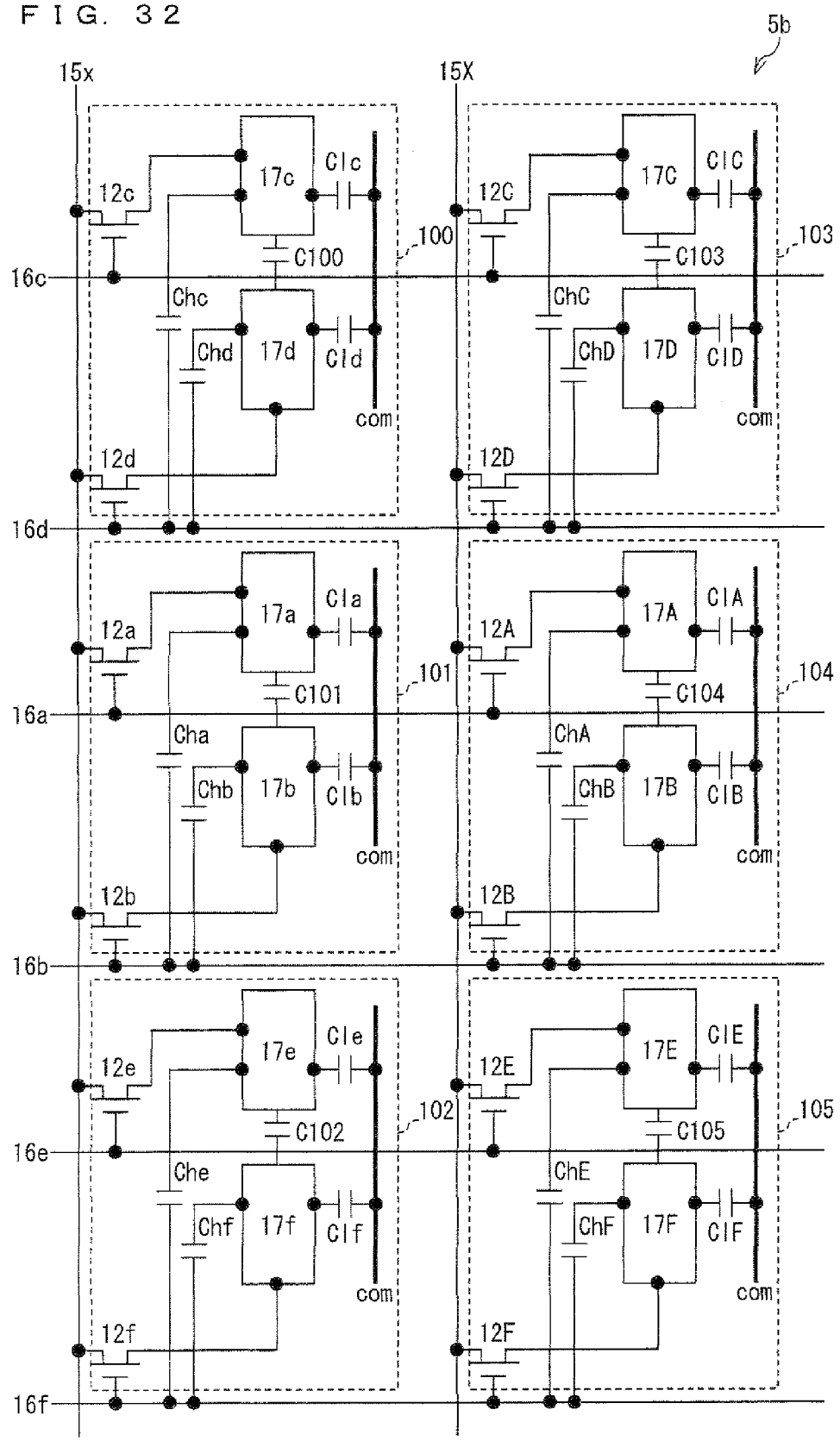
FIG. 32 is a circuit diagram illustrating a configuration of a liquid crystal panel 5b shown in FIG. 31.

FIG. 32 illustrates an equivalent circuit diagram illustrating the liquid crystal panel shown in FIG. 31. The pixels have an identical configuration in which: one data signal line and two scanning signal lines are provided for each of the pixels; (i) the two pixel electrodes 17c and 17d are provided in the pixel 100 so that the scanning signal line 16c, which is one of two scanning signal lines provided for the pixel 100, is sandwiched between the pixel electrodes 17c and 17d, (ii) the two pixel electrodes 17a and 17b are provided in the pixel 101 so that the scanning signal line 16a, which is one of two scanning signal lines provided for the pixel 101, is sandwiched between the pixel electrodes 17a and 17b, and (iii) the two pixel electrodes 17e and 17f are provided in the pixel 102 so that the scanning signal line 16e, which is one of two scanning signal lines provided for the pixel 102, is sandwiched between the pixel electrodes 17e and 17f, and the pixel electrodes 17c, 17d, 17a, 17b, 17e, and 17f are arranged in the column direction; (i) the two pixel electrodes 17C and 17D are provided in the pixel 103 so that the scanning signal line 16c, which is one of two scanning signal lines provided for the pixel 103, is sandwiched between the pixel electrodes 17C and 17D, (ii) the two pixel electrodes 17A and 17B are provided in the pixel 104 so that the scanning signal line 16a, which is one of two scanning signal lines provided for the pixel 104, is sandwiched between the pixel electrodes 17A and 17B, and (iii) the two pixel electrodes 17E and 17F are provided in the pixel 105 so that the scanning signal line 16e, which is one of two scanning signal lines provided for the pixel 105, is sandwiched between the pixel electrodes 17E and 17F, and the pixel electrodes 17C, 17D, 17A, 17B, 17E, and 17F are arranged in the column direction; and, in the row direction, the pixel electrodes 17c, 17d, 17a, 17b, 17e, and 17f are provided adjacent to the pixel electrodes 17C, 17D, 17A, 17B, 17E, and 17F, respectively.

The following description exemplifies the pixel 101. The pixel electrodes 17a and 17b are coupled with each other via the coupling capacitor C101, the pixel electrode 17a is connected to the data signal line 15x via the transistor 12a that is connected to the scanning signal line 16a, the pixel electrode 17b is connected to the data signal line 15x via the transistor 12b that is connected to the scanning signal line 16b, the storage capacitor Cha is formed between the pixel electrode 17a and the scanning signal line 16b, the storage capacitor Chb is formed between the pixel electrode 17b and the scanning signal line 16b, the liquid crystal capacitor Cla is formed between the pixel electrode 17a and the common electrode com, and the liquid crystal capacitor Clb is formed between the pixel electrode 17b and the common electrode com.

Figure 49:
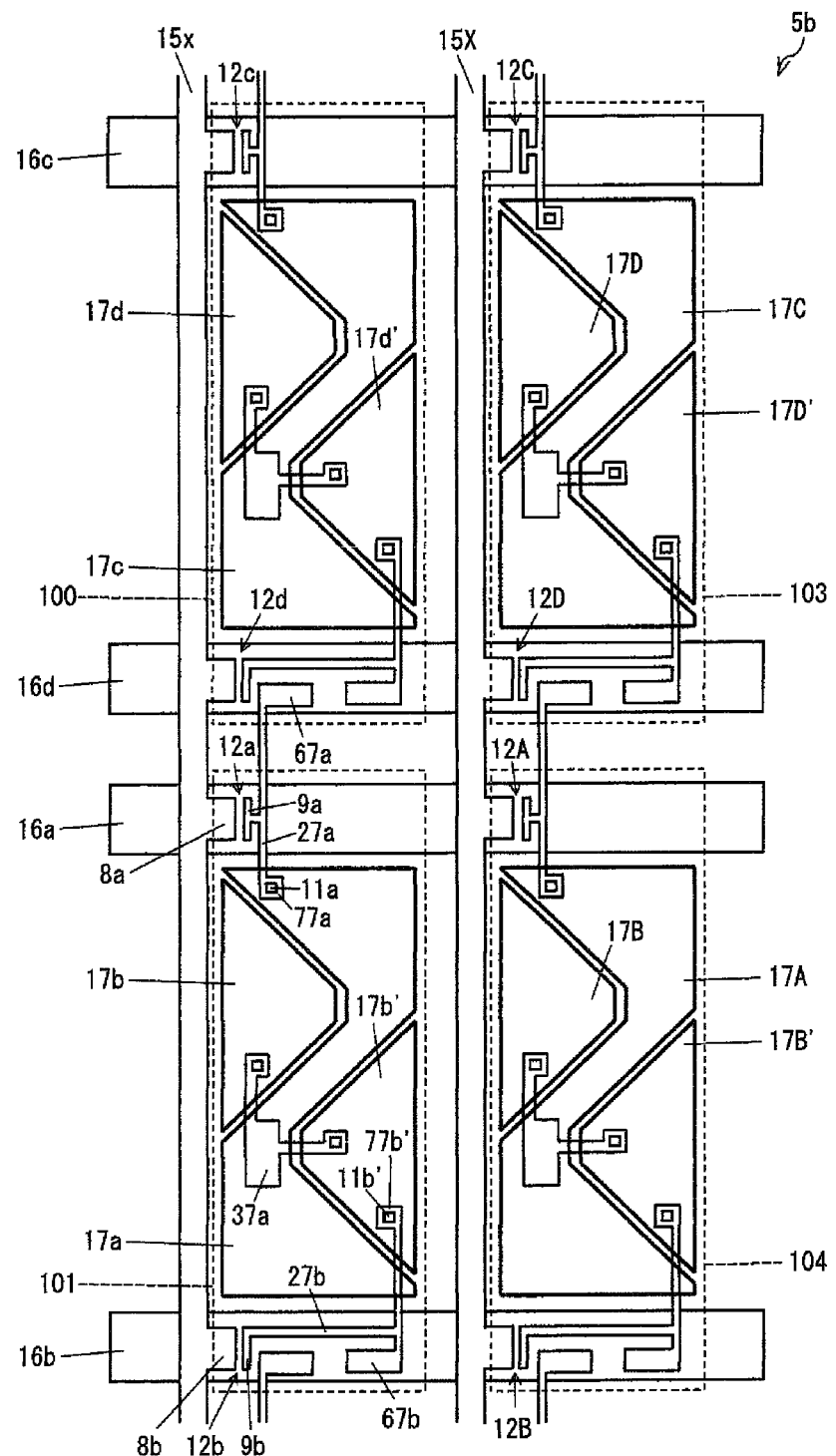
FIG. 49 is a plan view illustrating another configuration of the present liquid crystal panel 5b.

The liquid crystal panel of the present invention is not limited to the configuration as described above in which rectangular pixel electrodes are provided in the column direction. The liquid crystal panel of the present invention can be configured as shown in FIG. 49. FIG. 49 is a plan view illustrating a modification of a concrete example 2-2 shown in FIG. 26. According to the pixel 101 of FIG. 49, a transistor 12a is provided in the vicinity of an intersection of a data signal line 15x and a scanning signal line 16a. (i) A pixel electrode 17b having a trapezoidal shape, (ii) a pixel electrode 17b', and (iii) a pixel electrode 17a are provided in a pixel region demarcated by both the signal lines (15x and 16a) and the scanning signal line 16b. The pixel electrode 17b', which has a trapezoidal shape, is provided in a position of substantial 315 degrees direction from the pixel electrode 17b, with respect to the row direction in which the scanning signal line 16b extends, and the trapezoidal shape of the pixel electrode 17b' is substantially identical to a shape obtained by rotating the pixel electrode 17b by 180 degrees. The pixel electrode 17a is provided, in an area of the pixel region except for the pixel electrodes 17b and 17b', so as to correspond to (so as to engage with) the shapes of the pixel electrodes 17b and 17b'.

According to the configuration, the pixel electrodes 17b, 17a, and 17b' are provided so that (i) part of the pixel electrode 17b is close to the scanning signal line 16a, (ii) part of the pixel electrode 17b' is close to the scanning signal line 16b, and (iii) one end of the pixel electrode 17a is close to the scanning signal line 16a and the other end of the pixel electrode 17a is close to the scanning signal line 16b. In other words, at least parts of the respective pixel electrodes 17b and 17b' are provided so as to be close to the respective scanning signal lines 16a and 16b, and the pixel electrode 17a is provided (i) so as to extend in the column direction and (ii) as if to connect the scanning signal line 16a with the scanning signal line 16b. Note that the members shown in FIG. 49 which have the same functions as those of the members shown in FIG. 26 are given the same reference numerals, and explanations of the members are omitted.

According to the configuration, a sub-pixel including the pixel electrodes 17a becomes "bright", and sub-pixels respectively including the pixel electrodes 17b and 17b' become "dark". Further, the wires for drawing out from the respective transistors 12a and 12b shown in FIG. 49 can be reduced, as compared with the configuration shown in FIG. 26. Further, the wires for drawing out from the capacitor-coupling electrodes 37a shown in FIG. 49 can be reduced, as compared with the configuration shown in FIG. 26. This is because the pixel electrodes 17b and 17b', which are arranged close to each other, are coupled with each other via the capacitor-coupling electrode 37a. This brings about effects of (i) suppressing occurrence of image-sticking in a sub-pixel including the pixel electrodes 17b and 17b', (ii) reducing possibility of breakage of the wires for drawing out, and (iii) improving an aperture ratio.

Figure 50:
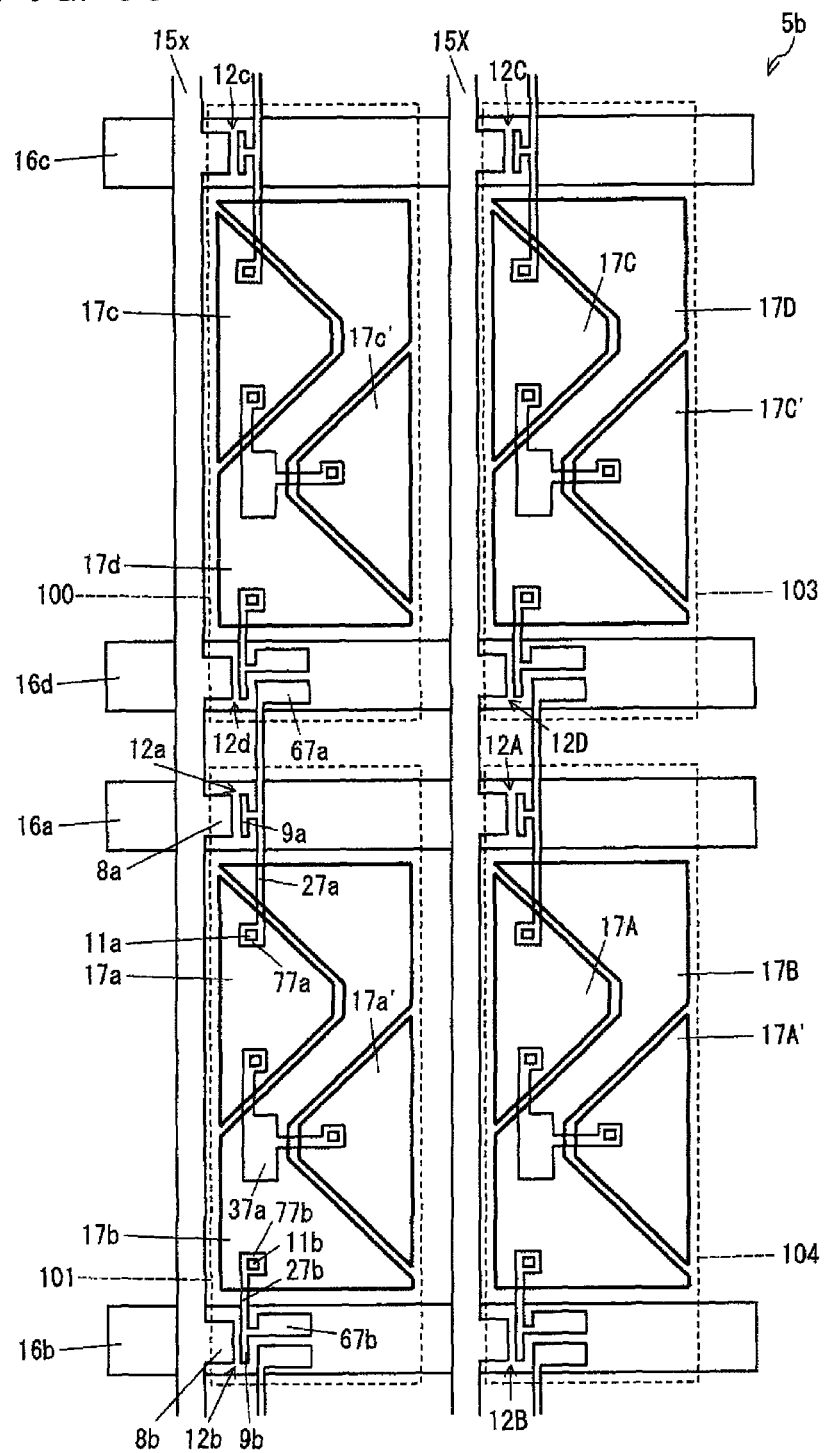
FIG. 50 is a plan view illustrating another configuration of the present liquid crystal panel 5b.

The liquid crystal panel of the present invention can be configured as shown in FIG. 50. According to the liquid crystal panel 5b shown in FIG. 50, at least parts of the respective pixel electrodes 17a and 17a', each of which has a trapezoidal shape, are provided so as to come close to the respective scanning signal lines 16a and 16b. The pixel electrode 17b, which is provided so as to correspond to (so as to engage with) the shapes of the pixel electrodes 17a and 17a', extends in the column direction as if to connect the scanning signal line 16a with the scanning signal line 16b.

According to the configuration, sub-pixels respectively including the pixel electrodes 17a and 17a' becomes "bright", and a sub-pixel including the pixel electrode 17b becomes "dark". Moreover, as with the liquid crystal panel 5b shown in FIG. 49, an effect of improving an aperture ratio can be attained.

The driving methods (driving method-1, driving method-2, driving method-3, and driving method-4), which are described in the Embodiment 1, can be applied to a method for driving a liquid crystal display device including the liquid crystal panel 5b of the present Embodiment 2. That is, even a liquid crystal display device, which includes a liquid crystal panel having the Cs on-gate configuration, can enjoy the effects which are brought about by each of the driving methods.

Embodiment 3

A liquid crystal panel 5c of the present Embodiment 3 has a configuration in which the configurations of Embodiments 1 and 2 are combined. The liquid crystal panel 5c is a liquid crystal panel having a Cs on-gate configuration in which storage capacitor wires (18x through 18z) are included. The liquid crystal panel 5c can be realized, for example, by combining the configurations of the Embodiments 1 and 2. The following description discusses an example configuration where storage capacitor wires are additionally provided to the liquid crystal panel 5b shown in FIG. 28.

Figure 33:
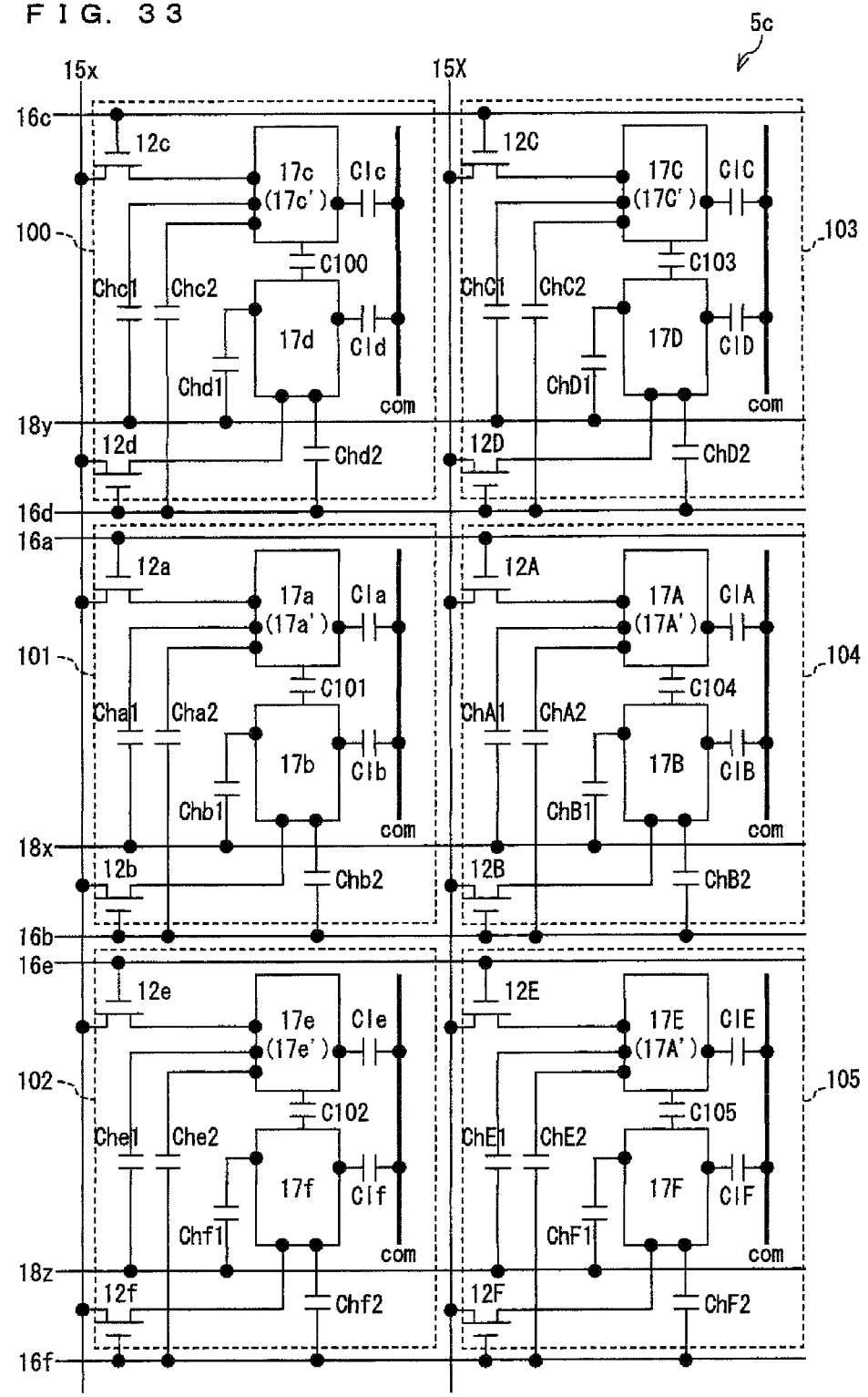
FIG. 33 is a circuit diagram illustrating a configuration of a liquid crystal panel 5c.

FIG. 33 is an equivalent circuit diagram illustrating part of the liquid crystal panel 5c of the present Embodiment 3. As shown in FIG. 33, the liquid crystal panel 5c includes data signal lines (15x and 15X) extending in the column direction (vertical direction in the figure), scanning signal lines (16a through 16f) extending in the row direction (horizontal direction in the figure), pixels (100 through 105) provided in the row and column directions, and a common electrode (counter electrode) com. The pixels are configured in an identical manner. Note that a pixel array including the pixels 100 through 102 and a pixel array including the pixels 103 through 105 are adjacent to each other.

According to the liquid crystal panel 5c, one data signal line and two scanning signal lines are provided for each of the pixels; (i) pixel electrodes 17c, 17d, and 17c' are provided in the pixel 100, (ii) pixel electrodes 17a, 17b, and 17a' are provided in the pixel 101, and (iii) pixel electrodes 17e, 17f, and 17e' are provided in the pixel 102, and the pixel electrodes 17c, 17d, 17c', 17a, 17b, 17a', 17e, 17f, and 17e' are provided in the column direction; (i) pixel electrodes 17C, 17D, and 17C' are provided in the pixel 103, (ii) pixel electrodes 17A, 17B, 17A' are provided in the pixel 104, and (iii) pixel electrodes 17E, 17F, and 17E' are provided in the pixel 105, and the pixel electrodes 17C, 17D, 17C', 17A, 17B, 17A', 17E, 17F, and 17E' are provided in the column direction; and, in the row direction, the pixel electrodes 17c, 17d, 17c', 17a, 17b, 17a', 17e, 17f, and 17e' are provided adjacent to the pixel electrodes 17C, 17D, 17C', 17A, 17B, 17A', 17E, 17F, and 17E', respectively.

Since the pixels are configured in an identical manner, the following description mainly exemplifies and discusses the pixel 101.

According to the pixel 101, pixel electrodes 17a and 17b are coupled with each other via a coupling capacitor C101. The pixel electrode 17a, is connected to a data signal line 15x via a transistor 12a that is connected to a scanning signal line 16a. The pixel electrode 17b is connected to the data signal line 15x via a transistor 12b that is connected to a scanning signal line 16b. A storage capacitor Cha1 is formed between the pixel electrode 17a and a storage capacitor wire 18x. A storage capacitor Chat is formed between the pixel electrode 17a and a scanning signal line 16b. A storage capacitor Chb1 is formed between the pixel electrode 17b and a storage capacitor wire 18x. A storage capacitor Chb2 is formed between the pixel electrode 17b and a scanning signal line 16b. A liquid crystal capacitor Cla is formed between the pixel electrode 17a and a common electrode com. A liquid crystal capacitor Clb is formed between the pixel electrode 17b and the common electrode com.

Concrete Example 3-1 of Liquid Crystal Panel

Figure 34:
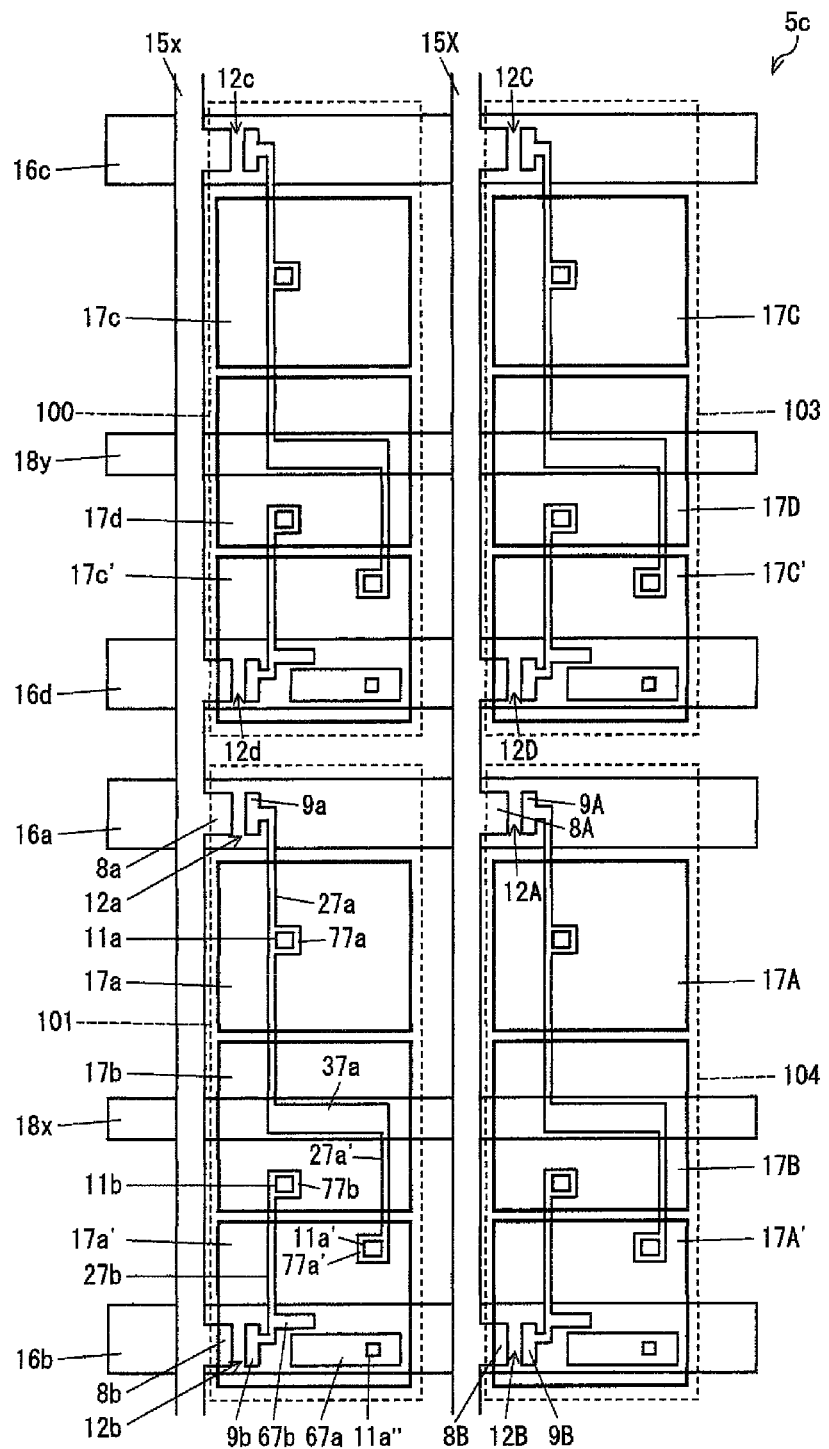
FIG. 34 is a plan view illustrating a configuration (in concrete example 3-1) of a liquid crystal panel 5c.

FIG. 34 illustrates a concrete example 3-1 of the liquid crystal panel 5c. According to the liquid crystal panel 5c shown in FIG. 34, as with the liquid crystal panel shown in FIG. 28, a data signal line 15x is provided along a pixel 100 and a pixel 101; a data signal line 15X is provided along a pixel 103 and a pixel 104; a storage capacitor wire 18y traverses the pixels 100 and 103; and a storage capacitor wire 18x traverses the pixels 101 and 104.

In the liquid crystal panel 5c, a scanning signal line 16c is provided so that the scanning signal line 16c and one of two edge parts of the pixel 100 overlap each other, which two edge parts extend in the row direction; a scanning signal line 16d is provided so that the scanning signal line 16d and the other of the two edge parts overlap each other; and, pixel electrodes 17c, 17d, and 17c' are juxtaposed in the column direction between the scanning signal lines 16c and 16d when they are viewed from above. The scanning signal line 16c is provided so that the scanning signal line 16e and one of two edge parts of the pixel 103 overlap each other, which two edge parts extend in the row direction; the scanning signal line 16d is provided so that the scanning signal line 16d and the other of the two edge parts overlap each other; and, pixel electrodes 17C, 17D, and 17C' are juxtaposed in the column direction between the scanning signal lines 16c and 16d when they are viewed from above.

Moreover, a scanning signal line 16a is provided so that the scanning signal line 16a and one of two edge parts of the pixel 101 overlap each other, which two edge parts extend in the row direction; a scanning signal line 16b is provided so that the scanning signal line 16b and the other of the two edge parts overlap each other; and, pixel electrodes 17a, 17b, and 17a' are juxtaposed in the column direction between the scanning signal lines 16a and 16b when they are viewed from above. The scanning signal line 16a is provided so that the scanning signal line 16a and one of two edge parts of the pixel 104 overlap each other, which two edge parts extend in the row direction; the scanning signal line 16b is provided so that the scanning signal line 16b and the other of the two edge parts overlap each other; and pixel electrodes 17A, 17B, and 17A' are juxtaposed in the column direction between the scanning signal lines 16a and 16b when they are viewed from above.

In the pixel 101, the transistor 12a has a source electrode 8a and a drain electrode 9a which are provided above the scanning signal line 16a, and the transistor 12b has a source electrode 8b and a drain electrode 9b which are provided above the scanning signal line 16b. The source electrode 8a is connected to the data signal line 15x. The drain electrode 9a is connected to a wire 27a for drawing out a drain. The wire 27a is connected to a contact electrode 77a and a capacitor-coupling electrode 37a. The contact electrode 77a is connected to the pixel electrode 17a via a contact hole 11a. The capacitor-coupling electrode 37a and the pixel electrode 17b overlap each other via an interlayer insulating film. With the configuration, a coupling capacitor C101 (see FIG. 33) is formed between the pixel electrodes 17a and 17b. Further, a capacitor-coupling electrode extension section 27a' connected to the capacitor-coupling electrode 37a is connected to a contact electrode 77a'. The contact electrode 77a' is connected to a pixel electrode 17a' via a contact hole 11a'. The pixel electrode 17a' is connected to the storage capacitor electrode 67a via a contact hole 11a''. The storage capacitor electrode 67a and the scanning signal line 16b overlap each other via a gate insulating film. This causes a storage capacitor (corresponding to Chat shown in FIG. 33) to be formed between the pixel electrode 17a and the scanning signal line 16b.

The source electrode 8b of the transistor 12b is connected to the data signal line 15x. The drain electrode 9b is connected to a wire 27b for drawing out a drain. The wire 27b is connected to the contact electrode 77b. The contact electrode 77b is connected to the pixel electrode 17b via a contact hole 11b. Further, the storage capacitor electrode 67b and the scanning signal line 16b overlap each other via a gate insulating film. With the configuration, a storage capacitor (corresponding to Chb2 shown in FIG. 33) is formed between the pixel electrode 17b and the scanning signal line 16b.

Moreover, the capacitor-coupling electrode 37a and the storage capacitor wire 18x overlap each other via a gate insulating film. With the configuration, a storage capacitor Cha1 (see FIG. 33) is formed, and a storage capacitor Chb1 (see FIG. 33) is formed between the pixel electrode 17b and the storage capacitor wire 18x. Note that a configuration (shapes and arrangements of respective members and their connecting relations) of each of the other pixels is identical to that of the pixel 101.

According to the configuration of the present concrete example, sub-pixels respectively including the pixel electrodes 17a and 17a' become "bright", and a sub-pixel including the pixel electrode 17b becomes "dark".

As described above, the present Embodiment 3 can be realized by combining the configurations of the Embodiments and 2. Specifically, the present Embodiment 3 can be realized by providing the storage capacitor wire 18x under the capacitor-coupling electrode 37a which is included in the Cs on-gate configuration of the Embodiment 2.

Note that, the driving methods (driving method-1, driving method-2, driving method-3, and driving method-4), which are described in the Embodiment 1, can be applied to a method for driving a liquid crystal display device including the liquid crystal panel 5c of the present Embodiment 3.

Figure 35:
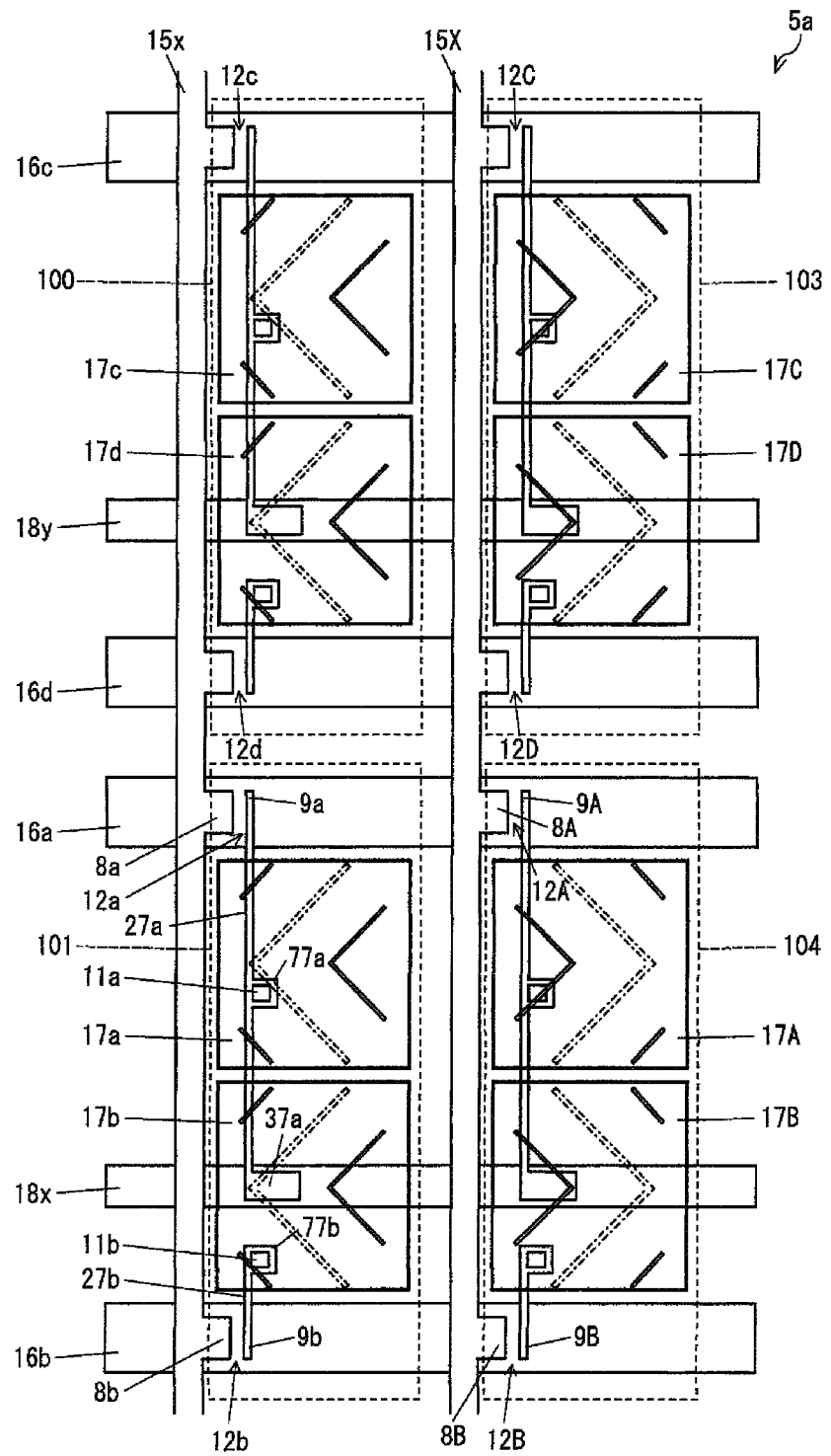
FIG. 35 is a plan view illustrating a configuration of a liquid crystal panel 5a of an MVA structure.
Figure 36:
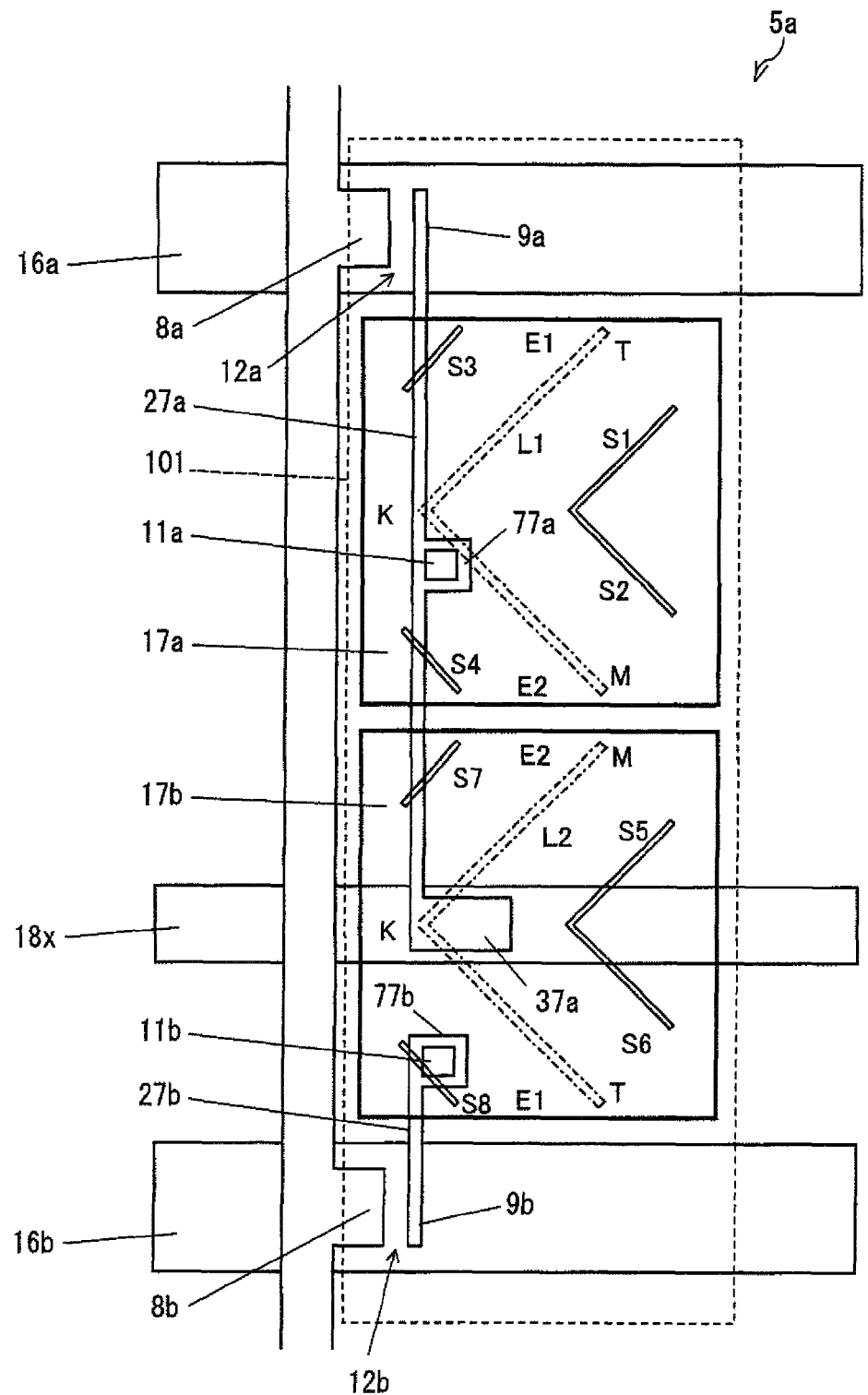
FIG. 36 is a plan view in which a liquid crystal panel 5a shown in FIG. 35 is partially magnified.
Figure 37:
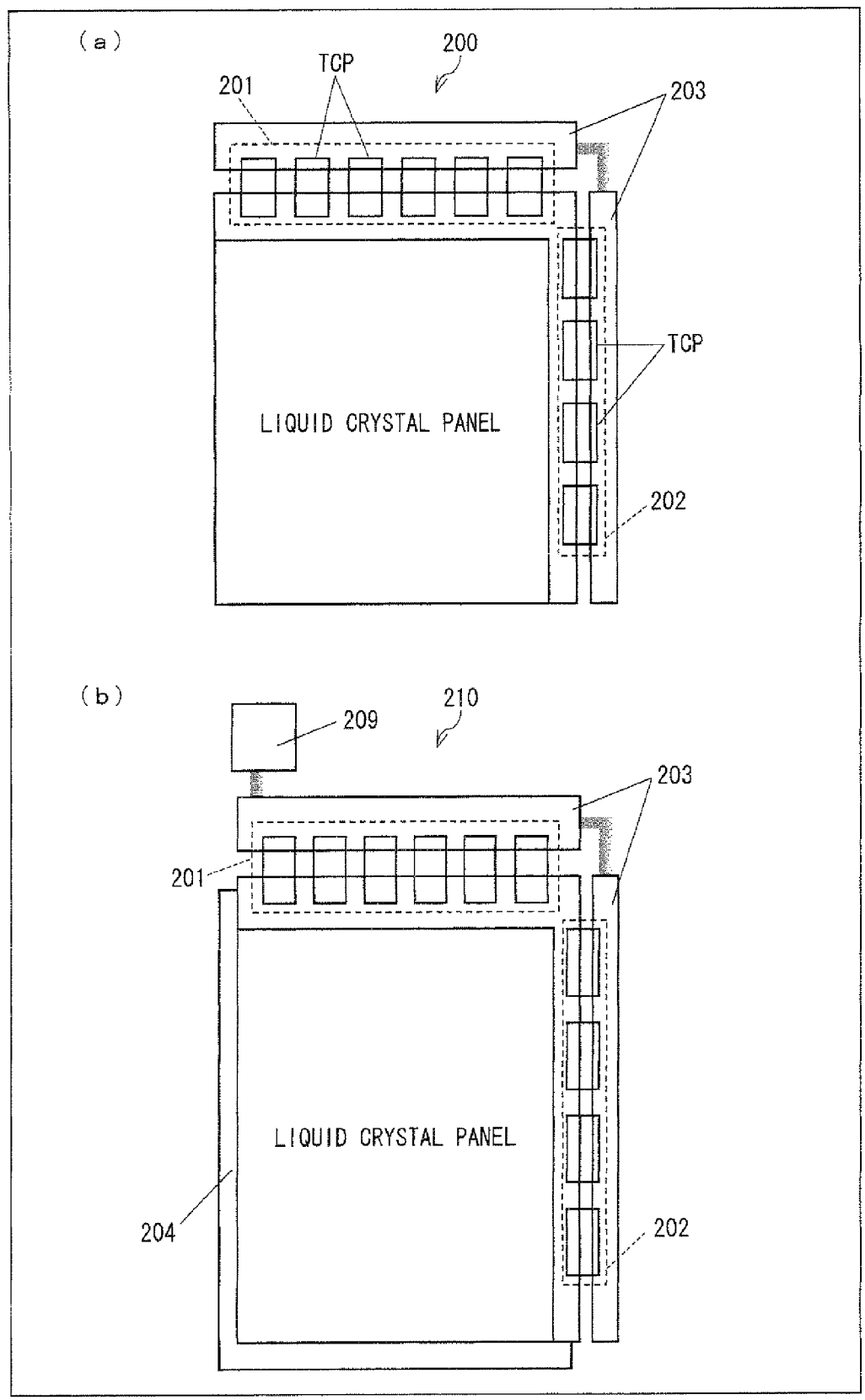
In FIG. 37, (a) is a view schematically illustrating a configuration of the present liquid crystal display unit, and (b) is a view schematically illustrating a configuration of the present liquid crystal display device.

Furthermore, each of the liquid crystal panels 5a, 5b, and 5e illustrated in the Embodiments 1 through 3 can be combined with a known configuration. For example, as illustrated in FIG. 35, each of the liquid crystal panels 5a, 5b, and 5c can be configured so as to have an MVA (Multidomain Vertical Alignment) configuration. FIG. 35 illustrates a case where the liquid crystal panel 5a of FIG. 2 is configured so as to have the MVA configuration. This liquid crystal panel 5a includes an active matrix substrate, a liquid crystal layer, and a color filter substrate. For convenience, FIG. 35, however, does not illustrate the liquid crystal layer, and merely illustrates, as to the color filter substrate, its ribs. FIG. 36 is an enlarged plan view of part of FIG. 35. The following description will exemplify and discuss a pixel 101.

As illustrated in FIG. 36, the pixel 101 includes (i) a sub-pixel (hereinafter, referred to as "first sub-pixel") including a pixel electrode 17a and (ii) a sub-pixel (hereinafter, referred to as "second sub-pixel") including a pixel electrode 17b. The first sub-pixel includes a first alignment controlling structure in which a first rib L1 and slits (pixel electrode slits) S1 through S4 are provided. The second sub-pixel includes a second alignment controlling structure in which a second rib L2 and slits (pixel electrode slits) S5 through S8 are provided.

In the pixel 101, the first sub-pixel closer to a scanning signal line 16a has (i) an end E1 extended along the scanning signal line 16a and (ii) an end E2 which is an opposite end of the end E1, and the second sub-pixel closer to a scanning signal line 16b has (i) an end E1 extended along the scanning signal line 16b and (ii) an end E2 which is an opposite end of the end E2. The color filter substrate has an area that corresponds to the first sub-pixel. In this area, the first rib L1, which has a V-shape when it is viewed in the row direction (in a direction which points to the right from the left in FIG. 36), is provided so that a start-end part T of the first rib L1 is located close to the end E1 of the first sub-pixel and a terminated-end part M of the first rib L1 is located close to the end E2 of the first sub-pixel. The color filter substrate also has an area that corresponds to the second sub-pixel. In this area, the second rib L2, which has a V-shape when it is viewed in the row direction (in a direction which points to the right from the left in FIG. 36), is provided so that a start-end part T of the second rib L2 is located close to the end E1 of the second sub-pixel and a terminated-end part M of the second rib L2 is located close to the end E2 of the second sub-pixel. That is, the V-shape of the first rib L1 and the V-shape of the second rib L2 extend in the same direction.

Further, the pixel electrode 17a has slits S1 through S4 so that the slits S1 through S4 correspond to the first rib L1, and the pixel electrode 17b has slits S5 through S8 so that the slits S5 through S8 correspond to the second rib L2. Here, the slits S1 and S3 are provided on both sides of part of the first rib L1 which part extends from the start-end part T of the first rib L1 to a bending part K of the first rib L1 so that the slits S1 and S3 are substantially in parallel with the part, whereas the slits S2 and S4 are provided on both sides of part of the first rib L1 which part extends from the bending part K of the first rib L1 to the terminated-end part M of the first rib L1 so that the slits S2 and S4 are substantially in parallel with the part. The slits S6 and S8 are provided on both sides of part of the second rib L2 which part extends from the start-end part T of the second rib L2 to a bending part K of the second rib L2 so that the slits S6 and S8 are substantially in parallel with the part, whereas the slits S5 and S7 are provided on both sides of part of the second rib L2 which part extends from the bending part K of the second rib L2 to the terminated-end part M of the second rib L2 so that the slits S5 and S7 are substantially in parallel with the part. Shapes of the slits S5 through S8 and an arrangement of the slits S5 through S8 with respect to the second rib L2 are similar to the shapes of the slits S1 through S4 and the arrangement of the slits S1 through S4 with respect to the first rib L1. Note that, in each of the first and second ribs L1 and L2, an angle ($\angle$TKM) defined by the start-end part T, the bending part K, and the terminated-end part M is approximately 90°.

Thus, the slit S1, a side (T-K part) of the first rib L1, and the slit S3 are parallel to one another, and extend obliquely (at an angle of approximately −135°) with respect to the scanning signal line 16a. The slit S2, a side (K-M part) of the first rib L1, and the slit S4 are parallel to one another, and extend obliquely (at an angle of approximately −45°) with respect to the scanning signal line 16a. Part of the side (T-K part) of the first rib L1 and part of the slit S3 are located close to the end E1 (an area extends along the scanning signal line 16a) of the first sub-pixel. On the other hand, the slit S6, the side (T-K part) of the second rib L2, and the slit S8 are parallel to one another, and extend obliquely (at an angle of approximately 135°) with respect to the scanning signal line 16b. The slit S5, the side (K-M part) of the second rib L2, and the slit S7 are parallel to one another, and extend obliquely (at an angle of approximately 45°) with respect to the scanning signal line 16b. Part of the side (T-K part) of the second rib L2 and part of the slit S8 are located close to the end E1 (an area extending along the scanning signal line 16b) of the second sub-pixel.

With a liquid crystal display device including the liquid crystal panel 5a, it is possible to achieve a wider viewing angle. Further, in this liquid crystal panel 5a, with regard to two pixels (e.g., pixels 101 and 104) adjacent to each other in the column direction, ribs L1 and L2 in the pixel 101 are provided so as to face ribs L1 and L2 in the pixel 104 (see FIG. 35). As such, it is possible to prevent a certain alignment area from being disproportionately affected by alignment disorder. It is thus possible to provide a liquid crystal display device having excellent viewing angle characteristics.

The present liquid crystal panel has discussed a configuration in which the color filter substrate includes the ribs. The present invention is, however, not limited to this. Instead of the ribs, slits can be provided on the color filter substrate.

(Configurations of Liquid Crystal Display Unit and Liquid Crystal Display Device)

Lastly, the following will describe an example of how a liquid crystal display unit and a liquid crystal display device are configured in the present invention. In each of the above embodiments, the liquid crystal display unit and the liquid crystal display device are configured as follows: Two polarizing plates A and B are attached to both sides of each liquid crystal panel (5a through 5e) so that a polarization axis of the polarizing plate A and a polarization axis of the polarizing plate B intersect each other at right angles. An optical compensation sheet and/or the like can be laminated on each of the polarizing plates, if necessary. Next, as illustrated in (a) of FIG. 37, drivers (gate driver 202, source driver 201) are connected to the each liquid crystal panel. The description here deals with an example where the drivers are connected by a TCP (Tape Career Package) method. First, an ACF (Anisotoropi Conduktive Film) is tentatively pressure-bonded to a terminal part of the liquid crystal panel. Next, TCPs on which the drivers are provided are punched out from a carrier tape, are subjected to positioning with respect to panel terminal electrodes, and are then heated and firmly bonded. After that, (i) a circuit board 203 (PWB: Printed Wiring Board) for connecting the driver TCPs with each other and (ii) input terminals of the TCPs are connected to each other by the ACF. This provides a liquid crystal display unit 200. Thereafter, as illustrated in (b) of FIG. 37, the drivers (201 and 202) of the liquid crystal display unit 200 are connected to a display control circuit 209 via the circuit board 203, and then integrated with an illuminating device (backlight unit) 204. This provides a liquid crystal display device 210.

Figure 38:
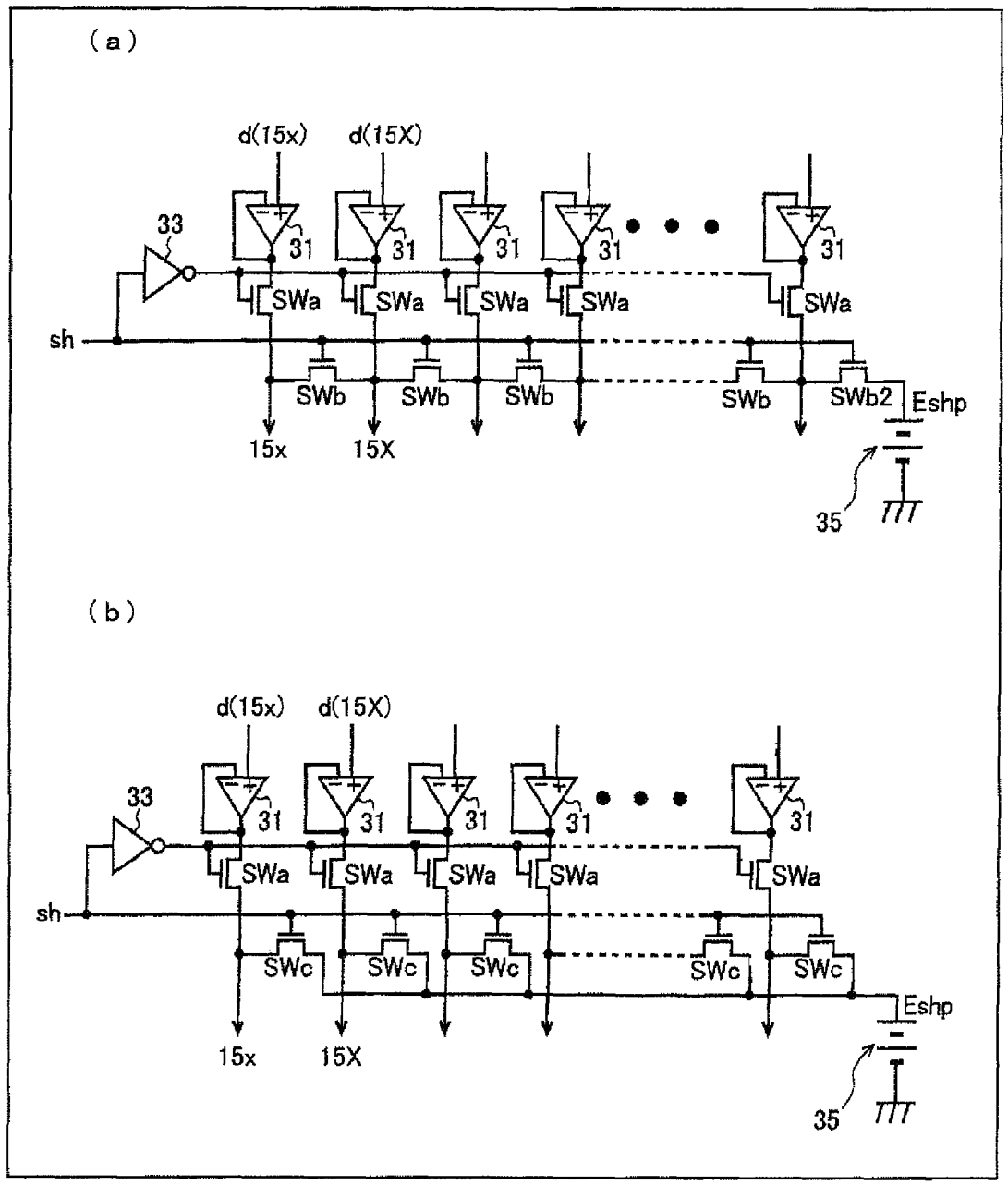
FIG. 38 is a circuit diagram illustrating another configuration of a source driver.

(a) of FIG. 38 illustrates how a source driver is configured in a case where the present liquid crystal display device has a refreshing period. As illustrated in (a) of FIG. 38, such a source driver includes, for each data signal line, a buffer 31, a data output switch SWa, and a refreshing switch SWb. The buffer 31 is supplied with corresponding data d, and an output terminal of the buffer 31 is connected to an output terminal toward a corresponding one of the data signal lines via the data output switch SWa. Moreover, output terminals of any two adjacent data signal lines are connected to each other via a corresponding one of the refreshing switches SWb. That is to say, the refreshing switches SWb are connected in series, and one end of the refreshing switches SWb thus serially-connected is connected to a refreshing electric potential supply source 35 (Vcom). Note that a charge sharing signal sh is applied to gate terminals of the respective data output switches SWa via the inverter 33, and a charge sharing signal sh is applied to gate terminals of the respective refreshing switches SWb.

The source driver illustrated in (a) of FIG. 38 can alternatively be configured as illustrated in (b) of FIG. 38. Namely, each of refreshing switches SWc is merely provided between a corresponding data signal line and a refreshing electric potential supply source 35 (Vcom), and therefore the refreshing switches SWc are not serially connected to each other. This allows prompt supply of a refreshing electric potential to the data signal lines.

Figure 39:
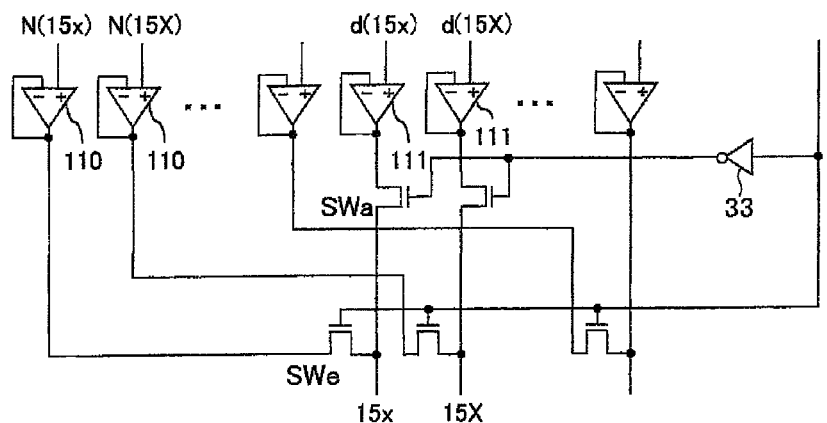
FIG. 39 is a circuit diagram illustrating yet another configuration of a source driver.

In the above-described configuration of the source driver, the refreshing electric potential is Vcom. However, the present invention is not limited to this. Namely, for example, the following alternative source driver can be employed: a suitable refreshing electric potential is found based on (i) a signal electric potential supplied to a certain data signal line in a horizontal scanning period that is one horizontal scanning period before a current horizontal scanning period and (ii) a signal electric potential to be supplied to the certain data signal line in the current horizontal scanning period, and the refreshing electric potential thus found is applied to the certain data signal line. FIG. 39 illustrates the alternative source driver. The alternative source driver includes, for each data signal line, a data output buffer 110, a refreshing buffer 111, a data output switch SWa, and a refreshing switch SWe. The data output buffer 110 is supplied with corresponding data d, and an output terminal of the data output buffer 110 is connected to an output terminal toward the data signal line via the data output switch SWa. The refreshing buffer 111 is supplied with corresponding non-image data N (data corresponding to an optimum refreshing electric potential determined based on (i) a signal electric potential applied in a horizontal scanning period that is one horizontal scanning period before a current horizontal scanning period and (ii) a signal electric potential to be applied in the current horizontal scanning period), and an output terminal of the refreshing buffer 111 is connected to an output terminal toward the data signal line via the refreshing switch SWe.

The "polarity of an electric potential" herein means high (positive) or low (negative) with respect to a reference electric potential. Note that the reference electric potential can be Vcom (common electric potential), which is an electric potential of a common electrode (counter electrode), or can be any other desired electric potential.

Figure 40:
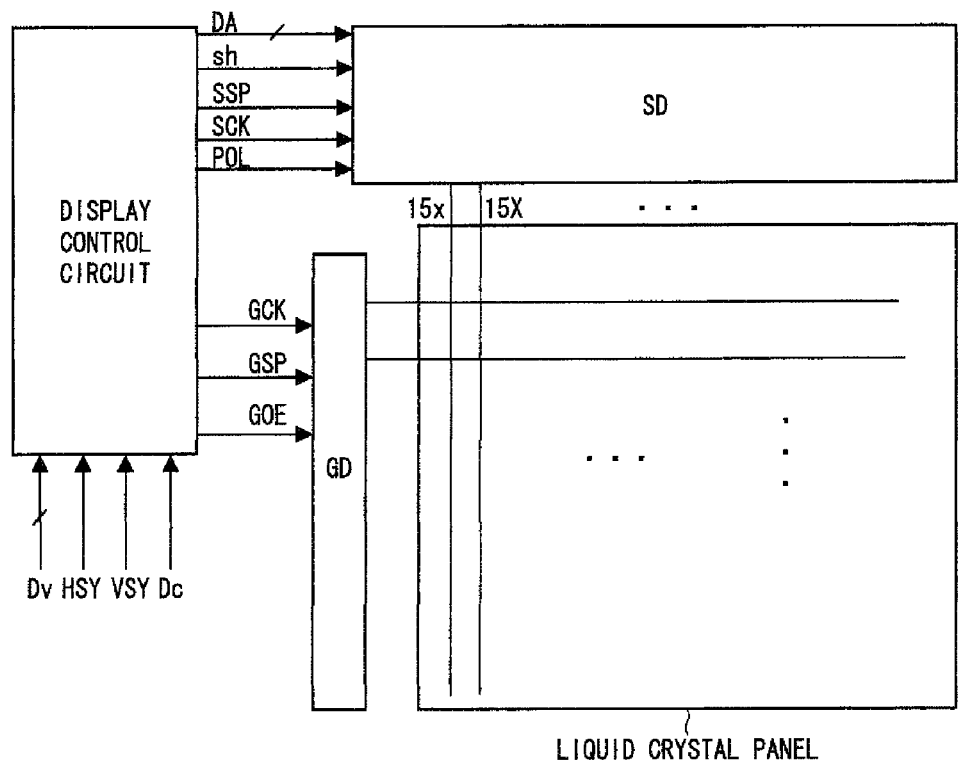
FIG. 40 is a block diagram illustrating an entire configuration of the present liquid crystal display device.

FIG. 40 is a block diagram illustrating a configuration of the present liquid crystal display device. As illustrated in FIG. 40, the present liquid crystal display device includes a display section (liquid crystal panel), a source driver (SD), a gate driver (GD), and a display control circuit. The source driver drives data signal lines, the gate driver drives scanning signal lines, and the display control circuit controls the source driver and the gate driver.

The display control circuit receives, from an external signal source (e.g., a tuner), a digital video signal Dv representing an image to be displayed, a horizontal sync signal HSY and a vertical sync signal VSY which correspond to the digital video signal Dv, and a control signal Dc for controlling a display operation. Based on the signals Dv, HSY, VSY, and Dc thus received, the display control circuit generates and outputs, as signals for displaying on the display section the image represented by the digital video signal Dv, (i) a data start pulse signal SSP, (ii) a data clock signal SCK, (iii) a charge sharing signal sh, (iv) a digital image signal DA (a signal corresponding to the video signal Dv) representing the image to be displayed, (v) a gate start pulse signal GSP, (vi) a gate clock signal GCK, and (vii) a gate driver output control signal (scanning signal output control signal) GOE.

More specifically, the display control circuit (i) outputs the video signal Dv as the digital image signal DA, after carrying out processing such as timing adjustment of the video signal Dv by use of an internal memory if necessary, (ii) generates the data clock signal SCK as a signal including a pulse which corresponds to a corresponding one of the pixels which display the image represented by the digital image signal DA, (iii) generates, in response to the horizontal sync signal HSY, the data start pulse signal SSP as a signal that becomes a high-level (H level) for a predetermined time period in each horizontal scanning period, (iv) generates, in response to the vertical sync signal VSY, the gate start pulse signal GSP as a signal that becomes an H level for a predetermined time period in each frame period (each vertical scanning period), (v) generates the gate clock signal GCK in response to the horizontal sync signal HSY, and (vi) generates the charge sharing signal sh and the gate driver output control signal GOE in response to the horizontal sync signal HSY and control signal Dc.

Out of the signals that are thus generated by the display control circuit, the digital image signal DA, the charge sharing signal sh, a signal POL for controlling a polarity of a signal electric potential (data signal electric potential), the data start pulse signal SSP, and the data clock signal SCK are supplied to the source driver, whereas the gate start pulse signal GSP, the gate clock signal GCK, and the gate driver output control signal GOE are supplied to the gate driver.

Based on the digital image signal DA, the data clock signal SCK, the charge sharing signal sh, the data start pulse signal SSP, and the polarity inversion signal POL, the source driver sequentially generates, for each horizontal scanning period, analog electric potentials (signal electric potentials) that correspond to pixel values for the respective scanning signal lines which pixel values cause the image represented by the digital image signal DA. The source driver then applies these data signals to the data signal lines (e.g., 15x and 15X).

The gate driver generates gate on-pulse signals in response to the gate start pulse signal GSP and the gate clock signal GCK, and the gate driver output control signal GOE, and applies these gate on-pulse signals to the respective scanning signal lines. This allows the scanning signal lines to be selectively driven.

Since the data signal lines and the scanning signal lines of the display section (liquid crystal panel) are driven by the source driver and the gate driver as described above, a signal electric potential is written into corresponding pixel electrodes from a corresponding one of the data signal lines, via transistors (TFTs) connected to respective selected scanning signal lines. This causes a voltage to be applied to part of a liquid crystal layer which part corresponds to each of the sub-pixels. As such, the amount of light, illuminated by the backlight, which light transmits the each of the sub-pixels is controlled. Consequently, the sub-pixels display the image represented by the digital video signal Dv.

Figure 41:
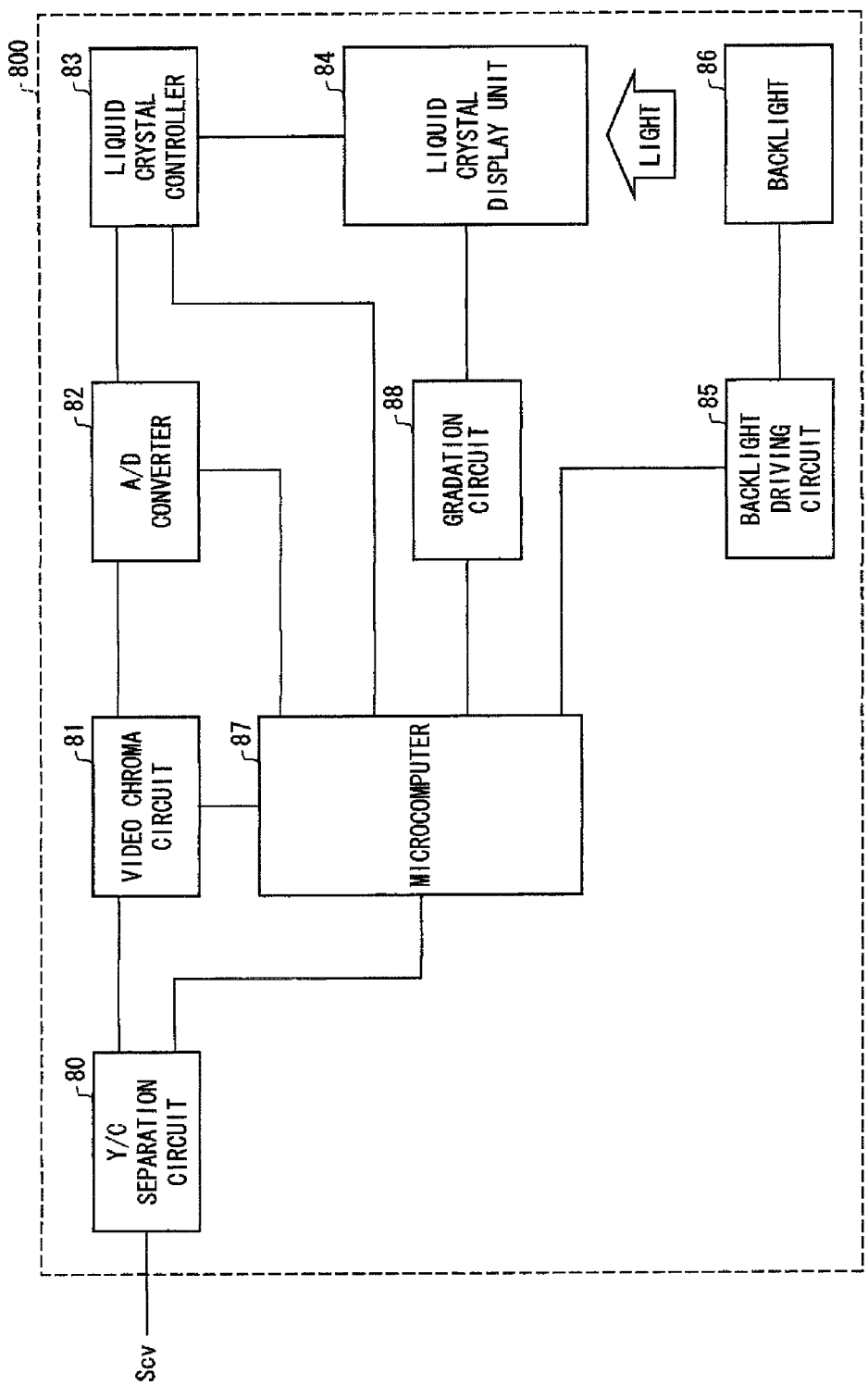
FIG. 41 is a block diagram illustrating functions of the present liquid crystal display device.

The following description will discuss an example where the present liquid crystal display device is applied to a television receiver. FIG. 41 is a block diagram illustrating a configuration of a liquid crystal display device 800 for use in a television receiver. The liquid crystal display device 800 includes a liquid crystal display unit 84, a Y/C separation circuit 80, a video chroma circuit 81, an A/D converter 82, a liquid crystal controller 83, a backlight driving circuit 85, a backlight 86, a microcomputer 87, and a gradation circuit 88. The liquid crystal display unit 84 includes (i) a liquid crystal panel and (ii) a source driver and a gate driver which drive the liquid crystal panel.

With the liquid crystal display device 800 configured as above, first, a composite color video signal Scv serving as a television signal is externally supplied to the Y/C separation circuit 80, and the composite color video signal Scv is separated, by the Y/C separation circuit 80, into a brightness signal and a color signal. The brightness signal and color signal are converted by the video chroma circuit 81 into analog RGB signals that correspond to the light's three principle colors. The analog RGB signals are further converted by the A/D converter 82 into digital RGB signals. The digital RGB signals are supplied to the liquid crystal controller 83. The Y/C separation circuit 80 also extracts horizontal and vertical sync signals from the composite color video signal Scv thus externally supplied. The sync signals are also supplied to the liquid crystal controller 83 via the microcomputer 87.

The liquid crystal display unit 84 receives, at predetermined timing from the liquid crystal controller 83, (i) timing signals which vary depending on the sync signals and (ii) the digital RGB signals. Moreover, the gradation circuit 88 generates gradation electric potentials of the respective three principle colors R, G, B for color display, and the gradation electric potentials are also supplied to the liquid crystal display unit 84. Based on the RGB signals, the timing signals, and the gradation electric potentials, driving signals (data signals including signal electric potentials and scanning signals) are generated by circuits such as the source driver and the gate driver in the liquid crystal display unit 84. Based on the driving signals, a color image is displayed on a liquid crystal panel of the liquid crystal display unit 84. In order for the liquid crystal display unit 84 to display an image, it is necessary to emit light from behind the liquid crystal panel in the liquid crystal display unit. According to the liquid crystal display device 800, the backlight driving circuit 85 drives the backlight 86 under control of the microcomputer 87, so that the light is emitted from behind the liquid crystal panel. The entire system including the above-described processes is controlled by the microcomputer 87. Note that externally supplied video signals (composite color video signal) are not limited to video signals which are in conformity with television broadcast. Alternatively, such externally supplied video signals can be video signals captured by a camera, or video signals supplied over the Internet. The liquid crystal display device 800 can carry out image display which is in conformity with any of various video signals.

Figure 42:
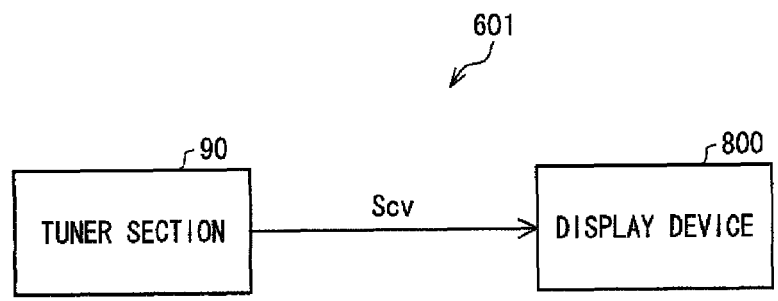
FIG. 42 is a block diagram illustrating a function of the present television receiver.

In a case where the liquid crystal display device 800 displays an image which is in conformity with television broadcast, a tuner section 90 is connected to the liquid crystal display device 800 (see FIG. 42). This provides a television receiver 601 of the present embodiment. The tuner section 90 extracts, from waves (high frequency signals) received via an antenna (not illustrated), a signal of a channel to be received, converts the signal into an intermediate frequency signal, and then detects the intermediate frequency signal. This causes the tuner section 90 to take out a composite color video signal Scv serving as a television signal. The composite color video signal Scv is, as already described, supplied to the liquid crystal display device 800, and an image which varies depending on the composite color video signal Scv is displayed by the liquid crystal display device 800.

Figure 43:
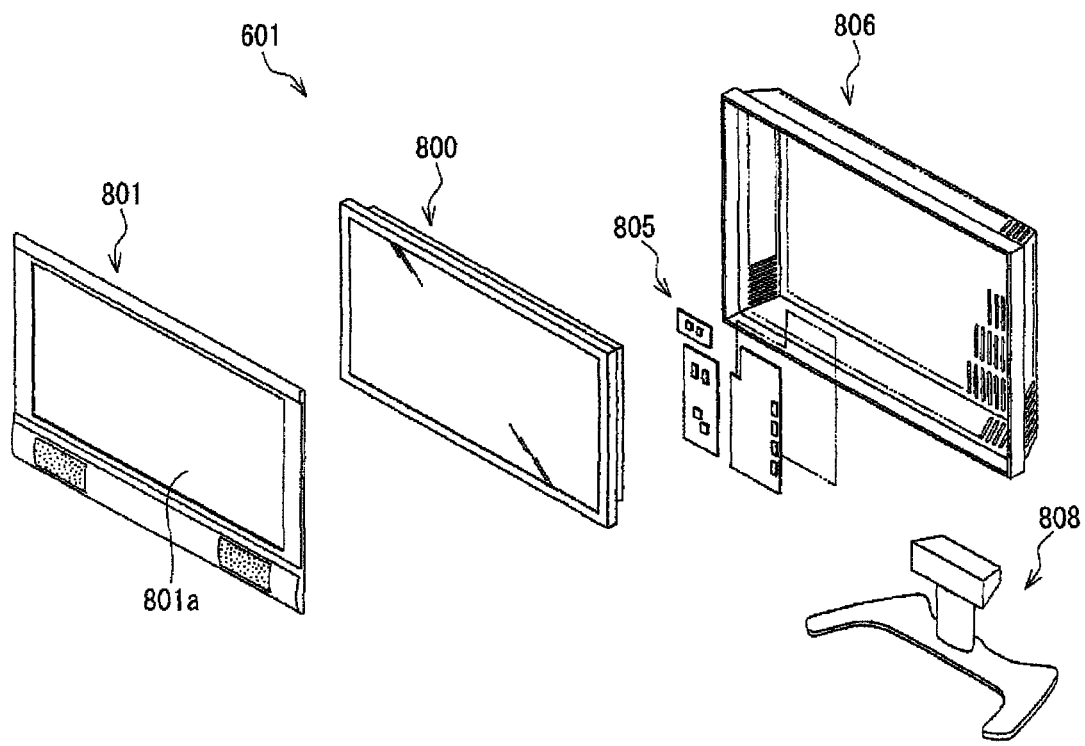
FIG. 43 is an exploded perspective view illustrating a configuration of the present television receiver.
Figure 44:
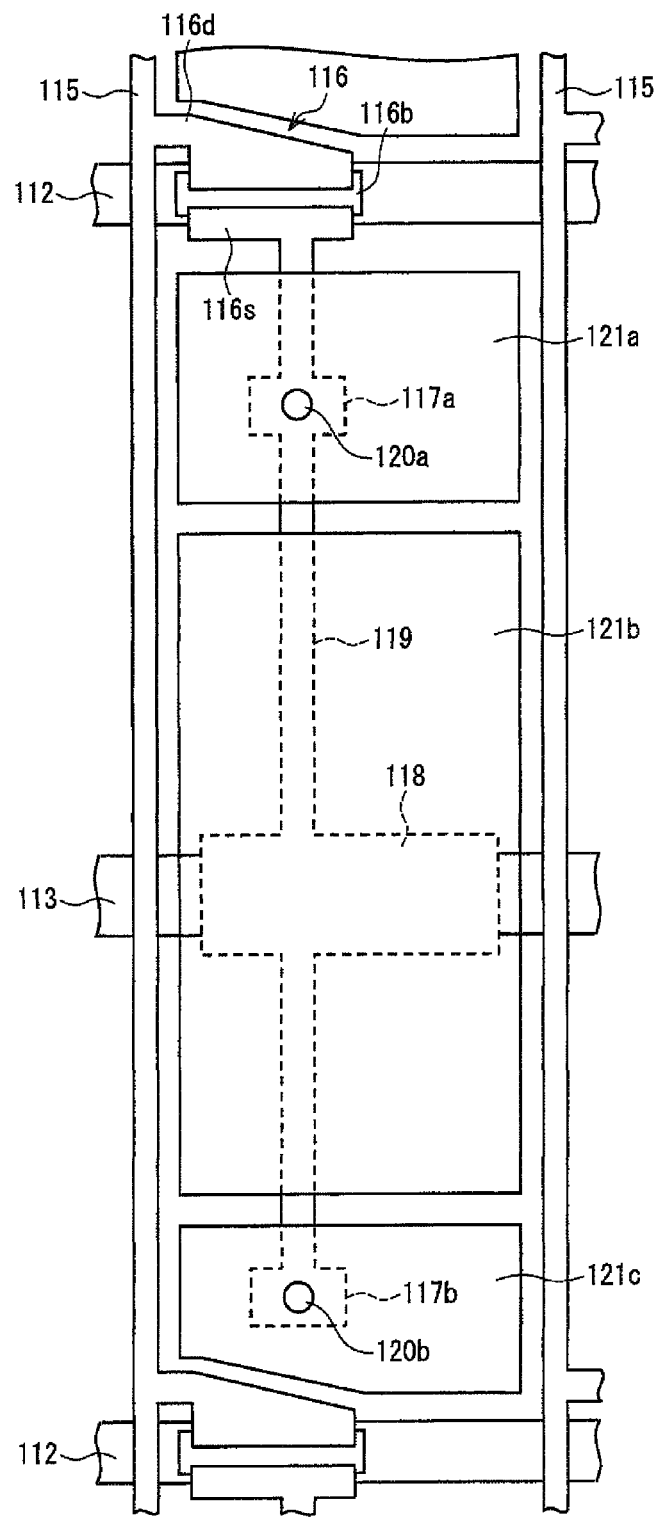
FIG. 44 is a plan view illustrating a configuration of a conventional liquid crystal panel.
Figure 45:
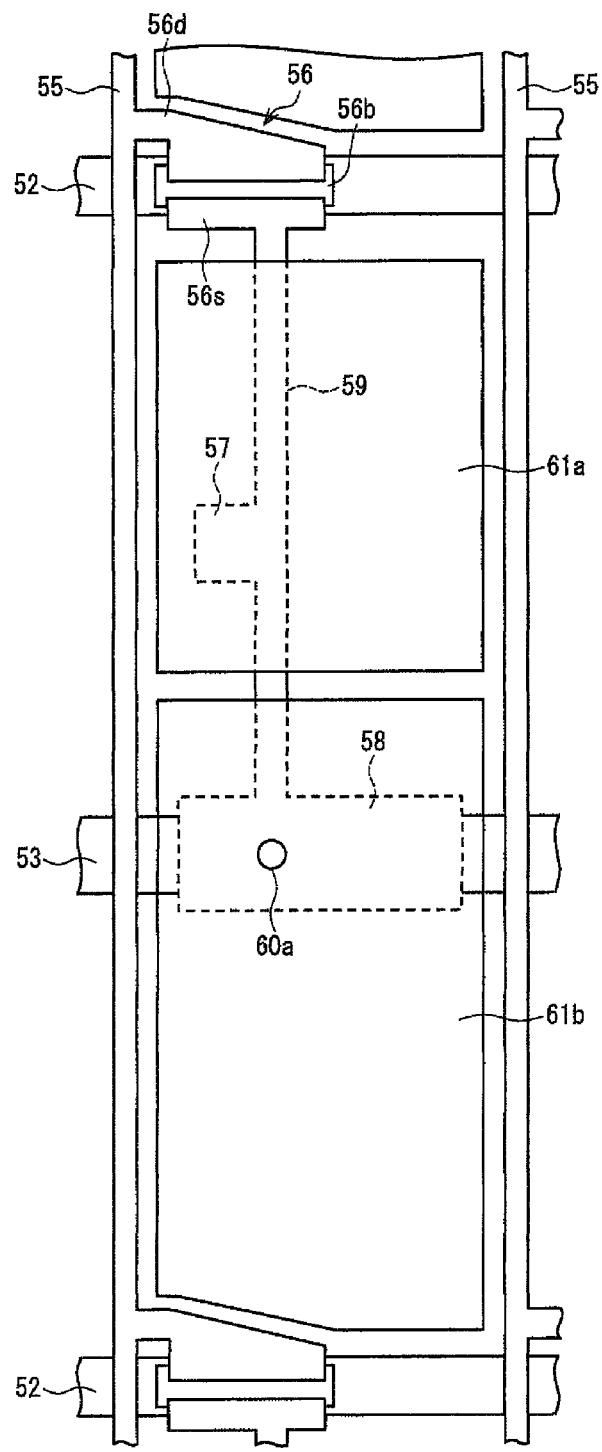
FIG. 45 is a plan view illustrating a configuration of a conventional liquid crystal panel.

FIG. 43 is an exploded perspective view illustrating an example of the present television receiver. As illustrated in FIG. 43, the present television receiver 601 includes, as its constituents, a first housing 801 and a second housing 806, in addition to the liquid crystal display device 800. The present television receiver 601 is configured so that the liquid crystal display device 800 is sandwiched between and surrounded by the first housing 801 and second housing 806. The first housing 801 has an opening 801a through which an image to be displayed by the liquid crystal display device 800 is transmitted. The second housing 806 covers the liquid crystal display device 800 from behind, and includes an operation circuit 805 by which the display device 800 is operated. A member 808 for supporting the second housing 806 is attached to a bottom part of the second housing 806.

The present invention is not limited to the description of the embodiments, but may be altered based on technical common knowledge. Modifications obtained by combining the embodiments and combinations of such modifications are also embodiments the present invention.

As described above, in a liquid crystal display device including an active matrix substrate of the present invention, it is possible to discharge (refresh) electric charge stored in a pixel electrode (capacitor-coupled pixel electrode) which is coupled, via capacitor, with a pixel electrode connected to a data signal line via a transistor. This prevents (i) image-sticking caused to a sub-pixel including the corresponding pixel electrode, and deterioration in display quality.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

A liquid crystal panel and a liquid crystal display device of the present invention are suitable for, e.g., a liquid crystal display television.

The invention claimed is:

1. An active matrix substrate comprising:
a data signal line;
first and second scanning signal lines;
a first transistor connected to the data signal line and the first scanning signal line;
a second transistor connected to the data signal line and the second scanning signal line; and
first and second pixel electrodes provided in a single pixel region,
the first pixel electrode being connected to the data signal line via the first transistor,
the second pixel electrode being connected to the first pixel electrode via a capacitor, and being connected to the data signal line via the second transistor, and
the first transistor having a W/L ratio of a channel (a ratio of a channel width W to a channel length L) which W/L ratio is identical to that of the second transistor.

2. The active matrix substrate as set forth in claim 1, further comprising:
a third pixel electrode provided in the pixel region,
the third pixel electrode being electrically connected to the first pixel electrode.

3. The active matrix substrate as set forth in claim 1, further comprising:
a third pixel electrode provided in the pixel region,
the third pixel electrode being connected to the first pixel electrode via a capacitor, and being electrically connected to the second pixel electrode.

4. The active matrix substrate as set forth in claim 1, further comprising:
a storage capacitor wire,
a storage capacitor being formed by the storage capacitor wire and the first pixel electrode.

5. The active matrix substrate as set forth in claim 4, wherein:
a storage capacitor is further formed by the storage capacitor wire and the second pixel electrode.

6. The active matrix substrate as set forth in claim 5, further comprising:
a storage capacitor electrode provided in a single layer in which conductive electrodes of the respective first and second transistors are provided,
the storage capacitor electrode being electrically connected to one of the first and second pixel electrodes, and the storage capacitor electrode and the storage capacitor wire overlapping each other via a gate insulating film.

7. The active matrix substrate as set forth in claim 5, further comprising:
a capacitor-coupling electrode provided in a single layer in which conductive electrodes of the respective first and second transistors are provided,
(i) the capacitor-coupling electrode being electrically connected to one of the first and second pixel electrodes, (ii) the capacitor-coupling electrode and the other of the first and second pixel electrodes overlapping each other via an interlayer insulating film, and (iii) the capacitor-coupling electrode and the storage capacitor wire overlapping each other via a gate insulating film.

8. The active matrix substrate as set forth in claim 2, further comprising:
a storage capacitor wire, wherein:
the storage capacitor wire traverses the pixel region so as to divide the pixel region into two areas;
the first pixel electrode is provided in one of the two areas;
the third pixel electrode is provided in the other of the two areas; and the second pixel electrode is provided between the first and the third pixel electrodes.

9. The active matrix substrate as set forth in claim 3, further comprising:
a storage capacitor wire, wherein:
the storage capacitor wire traverses the pixel region so as to divide the pixel region into two areas;
the second pixel electrode is provided in one of the two areas;
the third pixel electrode is provided in the other of the two areas; and
the first pixel electrode is provided between the second and third pixel electrodes.

10. The active matrix substrate as set forth in claim 1, further comprising:
a capacitor-coupling electrode which is provided so that the capacitor-coupling electrode and the second pixel electrode overlap each other via an interlayer insulating film,
the capacitor-coupling electrode and a first wire which is drawn out from one of conductive electrodes of the first transistor being connected to each other in a single layer,
the first wire and the first pixel electrode being connected to each other via a contact hole, and
the second pixel electrode and a second wire which is drawn out from one of conductive electrodes of the second transistor being connected to each other via a contact hole.

11. The active matrix substrate as set forth in claim 2, further comprising:
a capacitor-coupling electrode which is provided so that the capacitor-coupling electrode and the second pixel electrode overlap each other via an interlayer insulating film,
the capacitor-coupling electrode and a first wire which is drawn out from one of conductive electrodes of the first transistor being connected to each other in a single layer,
the first wire and the first pixel electrode being connected to each other via a contact hole,
the second pixel electrode and a second wire which is drawn out from one of conductive electrodes of the second transistor being connected to each other via a contact hole, and
the third pixel electrode and a capacitor-coupling electrode extension section connected with the capacitor-coupling electrode being connected to each other via a contact hole.

12. The active matrix substrate as set forth in claim 3, further comprising:
a capacitor-coupling electrode which is provided so that the capacitor-coupling electrode and the second pixel electrode overlap each other via an interlayer insulating film,
the capacitor-coupling electrode and a first wire which is drawn out from one of conductive electrodes of the first transistor being connected to each other in a single layer,
the first wire and the first pixel electrode being connected to each other via a contact hole,
the second pixel electrode and a second wire which is drawn out from one of conductive electrodes of the second transistor being connected to each other via a contact hole, and
the second wire and the third pixel electrode being connected to each other via a contact hole.

13. The active matrix substrate as set forth in claim 7, wherein:
the interlayer insulating film is made thin in at least part of a region of the interlayer insulating film in which region the interlayer insulating film and the capacitor-coupling electrode overlap each other.

14. The active matrix substrate as set forth in claim 6, wherein:
the gate insulating film is made thin in at least part of a region of the gate insulating film in which region the gate insulating film and the storage capacitor electrode overlap each other.

15. The active matrix substrate as set forth in claim 13, wherein:
the interlayer insulating film includes an inorganic insulating film and an organic insulating film; and
the organic insulating film is removed in at least part of the region of the interlayer insulating film in which region the interlayer insulating film and the capacitor-coupling electrode overlap each other.

16. The active matrix substrate as set forth in claim 14, wherein:
the gate insulating film includes an inorganic insulating film and an organic insulating film; and
the organic insulating film is removed in at least part of the region of the gate insulating film in which region the gate insulating film and the storage capacitor electrode overlap each other.

17. The active matrix substrate as set forth in claim 15, wherein:
the organic insulating film includes at least one of acrylic resin, epoxy resin, polyimide resin, polyurethane resin, novolac resin, and siloxane resin.

18. The active matrix substrate as set forth in claim 2, wherein,
the first through third pixel electrodes are provided so that:
at least part of the first pixel electrode is close to the first scanning signal line, at least part of the third pixel electrode is close to the second scanning signal line, and
one end of the second pixel electrode is close to the first scanning signal line, and the other end of the second pixel electrode is close to the second scanning signal line.

19. The active matrix substrate as set forth in claim 3, wherein,
the first through third pixel electrodes are provided so that:
at least part of the second pixel electrode is close to the first scanning signal line,
at least part of the third pixel electrode is close to the second scanning signal line, and
one end of the first pixel electrode is close to the first scanning signal line, and the other end of the first pixel electrode is close to the second scanning signal line.

20. The active matrix substrate as set forth in claim 1, wherein:
in a case where the active matrix substrate is used in a liquid crystal display device, a sub-pixel including the first pixel electrode serves as a bright sub-pixel, and a sub-pixel including the second pixel electrode serves as a dark sub-pixel.

21. The active matrix substrate as set forth in claim 2, wherein:
in a case where the active matrix substrate is used in a liquid crystal display device, sub-pixels including the respective first and third pixel electrodes serve as respective bright sub-pixels, and a sub-pixel including the second pixel electrode serves as a dark sub-pixel.

22. The active matrix substrate as set forth in claim 3, wherein:

in a case where the active matrix substrate is used in a liquid crystal display device, a sub-pixel including the first pixel electrode serves as a bright sub-pixel, and sub-pixels including the respective second and third pixel electrodes serve as respective dark sub-pixels.

23. The active matrix substrate as set forth in claim 1, comprising:

a first data signal line;

first through fourth scanning signal lines;

a first transistor connected to the first data signal line and the first scanning signal line;

a second transistor connected to the first data signal line and the second scanning signal line;

a third transistor connected to the first data signal line and the third scanning signal line;

a fourth transistor connected to the first data signal line and the fourth scanning signal line;

first and second pixel electrodes being provided in a first pixel region; and third and fourth pixel electrodes being provided in a second pixel region which is adjacent to the first pixel region in a column direction in which the first data signal line extends, the first and second pixel electrodes being connected to each other via a capacitor, the third and fourth pixel electrodes being connected to each other via a capacitor, the first transistor being connected to the first pixel electrode, the second transistor being connected to the second pixel electrode, the third transistor being connected to the third pixel electrode, and the fourth transistor being connected to the fourth pixel electrode.

24. A liquid crystal display device comprising:

an active matrix substrate as set forth in claim 1, the second scanning signal line being selected at least once during a display.

25. The liquid crystal display device as set forth in claim 24, wherein:

a common electrode electric potential is applied to the corresponding one of the data signal lines when the second transistor is turning off.

26. The liquid crystal display device as set forth in claim 25, wherein:

the first transistor turns on when the second transistor is turning off, or the first transistor and the second transistor concurrently turn off.

27. The liquid crystal display device as set forth in claim 24, wherein:

when the second transistor is turned off, an electric potential of the first pixel electrode and the second pixel electrode is substantially serving as a common electrode electric potential.

28. The liquid crystal display device as set forth in claim 24, wherein:

a first gate on-pulse signal to be supplied to the first scanning signal line and a second gate on-pulse signal to be supplied to the second scanning signal line become active in a single horizontal scanning period; and the second gate on-pulse signal has a pulse width narrower than that of the first gate on-pulse signal, and becomes non-active before the first gate on-pulse signal becomes non-active.

29. The liquid crystal display device as set forth in claim 24, wherein:

(i) a first gate on-pulse signal to be supplied to the first scanning signal line and (ii) a second gate on-pulse signal to be supplied to the second scanning signal line become active in a horizontal scanning period that is one horizontal scanning period before a horizontal scanning period in which a signal electric potential of a data signal to be displayed is applied to the first pixel electrode; and the second gate on-pulse signal becomes non-active while the first gate on-pulse signal is being active.

30. The liquid crystal display device as set forth in claim 24, wherein:

in each frame, a common electrode electric potential is applied, at least twice, to all the pixel electrodes in each pixel region.

31. The liquid crystal display device as set forth in claim 30, wherein:

in each frame, a common electrode electric potential is applied, at least twice, to all the pixel electrodes in each pixel region, after two-thirds of a frame period has elapsed since a signal electric potential of a data signal to be displayed was applied to the first pixel electrode.

32. The liquid crystal display device as set forth in claim 24, wherein:

polarities of signal electric potentials of respective data signals to be supplied to the respective data signal lines are reversed per horizontal scanning period;

when the polarities of the signal electric potentials of the respective data signals are reversed, the data signals are not supplied to the respective data signal lines for a predetermined time period, and the data signal lines are short-circuited each other; and the first and second transistors are turning on during the predetermined time period.

33. The liquid crystal display device as set forth in claim 24, further comprising:

a scanning signal line driving circuit for driving the scanning signal lines, a first gate on-pulse signal to be supplied to the first scanning signal line and a second gate on-pulse signal to be supplied to the second scanning signal line being generated in accordance with an output signal of a corresponding identical one of serially connected circuits constituting a shift register in the scanning signal line driving circuit.

34. The liquid crystal display device as set forth in claim 33, wherein:

the scanning signal line driving circuit includes the shift register, a plurality of logical circuits arranged in a column direction, and an output circuit; and pulse widths of the respective first and second gate on-pulse signals, which are outputted from the output circuit, are determined in response to the output signal of the shift register and an output control signal for controlling an output of the scanning signal line driving circuit, the output signal of the shift register and the output control signal being supplied to a corresponding one of the plurality of logical circuits.

35. The liquid crystal display device as set forth in claim 24, wherein:

polarities of signal electric potentials applied to the first pixel electrode are reversed per frame.

36. The liquid crystal display device as set forth in claim 24, wherein:
  polarities of signal electric potentials applied to the first data signal line are reversed per horizontal scanning period.

37. The liquid crystal display device as set forth in claim 24, wherein:
  during a single horizontal scanning period, signal electric potentials having respective reverse polarities are applied to the first data signal line and a data signal line adjacent to the first data signal line.

38. A liquid crystal panel comprising an active matrix substrate recited in claim 1.

* * * * *